(12) United States Patent
Kawasaki et al.

(10) Patent No.: US 7,819,081 B2
(45) Date of Patent: Oct. 26, 2010

(54) PLASMA FILM FORMING SYSTEM

(75) Inventors: Shinichi Kawasaki, Hachioji (JP);
Sumio Nakatake, Hachioji (JP); Hiroya Kitahata, Hachioji (JP); Setsuo Nakajima, Hachioji (JP); Yuji Eguchi, Hachioji (JP); Junichiro Anzai, Hachioji (JP); Yoshinori Nakano, Hachioji (JP)

(73) Assignee: Sekisui Chemical Co., Ltd., Osaka (JP)

( * ) Notice: Subject to any disclaimer, the term of this patent is extended or adjusted under 35 U.S.C. 154(b) by 169 days.

(21) Appl. No.: 10/500,317

(22) PCT Filed: Oct. 7, 2003

(86) PCT No.: PCT/JP03/12821
§ 371 (c)(1),
(2), (4) Date: Jun. 28, 2004

(87) PCT Pub. No.: WO2004/032214
PCT Pub. Date: Apr. 15, 2004

(65) Prior Publication Data
US 2005/0016457 A1 Jan. 27, 2005

(30) Foreign Application Priority Data

| Oct. 7, 2002 | (JP) | 2002-294125 |
| Oct. 7, 2002 | (JP) | 2002-294126 |
| Oct. 7, 2002 | (JP) | 2002-294140 |
| Oct. 7, 2002 | (JP) | 2002-294141 |
| Dec. 26, 2002 | (JP) | 2002-377333 |

(51) Int. Cl.
*C23C 16/50* (2006.01)
*C23C 16/503* (2006.01)
*C23C 16/507* (2006.01)
*C23F 1/00* (2006.01)
*H01L 21/306* (2006.01)
*C23C 16/06* (2006.01)
*C23C 16/505* (2006.01)
*C23C 16/22* (2006.01)

(52) U.S. Cl. ............ 118/723 E; 156/345.43; 156/345.44

(58) Field of Classification Search .......... 118/723 E; 156/345.43–47
See application file for complete search history.

(56) References Cited

U.S. PATENT DOCUMENTS 5,185,132 A    2/1993   Horiike et al.

(Continued)

FOREIGN PATENT DOCUMENTS

JP    61-244025    10/1986

(Continued)

OTHER PUBLICATIONS

Machine Translation for JP 2002158219 A. Japanese Patent Office online translations. Jun. 29, 2009.*

(Continued)

*Primary Examiner*—Rudy Zervigon
(74) *Attorney, Agent, or Firm*—Osha Liang LLP

(57) ABSTRACT

In a plasma film forming apparatus, two first electrodes 51 connected to a power source 4 and two grounded second electrodes 52 are arranged in the order of the second electrode 52, the first electrode 51, the first electrode 51 and the second electrode 52. A first flow passage 50a formed between the central first electrodes 51 allows a raw material gas (first gas) for being formed into a film to pass therethrough. A plasma discharge space 50b of a second flow passage formed between the first and second electrodes 51, 52 on the both sides allows an excitable gas (second gas) to pass therethrough, which excitable gas is exited by plasma such that the raw material can be formed into a film, but that the excitable gas itself is merely excited but not formed into a film. Those gases are converged at a crossing part 20c between the first and second flow passages and blown off via a common blow-off passage 25a. By this, the apparatus composing members such as electrodes can be prevented from being adhered with a film.

10 Claims, 38 Drawing Sheets

U.S. PATENT DOCUMENTS

| | | | |
|---|---|---|---|
| 5,500,256 A * | 3/1996 | Watabe | 427/579 |
| 5,753,886 A | 5/1998 | Iwamura et al. | |
| 6,086,710 A | 7/2000 | Miyashita et al. | |
| 6,137,231 A * | 10/2000 | Anders et al. | 315/111.21 |
| 6,245,396 B1 | 6/2001 | Nogami | |
| 6,424,091 B1 | 7/2002 | Sawada et al. | |
| 6,429,400 B1 | 8/2002 | Sawada et al. | 219/121.52 |
| 6,764,658 B2 | 7/2004 | Denes et al. | |
| 2002/0007793 A1 | 1/2002 | Sakai et al. | |
| 2003/0129107 A1 * | 7/2003 | Denes et al. | 422/186.21 |

FOREIGN PATENT DOCUMENTS

| | | |
|---|---|---|
| JP | 63-19571 | 2/1988 |
| JP | 3-219082 | 9/1991 |
| JP | 03-248415 | 11/1991 |
| JP | 4-358076 | 12/1992 |
| JP | 5-226258 | 9/1993 |
| JP | 5-89451 | 12/1993 |
| JP | 7-29827 | 1/1995 |
| JP | 7-62546 | 3/1995 |
| JP | 7-245192 | 9/1995 |
| JP | 8-321399 | 12/1996 |
| JP | 9-59777 | 3/1997 |
| JP | 09-92493 | 4/1997 |
| JP | 9-232293 | 9/1997 |
| JP | 9-246705 | 9/1997 |
| JP | 11-236676 | 8/1999 |
| JP | 11-251304 | 9/1999 |
| JP | 11-260810 | 9/1999 |
| JP | 2000-178744 | 6/2000 |
| JP | 2000-188129 | 7/2000 |
| JP | 2000-200697 | 7/2000 |
| JP | 2000-216141 | 8/2000 |
| JP | 2000-349051 | 12/2000 |
| JP | 2001-237220 | 8/2001 |
| JP | 2001-259409 | 9/2001 |
| JP | 2001-267297 | 9/2001 |
| JP | 2002-75692 | 3/2002 |
| JP | 2002-80970 | 3/2002 |
| JP | 2002-155371 | 5/2002 |
| JP | 2002-158219 | 5/2002 |
| JP | 2002-176050 | 6/2002 |
| JP | 2002-237463 | 8/2002 |
| JP | 2002-237480 | 8/2002 |
| JP | 2003-249492 | 9/2003 |
| JP | 2004-70301 | 3/2004 |
| JP | 2004-91837 | 3/2004 |

OTHER PUBLICATIONS

US Office Action issued for U.S. Appl. No. 11/272,157, mailed Sep. 5, 2008, 34 pages.
Mechanical English translation of JP Patent Application Laid-open Publication No. 2002-155371, Publication Date May 31, 2002, 25 pages.
Mechanical English translation of JP Patent Application Laid-open Publication No. 2002-237463, Publication Date Aug. 23, 2002, 20 pages.
Mechanical English translation of JP Patent Application Laid-open Publication No. 2001-267297, Publication Date Sep. 28, 2001, 30 pages.
Japanese Office Action for Japanese Patent Application No. 2005-000826, Dated Jun. 24, 2008, 3 pages.
Patent Abstracts of Japan for Japanese Patent Application No. 2002-155371, Publication Date: May 31, 2002, 1 page.
Patent Abstracts of Japan for Japanese Patent Application No. 2002-237463, Publication Date: Aug. 23, 2002, 1 page.
Patent Abstracts of Japan for Japanese Patent Application No. 2001-267297, Publication Date: Sep. 28, 2001, 1 page.
Patent Abstracts of Japan, Publication No. 2000-188199 dated Jul. 4, 2000 by Sekisui Chem Co. Ltd., 2 pages.
Japanese Office Action dated Jan. 17, 2006.
Bardos, et al. Radio frequency plasma jet applied to coating of internal walls of narrow tubes; Journal of Vaccum Science & Technology A., vol. 11, Aug. 1993.
Concise Explanation of Relevance of JP 2000-188199.
Patent Abstracts of Japan, Publication No. 2002-237480, Publication Date Aug. 23, 2002, 1 page.
Patent Abstracts of Japan, Publication No. 2000-349051, Publication Date Dec. 15, 2000, 1 page.
Patent Abstracts of Japan, Publication No. 09/232293, Publication Date Sep. 05, 1997, 1 page.
Patent Abstracts of Japan, Publication No. 09-246705, Publication Date Sep. 19, 1997, 1 page.
Notification of Examiner's Reasons of Rejection in Japanese Patent Application No. 2002-294125 dated Mar. 22, 2005.
Patent Abstracts of Japan, publication No. 11-236676, publication date Aug. 31, 1999 (1 page).
Patent Abstracts of Japan, publication No. 05-226258, publication date Sep. 3, 1993 (1 page).
Patent Abstracts of Japan, publication No. 11-251304, publication date Sep. 17, 1999 (1 page).
Patent Abstracts of Japan, publication No. 03-248415, publication date Nov. 6, 1991 (1 page).
Patent Abstracts of Japan, Publication No. 07-245192, dated Sep. 19, 1995, (1 page).
Concise explanation of relevance for Japanese Utility Model Laid-Open No. H05-089451 (1 page).
Concise explanation of relevance for Japanese Utility Model Laid-Open No. S63-019571 (1 page).
Patent Abstracts of Japan, Publication No. 2002-075692, Mar. 15, 2002 (2 pages).
Patent Abstracts of Japan, Publication No. 07-062546, dated Mar. 7, 1995, (2 pages).
Patent Abstracts of Japan, Publication No. 2002-176050, dated Jun. 21, 2002, (2 pages).
Supplementary explanation of relevance for Japanese Patent Application Laid-Open No. H0-4358076 (1 page).
Patent Abstracts of Japan, Publication No. 08-321399, dated Dec. 3, 1996, (2 pages).
Japanese Office Action dated Jul. 15, 2008, for Japanese patent application No. 2002-294140, 3 pages.
Mechanical English translation of JP959777, Publication Date: Mar. 4, 1997, 15 pages.
Patent Abstracts of Japan , Publication No. 09-059777, Publication Date: Mar. 4, 1997, 1 page.
Patent Abstracts of Japan, Publication No. 2004-070301, Publication Date: Mar. 4, 2004, 1 page.
Mechanical English translation of JP2004-070301, Publication Date: Mar. 4, 2004, 64 pages.
Patent Abstracts of Japan for JP2004-091837, Publication Date: Mar. 25, 2004, 1 page.
Mechanical English translation of JP2004-091637, Publication Date: Mar. 25, 2004, 14 pages.
Japanese Office Action for patent application No. 2002-294141, Publication date Jul. 15, 2008, 4 pages.
Patent Abstracts of Japan for JP11-260810, Publication Date: Sep. 24, 1999, 1 page.
Mechanical English translation of JP11-260810, Publication Date: Sep. 24, 1999, 24 pages.
Patent Abstracts of Japan for JP2000-216141, Publication Date: Aug. 4, 2000, 1 page.
Mechanical English translation for JP2000-216141, Publication Date: Aug. 4, 2000, 14 pages.
Patent Abstracts of Japan for JP61-244025, Publication Date: Oct. 30, 1986, 2 pages.
Patent Abstracts of Japan for JP2001-237220, Publication date: Aug. 31, 2001, 1 page.
Mechanical English translation for JP2001-237220, Publication Date: Aug. 31, 2001, 12 pages.
Patent Abstracts of Japan, Publication No. 2001259409, Publication Date Sep. 25, 2001 (1 page).
Patent Abstracts of Japan, Publication No. 09092493, Publication Dated Apr. 4, 1997 (1 page).
European Supplementary Search Report dated Oct. 16, 2006 for Corresponding Application No. 03748739.4 (3 pages).

* cited by examiner

PLASMA FILM FORMING SYSTEM

TECHNICAL FIELD

This invention relates to a plasma surface processing technique, in which a processing gas is plasmatized by impressing an electric field between a pair of electrodes, processing such as film formation, etching, ashing, cleaning, surface modification or the like is executed with respect to the surface of a base material of a semiconductor base material or the like. More particularly, the invention relates to an apparatus suited for the so-called remote-control type in which a base material is arranged away from an electric field impressing space between electrodes of a base material, in a plasma film forming apparatus.

BACKGROUND ART

The plasma surface processing apparatus is provided with a pair of electrodes (for example, Japanese Patent Application Laid-Open No. H11-236676). A processing gas is introduced between the pair of electrodes and an electric field is also impressed therebetween to generate a glow discharge. By this, the processing gas is plasmatized. The processing gas thus plasmatized is blown to the surface of a base material of a semiconductor base material or the like. By this, such processing as film formation (CVD), etching, ashing, cleaning and surface modification can be conducted with respect to the surface of the base material.

The number of electrodes provided to a single apparatus is not limited to two. For example, in a plasma processing apparatus disclosed in Japanese Patent Application Laid-Open No. H05-226258, a plurality of electrodes are arranged such that their polarities are alternately appeared.

A plasma surface processing system includes a so-called direct system in which a base material is disposed in an electric field impressing space between a pair of electrodes, and a so-called remote type in which a base material is disposed away from an electric field impressing space and a processing gas plasmatized in the electric field impressing space is blown to this base material. It further includes a low pressure plasma processing system in which the entire system is put into a pressure reducing chamber and processing is conducted in a lower pressure circumstance, and a normal pressure processing system in which processing is conducted under pressure (generally normal pressure) close to atmospheric pressure.

For example, as disclosed in Japanese Patent Application Laid-Open No. H11-251304, the remote type normal pressure surface processing apparatus comprises a blowoff nozzle for blowing out a processing gas. Within this nozzle, a pair of electrodes are arranged in opposing relation. At least one of the electrodes is provided at an opposing surface thereof with a solid dielectric layer such as ceramic by thermally sprayed coating film. This arrangement is made in order to prevent the occurrence of arc discharge occurrable in a normal pressure interelectrode space. The nozzle is formed with a blowoff passage which is continuous with the electric field impressing space between the electrodes. The base material is disposed ahead of this blowoff passage.

The gas to be used for plasma surface processing is selected depending on the purpose of processing. In case of film formation (CVD), gas containing the raw material of film is used. This raw material gas is introduced between the electrodes and reacted with plasma to form a film on the surface of a base material.

However, this film formation processing technique has such a problem that the film, which is originally intended to be adhered to the base material, is liable to adhere to the apparatus side. Particularly, in the remote type, the gas is readily adhered to the surface of the electrode before it is blown off from the blowoff passage. The gas is also readily adhered to the peripheral area of the blowoff passage of the nozzle or to the opposing surface of the nozzle with respect to the base material. This results in loss of an increased amount of raw material. Maintenance such as replacement of electrodes, etc. and cleaning thereof is more frequently required. Total replacement of the main component such as electrodes means significant waste of the component materials. Moreover, it is extremely troublesome to totally clean the nozzle in order to remove the adhesion (stain) adhered to the peripheral area of the blowoff passage. In addition, the processing must be temporarily stopped during the maintenance.

Incidentally, Japanese Patent Application Laid-Open No. H03-248415 discloses a technique in which in the normal pressure CVD, in general, the wall surface from the peripheral area of the nozzle to its discharge part is composed of a wire netting and an inert gas is blown off through the meshes of the wire netting, thereby to prevent the film from adhering to the apparatus side. This techniques, however, again has such a problem that the flow of processing gas is disturbed by the inert gas coming through the meshes, thus badly degrading the film formation efficiency onto the base material.

Moreover, the normal pressure plasma surface processing has such a problem that an average free travel (life span) of the radicals is short compared with the lower pressure circumstance. For this reason, if the nozzle is arranged too away from the base material, it becomes unable to form a film due to deactivation. On the other hand, if the nozzle is arranged too close to the base material, arc is liable to occur between the electrode on the side to which the electric field is impressed and the base material, and the base material gets, in some instances, damaged.

In the normal pressure plasma surface processing, arc (abnormal electric discharge) may occur at the rear surface (reversed side surface of the opposing surface) of the electrode and at the edge of the electrode. This occurs particularly significantly when rare gas including argon or hydrogen is used as processing gas.

The present invention has been made in view of the above situation. It is, therefore, an object of the present invention to provide a technique for solving the problem of film adhesion to the electrodes, etc., at the time of plasma film formation, particularly at the time of plasma film formation according to the remote type, of all the plasma surface processing. It is another object of the present invention to provide a technique capable of conducting a favorable film formation processing while preventing the arc discharge.

DISCLOSURE OF INVENTION

In order to solve the above-mentioned problems, according to a first feature of the present invention, there is provided a plasma film forming apparatus for forming a film on a surface of a base material under the effect of plasma, comprising:
(A) a first gas supplying source containing a raw material of the film;
(B) a second gas supplying source caused by plasma discharge to reach an excited state but containing no component capable of being formed into the form of film; and
(C) a processing head which is to be placed opposite the base material;

the processing head being provided with:

(a) a grounded ground electrode; and (b) an electric field impressing electrode connected to an electric power source and forming a plasma discharge space between the ground electrode and the electric field impressing electrode;

the processing head being formed with:

(c) a first flow passage for introducing a first gas from the first gas supplying source to the base material in such a manner as to avoid or pass very near the plasma discharge space; and (d) a second flow passage including the plasma discharge space and for causing a second gas coming from the second gas supplying source to contact the first gas after allowing the second gas to pass through the plasma discharge space.

Owing to the above arrangement, film can be prevented from adhering to the surfaces of the electrodes which constitute the plasma discharge space. Thus, loss of the raw material can be reduced. Moreover, the trouble of maintenance such as replacement and cleaning of the electrodes can be reduced.

In the first feature, it is accepted that, for example, the first and second flow passages are converged with each other and continuous with a common blowoff passage which is open to a surface of the processing head which surface is to be placed opposite the base material (see FIG. 3, as well as elsewhere). It is also accepted that downstream ends of the first and second flow passages are spacedly open to a surface of the processing head which surface is to be placed opposite the base material, and the open ends serve as a blowoff port for the first gas and as a blowoff port for the second gas, respectively (see FIG. 11, as well as elsewhere). In the former common blowoff construction, the first gas and the plasmatized second gas can be contacted in the common blowoff passage so as to be reacted reliably. In the latter individual blowoff construction, film can surely be prevented from being formed on the inner peripheral surface of the blowoff passage.

In the common blowoff construction, for example, one of the first and second flow passages is linearly continuous with the common blowoff passage, and the other is crossed with the above-mentioned one flow passage at an angle. One of the first and second gases can be linearly flown in the blowoff direction and the other gas can be converged thereto.

The crossing angle between the first and second flow passages in the common blowoff construction is, for example, right angle. However, the crossing angle is not limited to this but it may be an obtuse angle or an acute angle. Both the first and second flow passages may be angled with respect to the common blowoff passage.

In the first feature, for example, the electrodes are provided as a member for defining the first flow passage. Owing to this arrangement, the specific first flow passage forming member can be omitted or made short.

In the first feature, for example, the processing head is provided with two electrodes which have the same polarities and which are arranged in mutually adjacent relation, and the first flow passage is formed between the electrodes having the same polarities. The electrodes having the same polarities may refer to the electric field impressing electrodes, or they may be the ground electrodes.

In the first feature, for example, the processing head is provided with two each of the electric field impressing electrodes and ground electrodes, thus four in total, the two electric field impressing electrodes are arranged in mutually adjacent relation thus forming the first flow passage therebetween, and the two each electric field impressing electrodes are placed opposite the two each corresponding ground electrodes thus forming the plasma discharge space therebetween (see FIG. 3, as well as elsewhere).

The four electrodes are arranged, for example, in the order of the ground electrode, the electric field impressing electrode, the electric field impressing electrode and the ground electrode, and owing to this arrangement, the two plasma discharge spaces and thus the second flow passages are arranged on both sides with the single first flow passage sandwiched therebetween.

In this four-electrode and three-flow passage construction, for example, the processing head includes a base material opposing member which is to cover a surface to be faced with the base material of the electrode, and the base material opposing member formed with respective blowoff passages of the three flow passages (see FIG. 11). Owing to this arrangement, one mode of the individual blowoff construction is constituted.

Moreover, in the four-electrode and three-flow passage construction, it is accepted that the processing head includes a base material opposing member which is to cover a surface to be faced with the base material of the electrode, a communication passage is formed as a part of the second flow passage between the base material opposing member and each electric field impressing electrode, the plasma discharge space and the first flow passage is communicated with each other through the communication passage, and the base material opposing member is formed with a common blowoff passage of the first and second gases such that the common blowoff passage is continuous with a crossing part between the first flow passage and the communication passage (see FIG. 3). Owing to this arrangement, one mode of the individual blowoff construction is constituted.

The base material opposing member is composed, for example, of an insulative (dielectric) material such as ceramic.

As a more generalized construction of the four-electrode and three flow passage construction, it is accepted that the processing head is provided with a plurality of electric field impressing electrodes and a plurality of ground electrodes, and the electrodes are arranged in parallel relation such that first flow passages each formed between the electrodes having the same polarities and plasma discharge spaces, i.e., second flow passages each formed between the electrodes having different polarity are alternately arranged (see FIG. 13). The terms "electrodes having the same polarities refer to the electric field impressing electrodes or refer to ground electrodes, and the terms "electrodes having different polarities" refer to the electric field impressing electrode and the ground electrode.

In this first and second flow passages alternately arranged construction, it is preferable that the electrodes located at opposite end parts in the arrangement direction are ground electrodes. Owing to this arrangement, electric field can be prevented from leaking outside of the row of electrodes.

In the alternately arranged construction, the first and second flow passages may be arranged alternately one by one, or one group by one group. The first group consists of the first flow passage(s) and the second group consists of the second flow passage(s). The second flow passages and the first flow passages may be arranged alternately such that only one first flow passage is arranged after a plurality of second flow passages. In the alternative, they may be arranged alternately such that a plurality of first flow passages are arranged after only one second flow passage. One group of the first or second flow passages may be different in number in accordance with the arranging direction. Preferably, the number of the second flow passages is larger, as a whole, than that of the first flow passages. Owing to this arrangement, sufficient reaction of the raw material gas can be obtained.

In the first feature, for example, the electric field impressing electrode and the ground electrode extend in a direction orthogonal to the opposing direction of the electric field impressing electrode and the ground electrode, an upstream end of the plasma discharge space between the electrodes is disposed at one end part in a first direction orthogonal to the opposing direction and extending direction, and a downstream end thereof is disposed at the other end part in the first direction. Owing to this arrangement, the range can be enlarged in which a film can be formed at a time and the processing efficiency can be enhanced.

In the elongate electrode construction, it is preferable that an electricity feed line to the electric field impressing means is connected to one end part in the longitudinal direction of the electric field impressing electrode, and a ground line is connected to the other end part in the longitudinal direction of the ground electrode (see FIG. 6). Owing to this arrangement, the electricity feed line and the ground line can be prevented from being short-circuited.

In one preferred mode of the first feature, the ground electrode is arranged in opposing relation on the side of the electric field impressing electrode which is to be faced with the base material in the processing head (see FIG. 15). Owing to this arrangement, arc can be prevented from occurring between the electric field impressing electrode and the base material by interposing the ground electrode between the electric field impressing electrode and the base material. Thus, the base material can be prevented from being damaged, and the processing head and thus, the plasma discharge space can be located sufficiently close to the base material. As a result, the active pieces can surely be brought to the base material before the active pieces lose activity, and a high-speed and favorable film forming processing can be conducted. This interposing construction is particularly effective for the generally normal pressure plasma film formation processing in which an average free travel of radicals (distance until the active pieces lose activity) is short.

The terms "generally normal pressure (close to atmospheric pressure)" used herein refers to a range from $1.333 \times 10^4$ to $10.664 \times 10^4$ Pa. Particularly, a range from $9.331 \times 10^4$ to $10.397 \times 10^4$ Pa is preferable because pressure adjustment becomes easy and the construction of the apparatus becomes simplified.

In the ground electrode interposing construction, for example, the processing head includes a base material opposing member which is to cover a surface to be faced with the base material of the electric field impressing electrode, and the ground electrode is disposed at the base material opposing member. A gap is formed between the electric field impressing electrode and the base material opposing member, and the gap serves as a second flow passage including the plasma discharge space. It is preferable that the plasma discharge space is directly crossed with the first flow passage, and the base material opposing member is formed with a common blowoff passage of the first and second gases such that the common blowoff passage is continuous with the crossing part. According to this directly converging construction, the plasma in the discharge space can be overflowed to the crossing part. By this overflowed part, the first gas can directly be plasmatized (the first gas can pass very near the plasma discharge space). Owing to this arrangement, the film forming efficiency can be enhanced.

In the ground electrode interposing construction, for example, the receiving recess for receiving the ground electrode is formed in a surface (surface on the reversed side of the electric field impressing side) to be faced with the base material of the base material opposing member. Owing to this arrangement, the ground electrode is directly faced with the base material. In this ground electrode directly opposing construction, it is preferable that the base material opposing member is composed of ceramic, and a forming part for forming the receiving recess of the base material opposing member is provided as a solid dielectric layer which is to cover a metal main body of the ground electrode. Owing to this arrangement, it is no more required to provide a specific solid dielectric layer to the ground electrode.

In the ground electrode interposing construction, for example, an end face to be faced with the common blowoff passage of a metal main body of the electric field impressing electrode may be generally flush with (see FIG. 20) or more expanded than an end face on the same side of the metal main body of the electric field impressing electrode. It is also accepted that an end face on the side facing with the common blowoff passage of the metal main body of the ground electrode is more retracted than an end face on the same side of the metal main body of the electric field impressing electrode (see FIG. 21). In the former generally flush or expanded construction, the electric field can surely be prevented from leaking to the base material side from the ground electrode, arc can surely be prevented from falling onto the base material, and the distance between the processing head and the base material can surely be reduced. In the latter retracted construction, a lateral electric field can be formed between the end faces of the electric field impressing electrode and the ground electrode, and the reaction space for the first gas can be located closer to the base material.

In the first feature, for example, the processing head is provided with a grounded conductive member such that the grounded conductive member covers a side to be faced with the base material of the electric field impressing electrode (FIGS. 15 and 23, as well as elsewhere). Owing to this arrangement, arc can be prevented from occurring between the electric field impressing electrode and the base material by interposing the grounded conductive member between the electric field impressing electrode and the base material. Thus, the base material can be prevented from being damaged, and the processing head and thus, the plasma discharge space can be located sufficiently close to the base material. As a result, the active pieces can surely be brought to the base material before the active pieces lose activity, and a high-speed and favorable film forming processing can be conducted. This interposing construction is particularly effective for the generally normal pressure plasma film formation processing in which the average free travel of the radicals (distance until the active pieces lose activity) is short.

In this conductive member interposing construction, it is accepted that the conductive member forms a plasma discharge space between the electric field impressing electrode and the conductive member, and the conductive member is provided as the ground electrode (see FIG. 15). Owing to this arrangement, the conductive member can also serve as the ground electrode and thus, the number of parts can be reduced.

In the conductive member interposing construction, an insulative member for insulating the conductive member and the electric field impressing electrode may be filled between the insulative member and the electric field impressing electrode (see FIG. 23). Owing to this arrangement, electric discharge can be prevented from occurring between the conductive member and the electric field impressing electrode.

In the first feature, it is preferable that the processing head is provided with an intake duct having an intake port surrounding a peripheral edge part of a base material opposing surface thereof. Owing to this arrangement, the processed gas can be prevented from remaining in the space and discharged smoothly. Eventually, stain adhered to the base material opposing member can be reduced, and the frequency of maintenance can be reduced. Moreover, the flow of the first and second gases can be stabilized in the space between the processing head and the base material, and a generally laminar flow state can be attained.

According to a second feature of the present invention, there is provided a plasma film forming apparatus for forming a film on a surface of a base material under the effect of plasma, comprising:

a first gas supplying source containing a raw material of the film;

a second gas supplying source caused by plasma discharge to reach an excited state but containing no component for capable of being formed into the form of film;

a grounded ground electrode;

an electric field impressing electrode connected to an electric power source and forming a plasma discharge space in such a manner as to oppose the ground electrode;

a first flow passage forming means for flowing therethrough a first gas from the first gas supplying source in such a manner as to avoid or pass very near the plasma discharge space and blowing the first gas to the base material; and a second flow passage forming means for allowing a second gas coming from the second gas to pass through the plasma discharge space and causing the second gas to contact the first gas. Owing to this arrangement, film can be prevented from adhering to the surfaces of the electrodes which constitute the plasma discharge space. Thus, the raw material loss can be reduced. Moreover, the trouble of maintenance such as replacement of the electrodes and cleaning thereof can be reduced.

As mentioned above, the electrodes having the same polarities can be the first flow passage forming means, and the electrodes having different polarities can be the second flow passage forming means. That is, it is accepted, for example, that the electric field impressing electrode includes a surface forming a first flow passage and provided as the first flow passage forming means. Moreover, it is also accepted that the electric field impressing electrode and the ground electrode are provided as the second flow passage forming means, in which a second flow passage and thus, a plasma discharge space are formed between the electric field impressing electrode and the ground electrode.

According to another mode of the second feature, the ground electrode is arranged on the side to be faced with the base member of the electric field impressing electrode with a dielectric member (insulative member) sandwiched between the ground electrode and the electric field impressing electrode, and a cutout for allowing the dielectric member to be exposed therethrough is formed in a part of the ground electrode, the inside of the cutout serves as the plasma discharge space; the second flow passage forming means makes the second gas blow out along the ground electrode and enter the cutout; and the first flow passage forming means makes the first gas blow out on the reverse side to the ground electrode from the second gas in such a manner as to form a laminar flow with the second gas (see FIG. 22). Owing to this arrangement, the first gas can be flown in such a manner as to pass very near the plasma discharge space and reacted nearer to the base material. Moreover, the film adhesion to the apparatus side can be restrained.

In a plasma surface processing (particularly normal pressure surface processing) as in the present invention, a solid dielectric layer for preventing the occurrence of arc (abnormal electric discharge) is provided to at least one of the opposing surfaces of the electric field impressing electrode and the ground electrode. This solid dielectric layer may be coated on the metal main body of the electrode by thermally sprayed coating or the like (see FIG. 3). In the alternative, it may be of a dielectric case receiving structure as described hereinafter.

That is, the electrode of the plasma film forming apparatus of the present invention may comprise a main body composed of metal, and a dielectric case composed of a solid dielectric member for receiving therein the main body (FIG. 19). Owing to this arrangement, even if a film (stain) should be adhered to the electrode, it would be adhered only to the dielectric case and would not be adhered to the electrode main body. Therefore, simply by cleaning only the dielectric case, the main body can be used as it is. Moreover, since the entire electrode main body is covered with the dielectric case as the solid dielectric layer, abnormal electric discharge can be prevented from occurring not only at the opposing surface with respect to the other electrode but also at the rear surface and the edge. Particularly, even in case such substance easy to discharge as argon or hydrogen is used as the processing gas, abnormal electric discharge can surely be prevented from occurring at the rear surface, etc. Moreover, it is easy to apply variation to the thickness compared with the technique in which the surface of the electrode main body is directly coated by thermally sprayed coating or the like. The dielectric case receiving construction itself can be applied not only to the plasma film formation which belongs to the field of the present invention but also widely to other plasma surface processing electrode construction such as cleaning, etching, ashing, surface modification and the like. It can be applied not only to the remote type plasma processing but also to direct type.

Preferably, the dielectric case includes a case main body retractably receiving the electric main body in an internal space whose one surface is open, and a lid for covering the opening.

Both the paired electric field impressing electrode and the ground electrode may be of the dielectric case receiving construction. In that case, the plasma discharge space of the second flow passage is formed between the dielectric case of the electric field impressing electrode and the dielectric case of the ground electrode.

It is accepted that each of the two electrodes having same polarities and forming the first flow passage comprise a main body composed of metal and a dielectric case composed of a solid dielectric member for receiving therein the main body, the dielectric cases of the electrodes are placed opposite each other, thereby forming the first flow passage therebetween.

The dielectric cases of the electrodes may be separately formed, or they may be integrally connected to one another (see FIG. 28, as well as elsewhere). In the former separate construction, maintenance such as replacement can be conducted individually depending on the status of adhesion (stain). In the latter integral construction, the number of parts can be reduced. In addition, relative positioning and the like of the electrodes can be conducted easily and correctly. In case of the integral construction, it is preferable that a gas flow passage is formed in the case main body, and receiving spaces for receiving the electrode main body therein are formed on both sides with this flow passage sandwiched therebetween. It is accepted that the sectional area of this flow passage is varied along the gas flowing direction such that the passage becomes gradually narrow or wide, or it is provided with a step. Owing to this arrangement, the pressure and speed of the gas flow can be changed. According to the integral construction, such a deformed flow passage as just mentioned can be formed easily.

It is accepted that each electrode and thus the dielectric case thereof extend in a direction orthogonal to the opposing direction with respect to the other electrode, and the dielectric case integrally includes a gas uniformizing part for uniformly dispersing gas, which is introduced into a flow passage between the dielectric case and the other electrode, in the extending direction (see FIG. 30). Owing to this arrangement, an additional member of uniformizing gas is not more required, and the number of parts can be reduced.

The thickness of a plate part on the side forming the plasma discharge space in the dielectric case may be different between the upstream side and the downstream side of the plasma discharge space (see FIG. 28). Moreover, in the case integral construction, it is accepted that the integral dielectric case is formed with a second flow passage serving as the plasma discharge space, a metal main body is received in each side of the integral dielectric case with the flow passage sandwiched therebetween, and a distance between the metal main bodies is different between the upstream side and the downstream side of the plasma discharge space (see FIG. 29). Owing to this arrangement, many variations can be applied to the status of plasma by varying the manner for generating the radical species as it flows. Thus, the surface processing recipe can be enriched.

It is accepted that each electrode comprises a metal-made main body and a solid dielectric layer disposed at least at the plasma discharge space forming surface of the main body, and the thickness of the solid dielectric layer at the plasma discharge space forming surface is different between the upstream side and the downstream side of the plasma discharge space. It is also accepted that each electrode comprises a metal-made main body and a solid dielectric layer disposed at least at the plasma discharge space forming surface of the main body, and a distance between the two electrodes is different between the upstream side and the downstream side of the plasma discharge space.

As means for impressing electric field to the electrodes or as grounding means of the present invention, a feed or grounding pin may be used, or a covered conductor may be connected directly to the electrode.

In the former pin construction, the pin includes a conductive pin main body having a pin hole opening to a tip end face thereof and withdrawably embedded in the electrode, a core member electrically connected with the pin main body and slideably received in the pin hole, and a spring received in the pin hole and for biasing the core member so as to be pushed out of the tip end opening of the pin hole (see FIG. 10). Owing to this arrangement, the pin and the electrode can surely be electrically conducted. Moreover, since the power feed pin can be withdrawn from the electrode, it cannot be any interference at the time of maintenance.

In the latter covered conductor construction, it is preferable that a conductor hole is formed in the electrode, the covered conductor is inserted in the conductor hole, the covered conductor is formed by covering a conducting wire with an insulative material, only a tip part of the wire located on an inner side of the hole is exposed from the insulative material, a screw is screwed in the electrode in such a manner as to be generally orthogonal to the conductor hole, and the screw presses the exposed tip part of the wire against an inner peripheral surface of the conductor hole (FIG. 24). Owing to this arrangement, the conductive tip part can surely be fixed to the electrode main body. Moreover, abnormal electric discharge can surely be prevented from occurring at the pulled-out part of the conductor from the electrode. At the time of maintenance, the conductor can easily be withdrawn from the electrode by loosening the screw.

In the first feature, it is preferable that the processing head removably includes a base material opposing member formed with a first and a second gas blowoff passage and disposed opposite the base material (see FIG. 9). Owing to this arrangement, even if a film (stain) should be adhered to the base material opposing surface of the processing head, etc., only the base material opposing member can be separated. Then, only the base material opposing member can be cleaned by being dipped into a chemical liquid such as, for example, strong acid. Therefore, it is no more required to bring the entire processing head to the cleaning process, and the maintenance can be simplified. Moreover, by preparing a spare part of the base material opposing member, the surface processing can be kept continued even during the time of maintenance.

The removing construction itself of the base material opposing member can be applied not only to the plasma film formation which belongs to the field of the present invention but also widely to other plasma surface processing head such as cleaning, etching, ashing, surface modification and the like. Moreover, it can also be applied to other surface processing heads than plasma such as thermal CVD.

In the opposing member removing construction, it is preferable to further comprise support means for supporting the base material opposing member in such a manner as to place a peripheral edge part of the base material opposing member thereon with a surface to be faced with the base material of the base material opposing member directing downward; an upper side part from the base material opposing member of the processing head being integrally placed on the base material opposing member. Moreover, it is preferable that the support means has a frame-like configuration so that the processing head can be receiving therein in such manner as to be able to be removed upward, and an inner flange for hooking on a peripheral edge part of the base material opposing member is disposed at an inner peripheral edge of a lower end part of the support means. Owing to this arrangement, simply by pulling up the processing head, the base material opposing member can be separated at the time of maintenance. Moreover, a processing head directing downward is constituted and the base material is disposed beneath the head.

In the opposing member removing construction, it is preferable that a positioning protrusion is disposed at one of the upper side part from the base material opposing member of the processing head and the support means, and a positioning recess for allowing the positioning protrusion to be vertically fitted thereto is disposed at the other of the upper side part from the base material opposing member of the processing head and the support means. Owing to this arrangement, the processing head can surely be positioned at the support means.

The support means preferably includes an intake duct having an intake port which is open downward and disposed in such a manner as to surround the processing head. Owing to this arrangement, the processed gas can be prevented from remaining in the space and discharged smoothly. Eventually, stain adhered to the base material opposing member can be reduced, and the frequency of maintenance can be reduced. Moreover, since the support means and the intake duct are composed of a common member, the number of parts can be reduced.

In the first feature, it is preferable that the processing head includes a member to be faced with the base material, the base material opposing member includes a blowoff region where the first and second gas blowoff passages are disposed and an expanding region expanded from the blowoff region thereby to gain a ratio for forming a film, and the expanding region is connected with an inert gas introduction means; and the expanding region of the base material opposing member is composed of a material having such a degree of gas permeability that the inert gas coming from the gas introduction means is allowed to permeate toward a base material opposing surface and the degree of permeation and thus the degree of oozing of the inert gas from the base material opposing surface is such that the processing gas can be prevented from contacting the base material opposing surface without disturbing a flow of the processing gas (see FIG. 34). Owing to this arrangement, a thin layer of inert gas can be formed on the base material opposing surface, particularly on the expanding region, so that film can surely be prevented from adhering to the base material opposing surface. In addition, a film can sufficiently be formed while guiding the processing gas to the expanding region without disturbing the processing gas flow in the space between the processing head and the base material.

The gas permeating material is preferably a porous material. Owing to this arrangement, the desired degree of permeation and thus oozing-out can be obtained easily and reliably. Particularly, by composing the gas permeating material from a porous material, an insulative property can surely be obtained, too.

It is preferable that a groove for temporarily storing therein the inert gas coming from the gas introduction means is formed in an opposite side surface to the base material opposing surface in the expanding region of the base material opposing member in such a manner as to be recessed toward the base material opposing surface. Owing to this arrangement, the base material opposing member in the expanding region can be reduced in thickness, and an inert gas film can surely be formed on the base material opposing surface, thereby a film can be prevented from being adhered to this surface more reliably.

It is preferable that the base material opposing member has a short direction and a longitudinal direction, each of the regions extends in the longitudinal direction, the expanding region is provided at both sides in the short direction with the blowoff region sandwiched therebetween, and the groove is formed in each expanding direction in such a manner as to extend in the longitudinal direction. Owing to this arrangement, a film can efficiently be formed over a wide range of area at a time, and a film can surely be prevented from adhering to the two expanding regions.

It is preferable that the base material opposing member is entirely integrally formed from a gas permeating material, and a gas permeation prohibiting member for prohibiting gas permeation is disposed at an inner side surface facing with the blowoff region of the groove. Owing to this arrangement, the processing gas flow can surely be prevented from being disturbed or diluted in the blowoff region by inert gas, and therefore, a high quality film formation can be enjoyed.

It is preferable that the groove is provided at an intermediate part thereof in a direction of the depth with a partition, the partition has a sufficiently higher gas permeability than the gas permeating material, and the groove is partitioned into an upper-stage groove part continuous with the inert gas introduction means and a lower-stage groove part near the base material opposing surface through the partition. Owing to this arrangement, the inert gas can be uniformized within the groove. The partition is preferably composed of a porous plate which is more rough enough in mesh than the gas permeating material. Moreover, the gas permeation prohibiting member is preferably disposed only at the inner side surface directing the blowoff region of the upper-stage groove part. The lower-stage groove part is preferably larger in capacity than the upper-stage groove part. By disposing the gas permeation prohibiting member only at the upper-stage groove part, the lower-stage groove can be made larger in capacity than the upper-stage groove part.

In the first feature, it is preferable that a downstream end of the first flow passage is crossed with a downstream end of the second flow passage, and the crossing part serves as a common blowoff port of the first and second gases (see FIG. 37). Owing to this arrangement, a film can be prevented from adhering to the opposing surfaces of the respective electrodes. Moreover, the first gas and the plasmatized second gas can be mixed with each other simultaneously with the blowoff, and a sufficient film forming reaction can be obtained without waiting for dispersion of the gases and before the active species are not lost in activity. Thus, the film forming efficiency can be enhanced.

In this mixing simultaneous blowoff construction, the first and second flow passages are preferably crossed with each other at an acute angle. Owing to this arrangement, the first and second gases can be blown against the base material while being mixed such that the first and second gases form a single flow.

In the mixing simultaneous blowoff construction, it is preferable that the processing head includes a surface where the blowoff port is open and which is to be faced with the base material, one of the first and second flow passages is orthogonal to the base material opposing surface, and the other is slantwise to the base material opposing surface and crossed with the one flow passage at an acute angle. Owing to this arrangement, by blowing off one of the gases against the base material from right in front thereof and diagonally converging the other gas to the first-mentioned gas, a single gas flow can be obtained.

In the mixing simultaneous blowoff construction, it is preferable that the first and second flow passages are arranged such that the second flow passage is disposed in such a manner as to sandwich or surround the first flow passage with the second flow passage disposed therebetween, and the second flow passage is approached to the first flow passage toward the downstream end and crossed with each other at the blowoff port. Owing to this arrangement, the second gas can be converged to the opposite sides or around the first gas. One example, in which "the second flow passages sandwich the first flow passage therebetween" includes an arrangement in which two second flow passages are arranged on the opposite sides of the first flow passage. Similarly, one example, in which "the second flow passages surround the first flow passage" includes an arrangement in which the second flow passages are concentrically arranged with the first flow passage disposed therebetween, so that the second flow passages will approach the first flow passage. The concentric second flow passages may have an annular configuration in section enabling to surround the first flow passage, and are gradually reduced in diameter toward the downstream. In the alternative, the concentric second flow passages may be constructed such that they are composed of a plurality of branch passages spacedly arranged in the peripheral direction of the first flow passage in such a manner as to surround the first flow passage, and those branch passages gradually approach the first flow passage toward the downstream. The first and second flow passages may be in reversed relation. That is, it is also accepted that the first flow passages are arranged such that they sandwich or surround the second flow passage disposed therebetween, and the first flow passages gradually approach the second flow passage toward the downstream side and finally crossed with each other at the blowoff port.

In the mixing simultaneous blowoff construction, it is preferable that the processing head is provided with two each of the electric field impressing electrodes and the ground electrodes, the two electric field impressing electrodes are disposed at the first flow passage in such a manner as to be faced with each other, one each of the electric field impressing electrodes is faced with one each of the ground electrodes with the second flow passage formed therebetween, the two second flow passages are arranged in such a manner as to be approached to the first flow passage toward the downstream end with one of the first flow passages sandwiched therebetween, and three of those passages are crossed with one another at the blowoff port. Owing to this arrangement, the plasmatized second gas can be converged to the first gas from both side of the first gas.

Moreover, it is preferable that the processing head includes a surface where the blowoff port is open and which is to be faced with the base material; the first flow passage between the two electric field impressing electrodes is orthogonal to the base material opposing surface, each of the two electric field impressing electrodes includes a first surface located on the reverse side to the side which is faced with the first flow passage and slantwise with respect to the base material opposing surface; and each of the two ground electrodes includes a second surface which is faced in parallel with the first surface of the corresponding electric field impressing electrode and forming the second flow passage therebetween. Owing to this arrangement, the respective electric field impressing electrodes can be arranged on the reverse side to the base material with the ground electrode sandwiched therebetween, arc discharge to the base material from the electric field impressing electrodes can be prevented from occurring, and a favorable film forming processing can surely be conducted. Moreover, by blowing off the first gas against the base material from right in front thereof and diagonally converging the plasmatized second gas to the opposite sides of the first gas, a single gas flow can be obtained.

In the construction having two second flow passages arranged on opposite sides of the first flow passage, the two second flow passages are preferably symmetrical with each other with the first flow passage sandwiched therebetween. Owing to this arrangement, the plasmatized second gas can be uniformly converged to the first gas from the opposite sides of the first gas.

The ground electrode preferably includes the base material opposing surface. Owing to this arrangement, arc discharge to the base material from the respective electric field impressing electrodes can more surely be prevented from occurring.

BEST MODE FOR CARRYING OUT THE INVENTION

Embodiments of the present invention will be described hereinafter with reference to the drawings.

Figure 1:
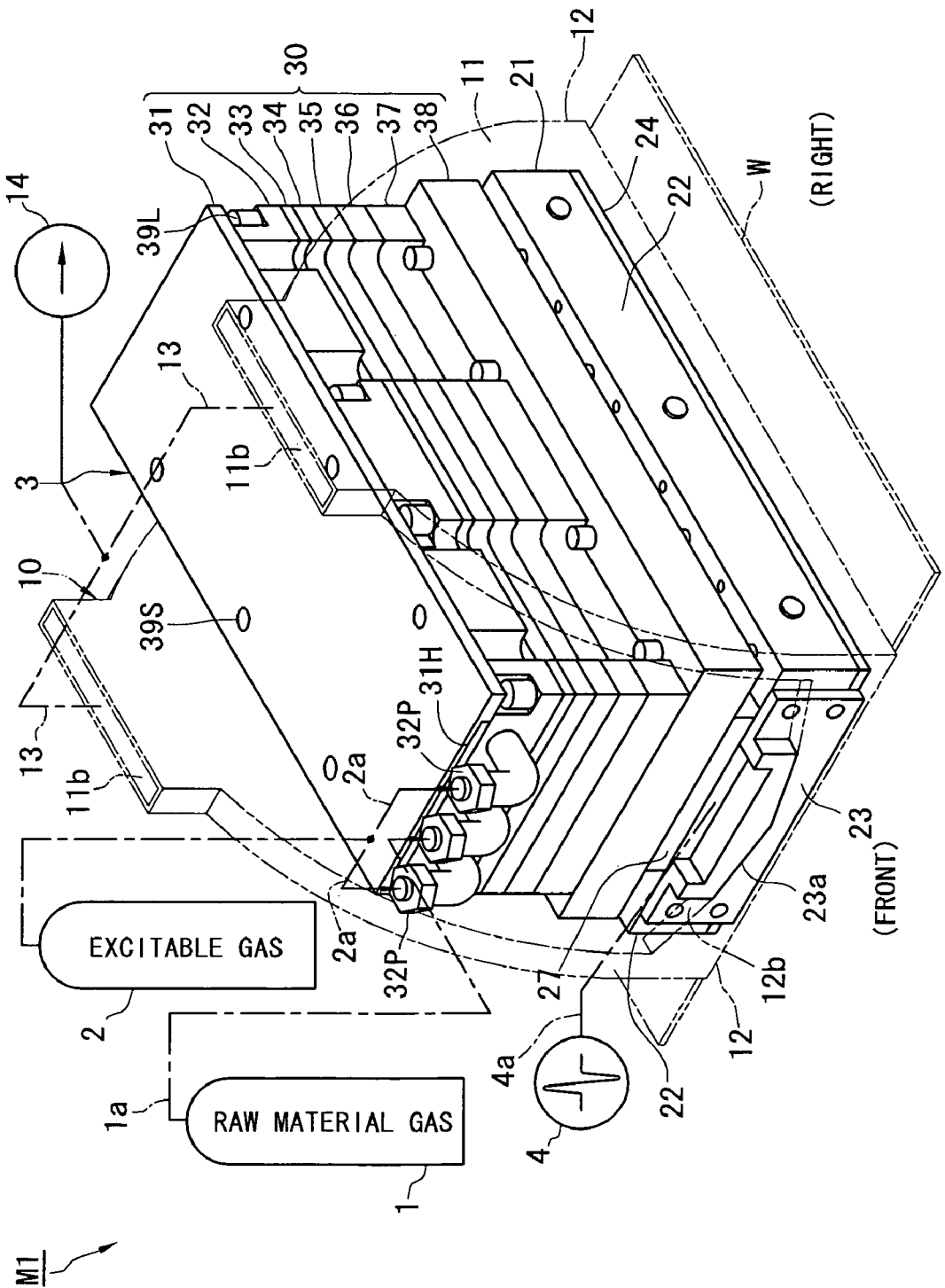
FIG. 1 is a schematic view of a plasma film forming apparatus according to a first embodiment of the present invention.

FIG. 1 shows a normal pressure plasma film forming apparatus M1 according to a first embodiment of the present invention. The normal pressure plasma film forming apparatus M1 comprises a frame (support means) including a housing 10, a processing head 3 supported on the housing 10 of the frame, two kinds of processing gas sources 1, 2 connected to the processing head 3, and a power source 4. Beneath the processing head 3, a plate-like base material W (object to be processed) having a large area is transferred in the left and right direction by transfer means (not shown) It is, of course, accepted that the base material W is fixed and the processing head 3 is moved. In the normal pressure plasma film forming apparatus M1, a film A (FIG. 8) such as, for example, amorphous silicon (a-Si) and silicon nitride is formed on an upper surface of this base material W.

Of the two kinds of processing gas sources, a raw material gas source 1 (first gas source) stores therein a raw material gas (first gas, for example, silane) which forms a film A such as the above-mentioned amorphous silicon. An excitable gas source 2 (second gas source) stores therein an excitable gas (second gas, for example, hydrogen and nitrogen). The excitable gas, when excited by plasma, causes the raw material such as the silane to be reacted to form the film A such as amorphous silicon or the like. On the other hand, the excitable gas does not include a component (film raw material) which is not formed into a film alone even when excited by plasma. Each gas may be stored in a liquid phase and evaporated by an evaporator.

The raw material gas and the excitable gas is generally referred to as the "processing gas".

A pulse power source 4 (electric field impressing means) outputs a pulse voltage to the electrode 51. This pulse voltage preferably has a pulse rise time and/or pulse fall time of 10 μs or less, 200 μs or less of pulse duration, 1 to 1000 kV/cm of electric field strength, and 0.5 kHz or more of frequency.

Figure 3:
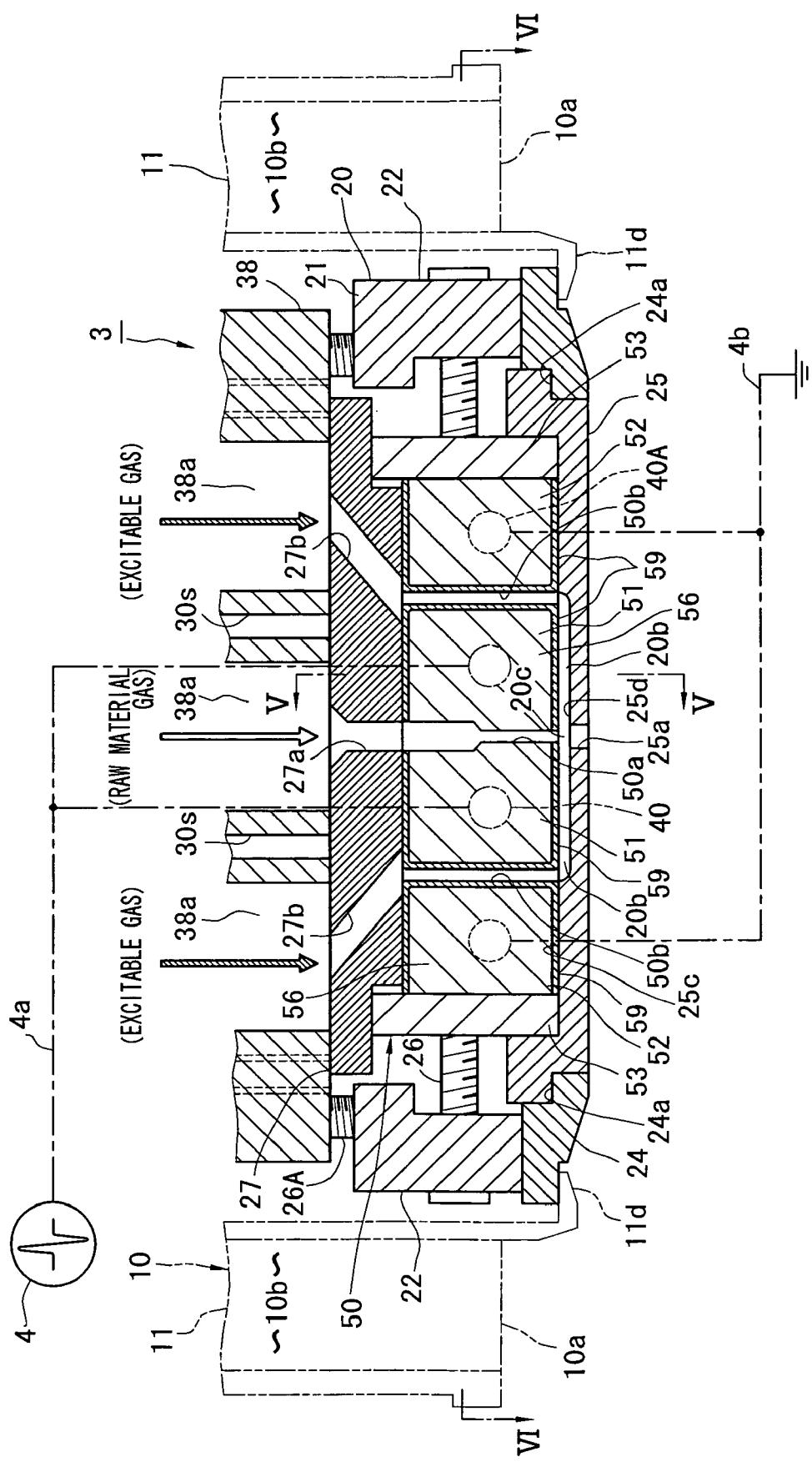
FIG. 3 is a front sectional view of a nozzle part of the processing head.
Figure 6:
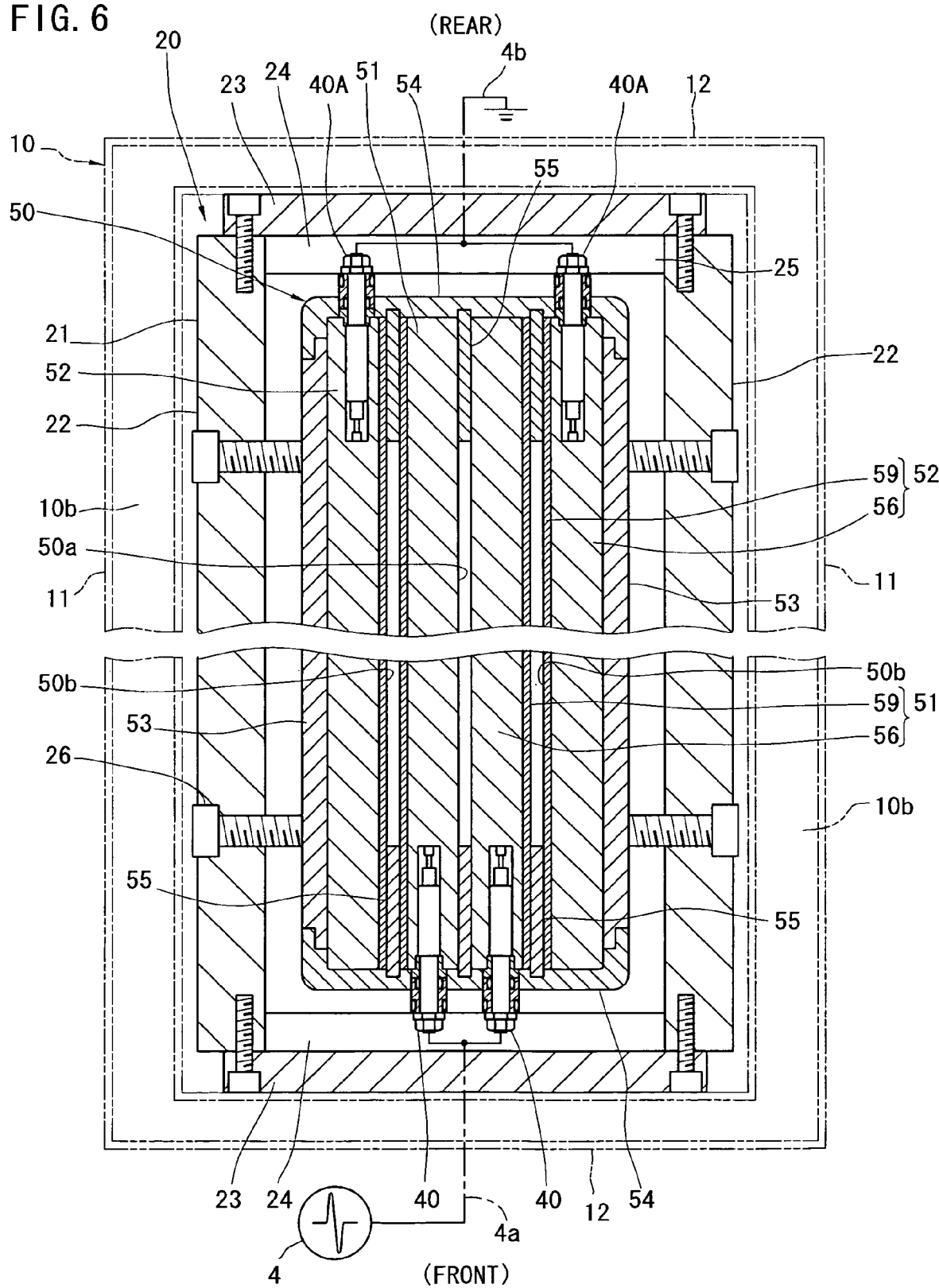
FIG. 6 is a plan sectional view of a left side part of the nozzle part taken on line VI-VI of FIG. 3.

The housing 10 for receiving and supporting the processing head 3 includes a left and a right wall 11 having, for example, a semi-circular configuration in side view and a front and a rear low wall for connecting the lower parts of the walls 11. The housing 10 has a square configuration in plane view. The housing 10 as a support means of the processing head 3 also serves as an intake duct. That is, as shown in FIGS. 3 and 6, the front, rear, left and right walls 11, 12 are of hollow structure. The lower end parts of those hollow parts 10b are open to the lower end faces of the walls 11, 12, thereby forming an intake port 10a surrounding the outer periphery of the lower end of the processing head 3. As shown in FIG. 1, openings 11b continuous with the hollow parts 10b are disposed at the upper end parts of the left and right walls 11. A gas exhaust passage 13 extends from each upper end opening 11b. After converged, those gas exhaust passages 13 are connected to a pump 14 (gas exhaust means).

The processing head 3 has a generally rectangular parallelepiped configuration which is long is the back and forth direction. The processing head 3 is received in and supported by the housing 10 such that the processing head 3 is surrounded with the front, rear, left and right walls 11, 12. The support structure of the processing head 3 will now be described.

Figure 5:
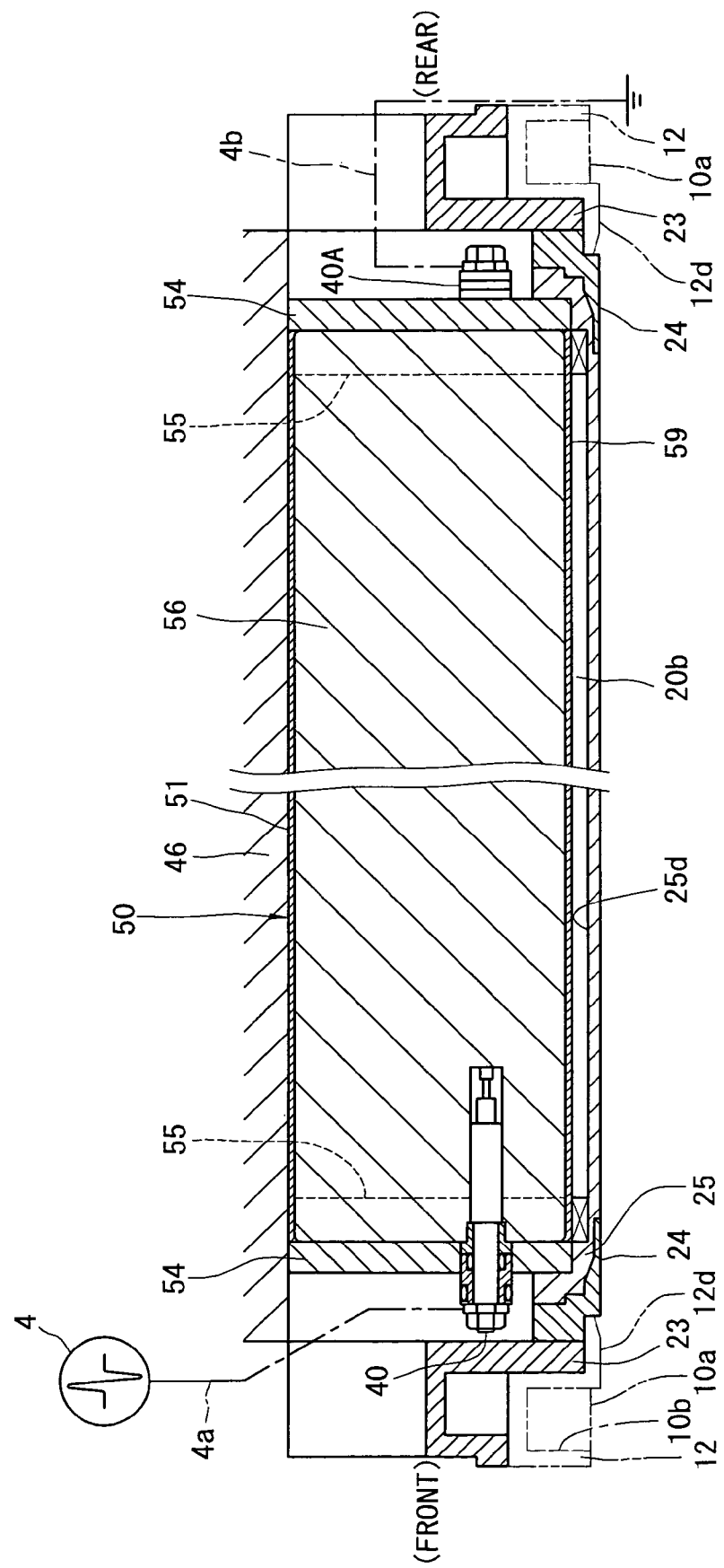
FIG. 5 is a side sectional view of the nozzle part taken on line V-V of FIG. 3.
Figure 7:
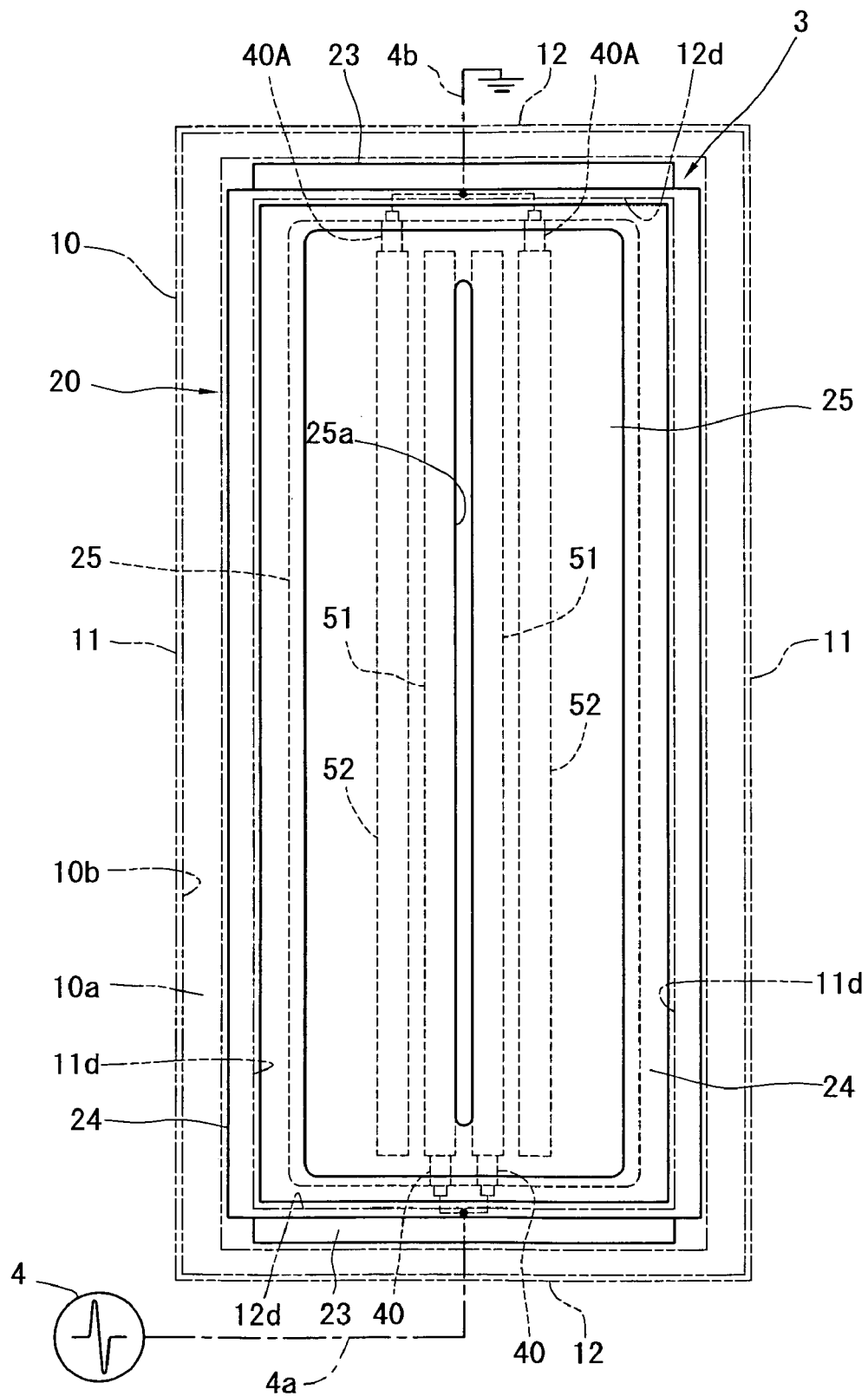
FIG. 7 is a bottom view of the processing head.

As shown in FIGS. 3 and 7, the housing 10 is provided at the lower end edges of the inner wall surfaces of the left and right walls 11 each with an inner flange 11d. A lower frame 24 of the processing head 3 is placed on the inner flanges 11d such that the left and right parts of the lower frame 24 are hooked on the inner flanges lid. As shown in FIGS. 5 and 7, the housing 10 is also provided at the front and rear walls 12 each with an inner flange 12d. The front and rear parts of the lower frame 24 are placed on the inner flanges 12d, respectively.

As shown in FIG. 1, the front and rear walls 12 are formed at the upper end faces each with a positioning recess 12b (head support part) which is recessed in a form of a reversed triangle. On the other hand, a side frame 23 of the processing head 3 is provided with a positioning protrusion 23a which has a reversed triangular configuration. The positioning protrusion 23a is fitted to the positioning recess 12b. Owing to this arrangement, the processing head 3 is positioned to and supported by the housing 10.

It is also accepted that the positioning recess is provided at the processing head 3 and the positioning protrusion is provided at the housing (support means) 10.

As shown in FIG. 1, the processing head 3 is comprised of a gas uniformizing part 30 and a nozzle part 20 on which the gas uniformizing part 30 is superimposed. Gas is introduced to the gas uniformizing part 30 on the upper side from the gas sources 1, 2. The gas uniformizing part 30 uniformizes this gas in the longitudinal direction of the processing head 3 and supplies it to the nozzle part 20 which is located beneath.

Figure 2:
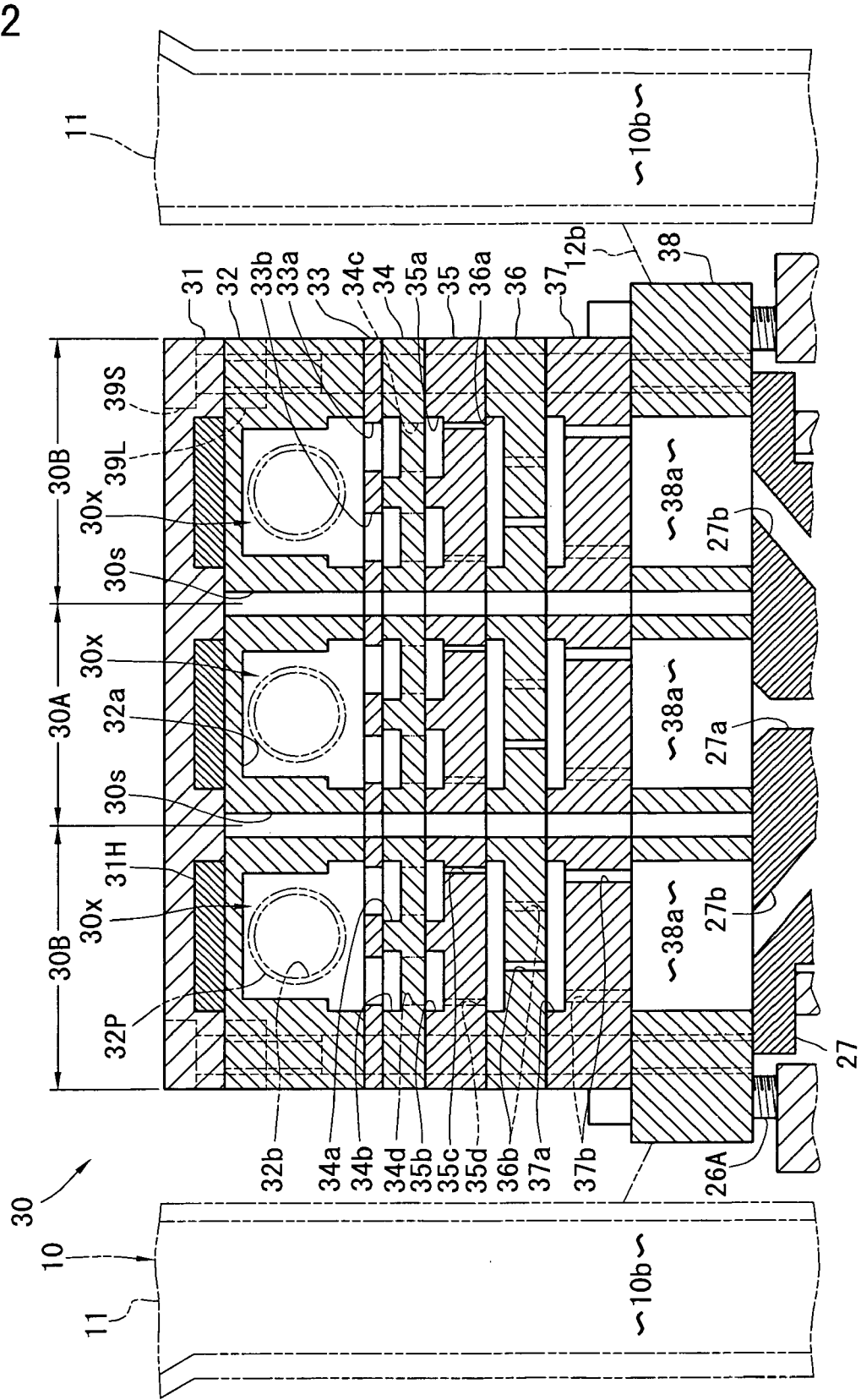
FIG. 2 is a front sectional view of a gas uniformizing part of a processing head of the plasma film forming apparatus.
Figure 4:
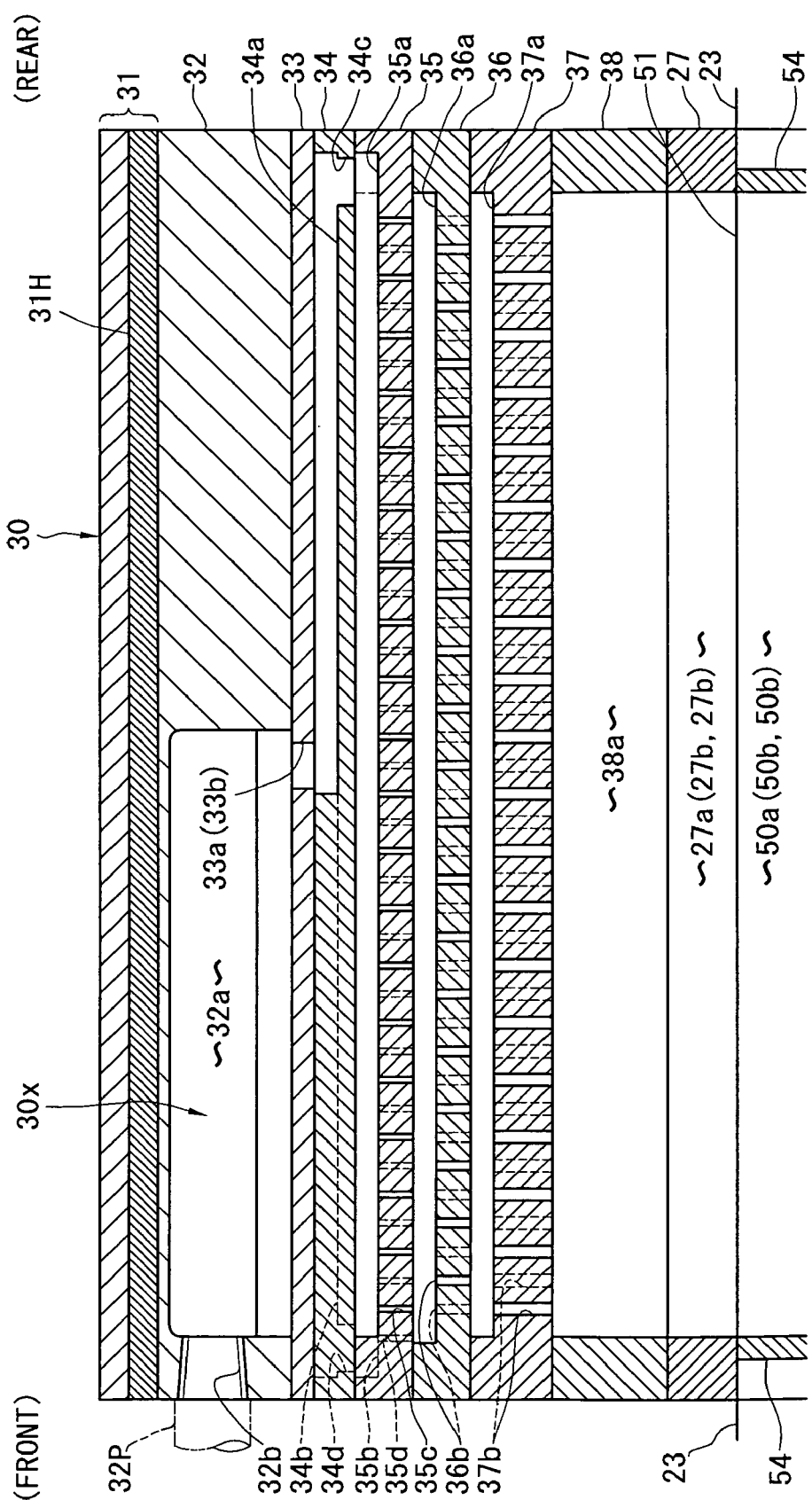
FIG. 4 is a side sectional view taken along the longitudinal direction of the gas uniformizing part.

More specifically, as shown in FIGS. 2 and 4, the gas uniformizing part 30 is constituted by laminating a plurality of copper-made plates 31 through 38 extending forward and backward. Those plates 31 through 38, i.e., gas uniformizing part 30 includes three gas flowing regions 30B, 30A, 30B which are imaginarily dividingly set leftward and rightward.

As shown in FIG. 1, the second-stage plate 32 is provided at a front end part (one end part) thereof with three gas plugs 32P which are arranged, in side-by-side relation, leftward and rightward corresponding to the regions 30B, 30A, 30B. The gas plug 32P in the central raw material gas flowing region 30A is connected with the raw material gas source 1 through a raw material gas tube 1a. The gas plugs 32P in the left and right excitable gas flowing regions 30B, 30B are connected with the excitable gas source 2 through an excitable gas tube 2a. The excitable gas tube 2a extends in the form of a single tube from the excitable gas source 2 and then branched into two tubes so as to be connected with the gas plugs 32P in the respective regions 30B, 30B.

As shown in FIG. 2, the plates 32 through 38 at the second stage through the lowermost stage are provided with gas uniformizing passages 30X which are each formed in the regions 30B, 30A, 30B, respectively. Those gas uniformizing passages 30X are of mutually same structure.

As shown in FIGS. 2 and 4, as the gas uniformizing passages 30x in the respective regions 30B, 30A, 30B, the second-stage plate 32 is formed at a front end part thereof with an inlet port 32b which is connected with the gas plug 32P. The second-stage plate 32 is further formed with a deep reversely recessed groove 32a which extends to a central part in the back and forth direction of the plate 32 and open to a lower surface thereof.

The third-stage plate 33 is formed at a central part in the back and forth direction thereof with a pair of left and right communication holes 33a, 33b which are connected to the reversely recessed groove 32a.

The fourth-stage plate 34 is formed with a line groove 34b which is connected to the communication hole 33a and extends backward, a communication hole 34c which extends to from a terminal end (rear end) of this line groove 34a to a lower surface thereof, and a line groove 34b which is continuous with the communication hole 33b and extends forward, and a communication hole 34d extending from a terminal end (forward end) of this line groove 34b to a lower surface thereof.

The fifth-stage plate 35 is formed with a line groove 35a which is continuous with the communication hole 34c and extends generally over the entire length in the back and forth longitudinal direction, a line groove 35b which is continuous with the communication hole 34d and extends generally over the entire length in the back and forth longitudinal direction, and a plurality of small holes (pressure loss forming passages) 35c, 35d which extend from the respective line grooves 35a, 35b to the lower surfaces and which are arranged at equal pitches in the back and forth direction.

The sixth-stage plate 36 is formed with a wide line groove (expansion chamber) 36a which is continuous with the small holes 35c, 35d and extends generally over the entire length in the back and forth longitudinal direction, and a plurality of small holes (pressure loss forming passages) 36b which extend from the line groove 36a to the lower surface and which are arranged zigzag in two rows at equal pitches in the back and forth direction.

The seventh-stage plate 37 is formed with a wide line groove (expansion chamber) 37a which is continuous with the small holes 36b and which extend generally over the entire length in the back and forth longitudinal direction, and a plurality of small holes (pressure loss forming passages) 37b which extend from this line groove 37a to the lower surface and which are arranged zigzag in two rows at equal pitches in the back and forth direction.

The lowermost-stage plate 38 is formed with a wide through-hole (expansion chamber) 38a which is continuous with the small holes 37b and which extend generally over the entire length in the back and forth longitudinal direction. This through-hole 38a constitutes a downstream end of the gas uniformizing passage 30x. As later described, the through-hole 38a is in communication with guide passages 27b, 27a, 27b of an insulative plate 27.

The uppermost-stage plate 31 receives therein a thin and elongate plate heater 31H which is adapted to heat the gas uniformizing passage 30x and which extends in the back and forth direction. The second through lowermost-stage plates 32 through 38 are formed with a slit 30s along the borders of the regions 30B, 30A, 30B. Owing to this arrangement, the regions 30B, 30A, 30A are individually thermally isolated (broken off) from one another.

In FIGS. 1 and 2, reference numeral 39S denotes a bolt for jointing the uppermost-stage plate 31 with the second-stage plate 32, and reference numeral 39L denotes a bolt for jointing the second through lowermost-stage plates 32 through 38 altogether.

Figure 30:
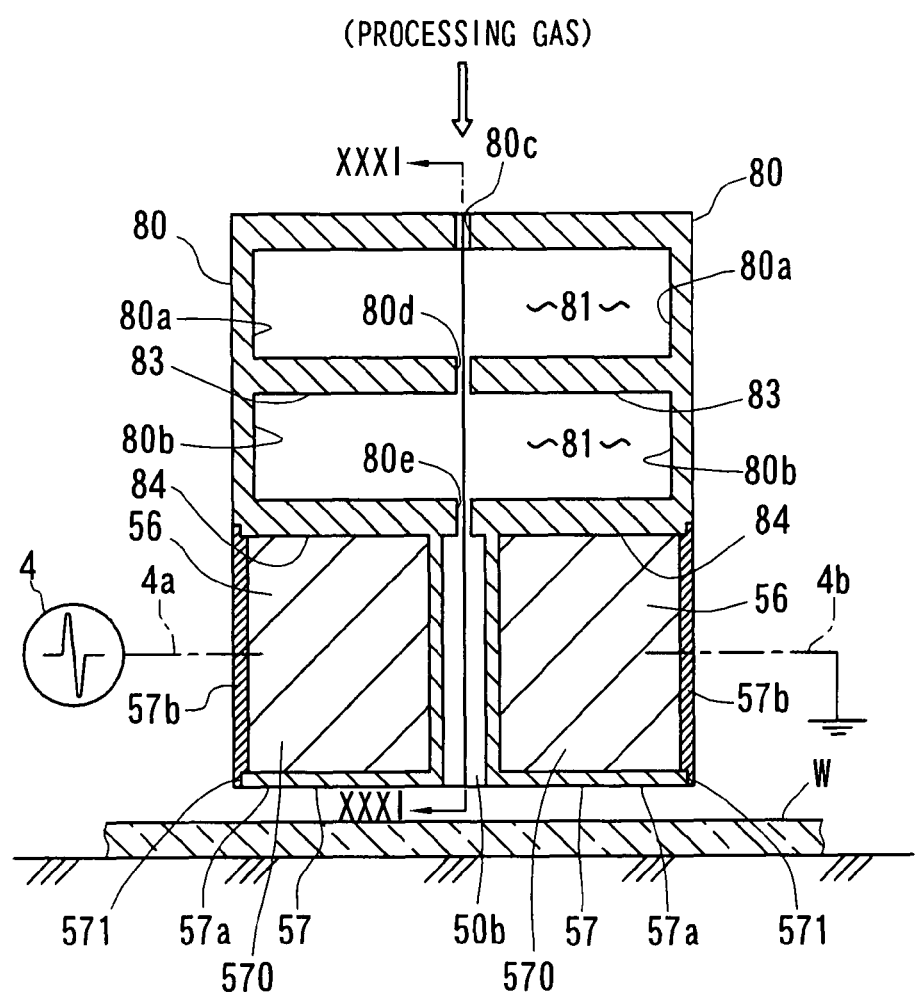
FIG. 30 is a front sectional view of an electrode structure having a gas uniformizing part integrated induction case.

Next, the nozzle part 20 of the processing head 3 will be described. As shown in FIG. 3, the nozzle part 20 comprises a nozzle body 21, an electrode unit 50 received in the nozzle body 21, an insulative plate 27 for covering this unit 50, base material opposing members 24, 25 disposed at a lower side of the unit 50. As shown in FIG. 6, the nozzle body 21 includes metal-made left and right side frames 22 extending long in the back and forth direction, and insulative resin-made front and rear side frames 23 which are disposed between the front and rear end parts of the side frames 22, respectively. The nozzle body 21 has a box-like configuration which is long in the back and forth direction. The side frame 22 is jointed to the lowermost-stage plate 38 of the gas uniformizing part 30 by a bolt 26A (FIG. 30).

As shown in FIGS. 3 and 7, the lower frame 24 constituting one element of the base material opposing member is made of metal such as stainless and aluminum, and it has a rectangular configuration extending in the back and forth direction. As mentioned above, the lower frame 24 is supported in such a manner as to be hooked on inner flanges 11d, 12d of the housing 10. The side frames 22 are placed on the lower arm 24. Although the lower arm 24 and the side frames 22 are merely contacted and not jointed with each other, they may be jointed through an easy removably attaching mechanism such as a bolt and a hook.

As shown in FIG. 3, a step 24a is formed on an inner peripheral edge of the lower frame 24. A peripheral edge part of the rectangular lower plate 25 constituting a main element of the base material opposing member is placed and supported on this step 24a in such a manner as to be hooked thereon. The lower plate 25 is composed of a ceramic (dielectric member or insulative member) such as, for example, alumina. An electrode receiving recess 25c is formed in an upper surface of the lower plate 25. The electrode unit 50 is fitted to this receiving recess 25c.

As shown in FIGS. 3 and 5, a more shallow recess 25d is disposed at the receiving recess 25c formed in the upper surface of the lower plate 25. The recess 25d is wide, and it extends in the back and forth direction. As shown in FIG. 3, a blowoff passage (blowoff aperture) 25a extending from the recess 25d to the lower surface is formed in a central part in the left and right direction of the lower plate 25. As shown in FIG. 7, the blowoff passage 25a has a slit-like configuration, and it extends in the back and forth direction.

As shown in FIG. 3, the insulative plate 27 composed of a ceramic (insulative member) is vertically sandwiched between the lowermost-stage plate 38 of the gas uniformizing part 30 and the electrode unit 50. The insulative plate 27 is formed with three gas guide passages 27b, 27a, 27b which extend generally over the entire length in the longitudinal direction and separately arranged in the left and right direction. The central raw gas guide passage 27a vertically pierces through the insulative plate 27. The right side excitable gas guide passage 27b is slanted leftward from the upper surface of the insulative plate 27 toward downward direction and it finally reaches a lower surface of the plate 27. The left side excitable gas guide passage 27b is slanted rightward from the upper surface of the insulative plate 27 toward downward direction, and it finally reaches the lower surface of the plate 27.

As shown in FIGS. 3 and 6, the electrode unit 50 comprises an electrode group consisting of four (a plurality of) electrodes 51, 52, a pair of left and right side plates 53, and a pair of front and rear end plates 54. Each of the electrodes 51, 52 is constituted by providing an arc preventive solid dielectric layer 59 to the surface of a main body 56 made of metal such as aluminum and stainless steel. The metal main body 56 has a vertically long square configuration in section and extends long in the back and forth direction. The solid dielectric layer 59 is composed of a dielectric member such as ceramic and coated in the form of film on a surface on the side of a flow passage 50*b*, as later described, and upper and lower surfaces of the metal main body 56 by thermally sprayed coating or the like. Instead of thermally sprayed coating, a resin sheet such as poly-tetrafluoro-ethylene may be adhered to the metal main body 56.

The four electrodes 51, 52 are arranged in mutually parallel relation in the left and right direction.

In the electrode group, the two electrodes 51 on the middle side are electric field impressing electrodes (first electrodes), and the two electrodes 52 on both left and right ends (both ends in the arranging direction) are ground electrodes (second electrodes). Accordingly, the electrode group is constituted by arranging the ground electrode 52, the electric field impressing electrode 51, the electric field impressing electrode 51 and the ground electrode 52 in this order in the left and right direction.

Each of the electrodes 51, 52 may be formed therein with a temperature controlling passage for allowing a temperature controlling cooling water to pass therethrough.

The side plates 53 of the electrode unit 50 are each made of an insulative resin. The side plates 53 are placed along rear surfaces (reversed side surfaces of the opposing side with respect to the electrode 51) of the left and right electrodes 52 and sandwich the electrode group from the left and right sides. A bolt 26 screwed in through the side frame 22 is abutted with a rear surface of the side plate 53. Owing to this arrangement, the electrode unit 50 is correctly positioned and retained within the nozzle body 21.

The end plates 54 of the electrode unit 50 are each made of an insulative resin. The end plates 54 are applied to both end faces in the longitudinal direction of the four electrodes 51, 52 and sandwich the electrode group from the front and rear side.

A feeding/grounding structure of the electrodes 51, 52 will be described. As shown in FIG. 6, a feed pin 40 is embedded in, for example, a front end part (one end part in the longitudinal direction) of each of the two electric field impressing electrodes on the middle side, and a ground pin 40A having the same construction as the feed pin 40 is embedded in a rear end part (the other end part in the longitudinal direction) of each of the two electrodes 52 on both the left and right sides.

Figure 10:
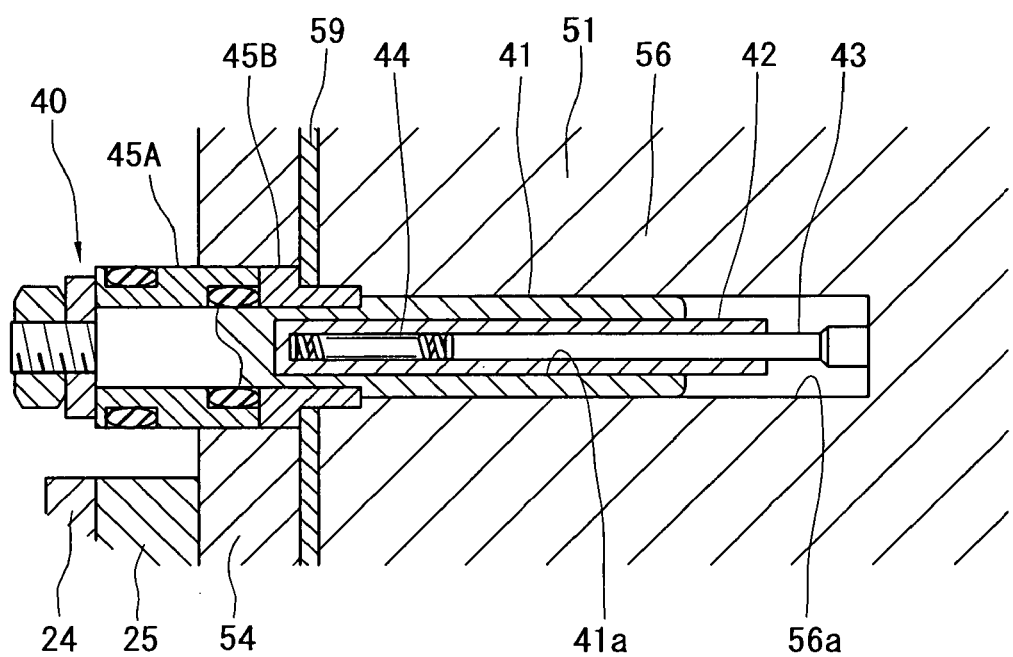
FIG. 10 is a detailed view of a power feed pin of the nozzle part.

As shown in FIG. 10, the feed pin 40 for the electric field impressing electrode 51 comprises a shaft-like pin main body 41 having a shaft hole 41*a* which is open to a forward end face, a barrel body 42 received in the shaft hole 41*a*, and a core member 43 slideably received in this barrel body 42. The pin main body 41, the barrel body 42 and the core member 43 are composed of a conductive metal such as stainless steel and they are electrically conducted by being abutted with one another at their inner and outer peripheral surfaces.

A forward end part of the pin main body 41 is withdrawably pushed into a pin hole 56*a* formed in a front end face of the electric field impressing electrode 51. Owing to this arrangement, the pin main body 41 and the electrode 51 are electrically conducted with each other. A coiled spring 44 (biasing means) is received in the barrel body 42. By this coiled spring 44, the core member 43 is biased in the forward end direction, i.e., in the direction to be pushed out of the shaft hole 41*a*. Owing to this arrangement, the forward end part of the core member 43 is pressed hard against the innermost end face of the pin hole 56*a*. As a result, the electrically conducting state between the feed pin 40 and the electrode main body 56 is surely maintained.

Barrel-like pin holders 45A, 45B, which are each made of an insulative member are mounted on a basal end part (head part) of the pin main body 41. The basal end part of the holder-mounted pin main body 41 projects from the end plate 54 and is disposed between the front side end plate 54 and the side frame 23. As shown in FIG. 5, a power feed line 4*a* extends from the basal end part of this main body 41 and is connected to the pulse power source 4.

The ground pin 40A for the ground electrode 52 has the same construction as the feed pin 40. As shown in FIG. 6, the head part of the ground pin 40A projects from the rear side end plate 54. A ground line 4*b* is connected to the head part of the ground pin 40A. The ground line 4*b* is allowed to pass between the upper surface of the rear-side side frame 23 and the insulative plate 27 and pulled outside of the processing head 3 so as to be grounded.

As shown in FIGS. 3 and 6, flow passages 50*a*, 50*b* for the processing gas, i.e., the raw material gas or excitable gas are formed between the adjacent electrodes 51, 52.

More specifically, between the middle side electrodes 51, 51 having the same polarities, the flow passage 50*a* for the raw material gas is formed. Between both the left and right side electrodes 52, 51 having different polarities, one each of the flow passages 50*b* (plasma discharge space) for the excitable gas is formed. Accordingly, the excitable gas flow passage 50*b*, the raw material gas flow passage 50*a*, and the excitable gas flow passage 50*b* are arranged in this order from the left.

The electrode unit 50 is provided at the front and rear end plates 54 with three plate piece-like spacers 55 which are each made of an insulative resin. Those plate piece-like spacers 55 are pushed in between the adjacent electrodes 51, 52, thereby establishing the width of each of the flow passages 50*b*, 50*a*, 50*b*.

As shown in FIG. 3, an upper end part (upstream end) of the central flow passage 50*a* is straightly continuous with the gas uniformizing passage 30*x* in the central region 30A of the gas uniformizing part 30 through the central guide passage 27*a* of the insulative plate 27, and thus with the raw material gas source 1 through the tube 1*a*.

The surface for forming the flow passage 50*a* of each electric field impressing electrode 51 is indented at an upper side thereof and projected at a lower side thereof. A step is formed at an intermediate part of the flow passage forming surface. Owing to this arrangement, the flow passage 50*a* is enlarged in width at the upper side and reduced in width at the lower side.

Upper end parts (upstream ends) of the flow passages 50*b*, 50*b* on the left and right sides are continuous with the gas uniformizing passages 30*x*, 30*x* in the left and right regions 30B, 30B of the gas uniformizing part 30 through the left and right guide passages 27*b*, 27*b* of the insulative plate 27, and thus, with the excitable gas source 2 through the tube 2*a*.

Each ground electrode 52 is placed on an upper surface of the electrode receiving recess 25*c* of the lower plate 25. On the other hand, as shown in FIGS. 3 and 5, the respective electric field impressing electrodes 51 are spacedly arranged at an upper part of the recess 25*d* of the lower plate 25. Owing to this arrangement, a gap 20*b* is formed between the lower surface of each electric field impressing electrode 51 and the lower plate 25.

As shown in FIG. 3, those left and right gaps 20*b* each serve as a communication passage for communicating the flow passage 50*b* between the electrodes having different polarities with the flow passage 50*a* between the electrodes having the same polarities. That is, a left end part (upstream end) of the left side communication passage 20*b* is continuous with the flow passage 50*b* between the electrodes having different polarities, and a right end part (downstream end side) is crossed with the lower end part (downstream end) of the electrode passage 50*a* between the electrodes having the same polarities. The right end part (upstream end) of the right side communication passage 20*b* is continuous with the flow passage 50*b* between the right side electrodes having different polarities, and the left end part (downstream end) is crossed with the downstream end of the flow passage 50*a* between the electrodes having the same polarities.

The flow passage 50*a* between the electrodes having the same polarities constitutes the "first flow passage", and the flow passage 50*a* between the electrodes having different polarities and the communication passage 20*b* constitutes the "second flow passage".

The electrodes 51, 51 having the same polarities constitute the "first flow passage forming means". The electrodes 51, 52 having different polarities, and the electrode 51 and the lower plate 25 constitute the "second flow passage forming means".

The left and right communication passages 20*b* are horizontal and orthogonal to the vertical first flow passage 50*a*. The left and right second flow passages 50*b*, 20*b* are symmetrical with each other with respect to the central first flow passage 20*a* sandwiched therebetween.

Figure 8:
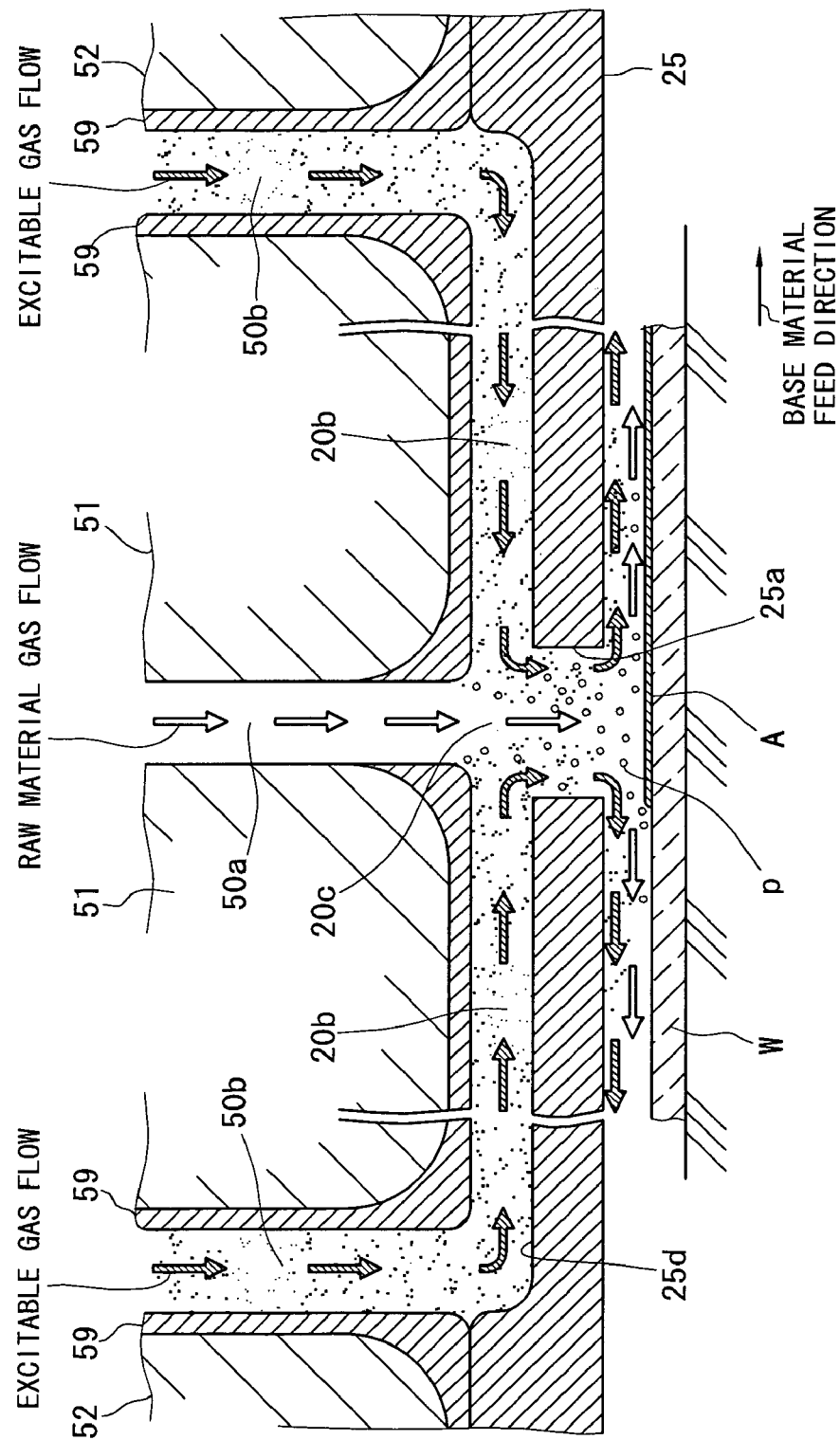
FIG. 8 is an enlarged view of a gas blowoff part of the processing head.

As shown in FIG. 8 on an enlarged basis, the blowoff passage 25*a* of the lower plate 25 is continuous with a crossing part (converging part) among the three flow passages 20*b*, 50*a*, 20*b*. This blowoff passage 25*a* serves as a common blowoff passage of the raw material gas and the excitable gas, and its downstream end (blowoff port) is open to a lower surface of the lower plate 25. The blowoff passage 25*a* is disposed right under the vertical flow passage 50*a*.

Operation of the normal pressure plasma film forming apparatus M1 thus constructed will now be described.

The Excitable gas (second gas) such as hydrogen coming from the excitable gas source 2 is introduced, via the gas tube 2*a*, into the gas uniformizing passages 30*x* in the left and right regions 30B from two left and right plugs 32P of the processing head 3 and uniformized in the back and forth longitudinal direction by those passages 30*x*. The excitable gas thus uniformized is introduced into the left and right flow passages 50*b* via the left and right guide passages 27*b*, respectively.

On the other hand, the voltage coming from the pulse power source 4 is fed to the electric field impressing electrode 51, and a pulse electric field is impressed between the electrodes 51, 52 having different polarities. By this, as shown in FIG. 8, Glow discharge is generated in the left and right flow passages 50*b*, and the excitable gas is plasmatized (excited and activated). The excitable gas thus plasmatized is guided into the communication passage 20*b* from the flow passage 50*b* and allowed to flow toward the crossing part 20*c*. This excited gas itself does not contain any component which is adhered to and deposited on the surface of ceramic or the like by excitation. Accordingly, it never happens that film is adhered to the opposing surfaces between the electrodes 51, 52 having different polarities, the lower surface of the electrode 51 and the upper surface (second flow passage forming surface) of the lower plate 25.

Simultaneously with the flowing of the excitable gas, the raw material gas (first gas) such as silane gas coming from the raw material gas source 1 is introduced, via the gas tube 1*a*, into the gas uniformizing passage 30*x* in the central region 30A from the central gas plug 32P of the processing head 3 and uniformized in the back and forth longitudinal direction. Thereafter, the gas is introduced, via the central guide passage 27*a*, into the central flow passage 50*a* between the electrodes having the same polarities. Although pulse voltage is fed to each of the two electric field impressing electrodes 51, no electric field is impressed between those electrodes 51, 51 having the same polarities and therefore, it never happens that plasma discharge occurs at the flow passage 50*a*. Thus, the raw material gas is allowed to pass as it is without being plasmatized. For this reason, a film is not adhered to the opposing surfaces (first flow passage forming surface) between the electrodes 51 having the same polarities.

Since no film is attached to anywhere of the four electrodes, maintenance of the electrodes 51, 52 becomes easy. Moreover, loss of the raw material occurrable at the time of passage between the electrodes can be eliminated.

The raw material gas passing through the flow passage 50*a* is reduced at the lower side of the passage 50*a* where the passage 50*a* is narrow and therefore, the pressure is increased.

After passing through the central flow passage 50*a*, the raw material gas flows to the crossing part 20*c* between the left and right communication passages 20*b*. The excitable gas plasmatized in the left and right flow passages 50*b* also flows to the crossing part 20*c* through the communication passage 20*b*. By this, the raw material gas is contacted with the plasmatized excitable gas (active species) so as to take place such reaction as decomposition and excitation, thereby generating a radical reaction production p which is turned out to be a film.

The excitable gas flow entering the crossing part 20*c* from the left and right passages 20*b* is pushed by the raw material gas flow and curved downward. By this, the excitable gas mostly flows along the right side edge surface and the left side edge surface of the blowoff passage 25*a*, and the raw material gas mostly flows in such a manner as being sandwiched between the left and right excitable gas flows and passes through the middle side of the blowoff passage 25*a*. This makes it possible for the reaction product p scarcely to contact the edge surface of the blowoff passage 25*a*. Therefore, adhesion of a film to the edge surface of the blowoff passage 25*a* can be reduced, and the raw material loss can further be reduced.

Then, the processing gas (excitable gas and raw material gas) is blown off from the blowoff passage 25*a* generally in a laminar flow state. By this, a desired film A can be formed by applying the reaction product p to the upper surface of a base material W placed immediately under the blowoff passage 25*a*.

Since the gas is uniformized in the back and forth direction by the gas uniformizing part 30, the film A, which is uniform in the back and forth direction, can be formed.

Thereafter, the processing gas flows in the two left and right directions through the space between the processing head 3 and the base material W in such a manner as to be away from the blowoff passage 25*a*. At that time, the excitable gas is mostly one-sided toward the processing head 3 side, and the raw material gas is mostly one-sided toward the base material W side located thereunder. By this, the reaction product p can be maintained in a state hardly contacting the lower surfaces of the lower plate 25 and the lower frame 24. As a result, film adhesion to those members 25, 24 can be reduced, and frequency of film removal can be reduced.

The processed gas is taken into the housing 10 through the intake port 10*a* and then discharged by actuation of a vacuum pump 14. By controlling the intake pressure of this vacuum pump 14, etc., the excitable gas and the raw material gas can be maintained in the generally laminar flow state, and film adhesion to the processing head 3 can more surely be prevented from occurring.

Figure 9:
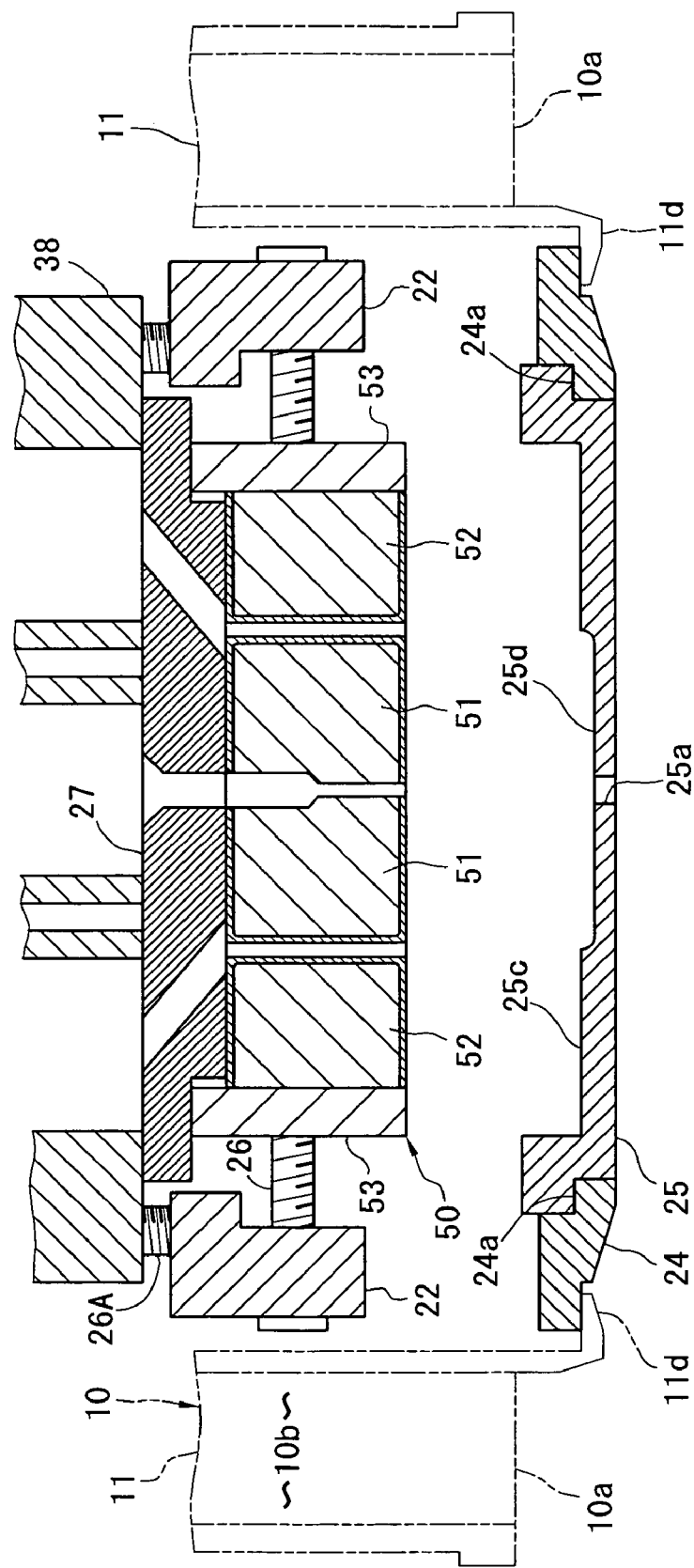
FIG. 9 is a front sectional view showing a manner for separating a head main body of the processing head and a nozzle tip composing member at the time of maintenance.

For example, even if a film should be formed on the base material opposing member (lower frame 24 and lower plate 25), by pulling out processing head 3 and taking it out of the housing 10 as shown in FIG. 9, only the base material opposing members 24, 25 would left remained in the state hooked on the inner flanges 11*d*, 12*d* of the housing 10. By this, the base material opposing members 24, 25 can be separated from the processing heads 3 very easily. Thereafter, only the base material opposing members 24, 25 are subjected to cleaning process by being dipped in a chemical liquid such as, for example, strong acid, so that a film can be removed. Since the entire processing head 3 is no more required to be subjected to cleaning process, maintenance can be simplified. On the other hand, by preparing spare parts of the base material opposing members 24, 25 and attaching them to the apparatus M1, the film forming processing can be kept continued even during the cleaning process.

According to the normal pressure plasma film forming apparatus M1, since the power feed line 4a is pulled out of one end part of the processing head and a ground line 4b is pulled out of the other end part (FIGS. 5 and 7), those lines 4a, 4b can be prevented from being short-circuited.

Moreover, the power feed/ground lines 4a, 4b and the electrode main body 56 can be electrically connected through the power feed/ground pins 40, 40A surely and easily. Since the power feed/ground pins 40, 40A can easily be removed, they can not be any disturbance at the time of maintenance.

Moreover, the two ground electrodes 52 are arranged on the left and right outer sides with the two electric field impressing electrodes 51 sandwiched therebetween, electric field can be prevented from leaking outside and the entire processing head 3 can easily be grounded, too.

Other embodiments of the present invention will be described next. In the embodiments to be described hereinafter, the same construction as in the above-mentioned embodiment is denoted by same reference numeral in Figures so that description thereof can be simplified.

Figure 11:
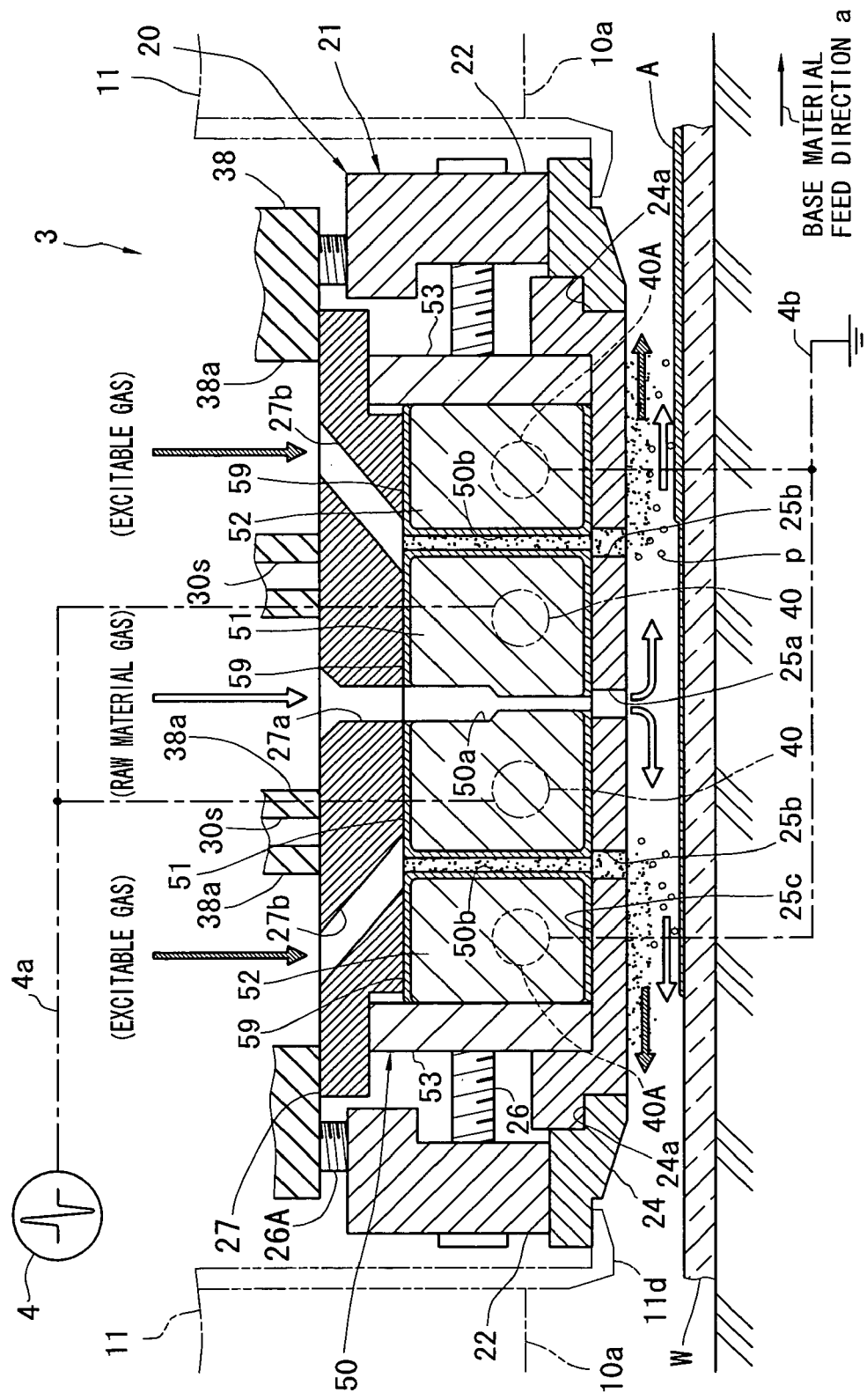
FIG. 11 is a front sectional view of a nozzle part of a processing nozzle in a plasma film forming apparatus according to a second embodiment of the present invention.
Figure 12:
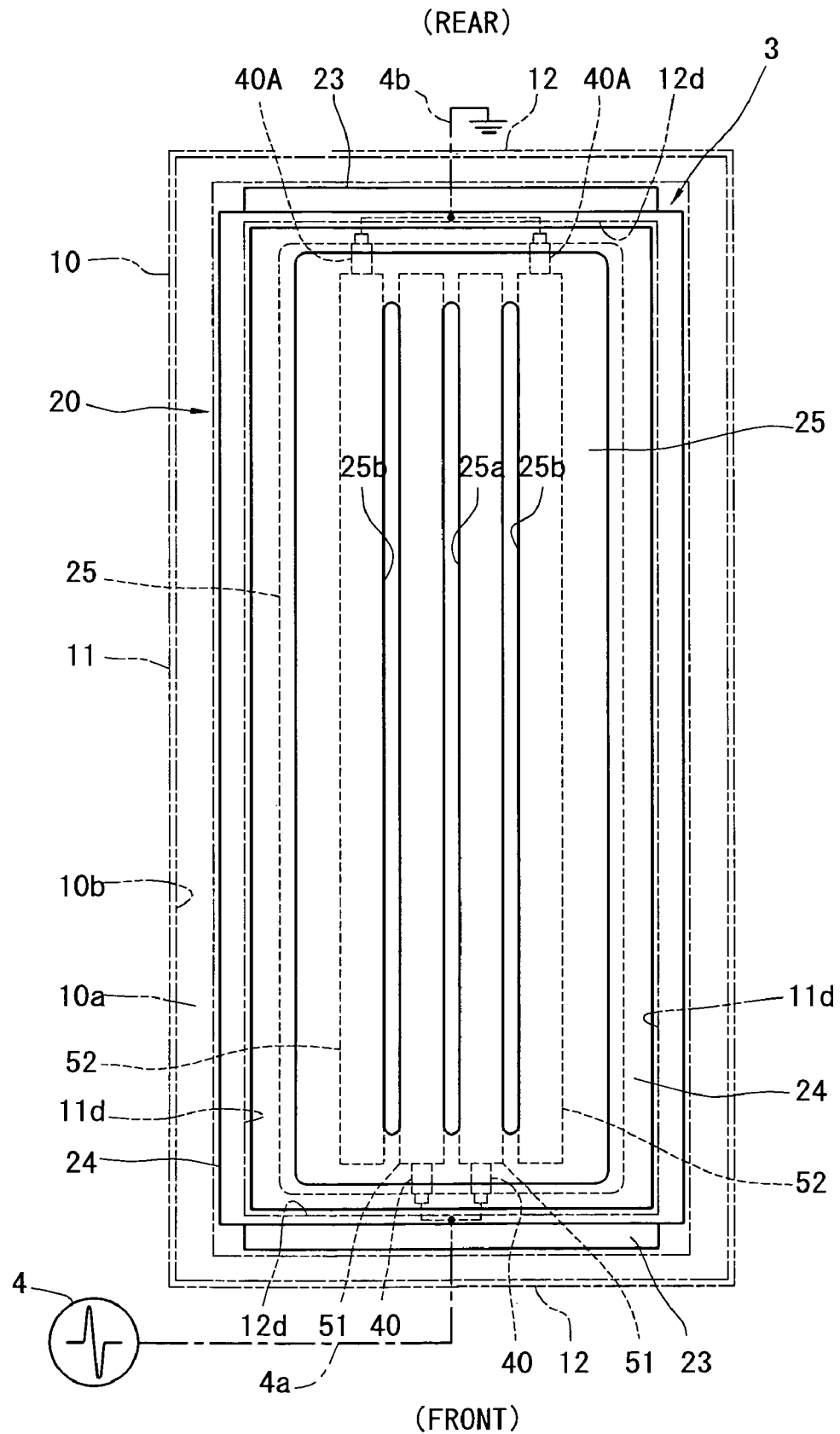
FIG. 12 is a bottom view of the processing head of the second embodiment.

FIGS. 11 and 12 show a second embodiment of the present invention. In the second embodiment, the blowoff ports for the first and second gases are separately formed.

More specifically, as shown in FIG. 12, a lower plate 25 is formed with three slit-like individual blowoff passages 25b, 25a, 25b which extend in the back and forth direction and which are arranged in parallel at equal intervals in the left and right direction.

As shown in FIG. 11, the left side blowoff passage 25b is continuous straight with a lower part of a flow passage 50b between the left side electrodes 52, 51 having different polarities. The central blowoff passage 25a is continuous straight with a lower part of a flow passage 50a between the central electrodes 51, 51 having the same polarities. The right side blowoff passage 25b is continuous straight with a lower part of the flow passage 50b between the right side electrodes 51, 52 having different polarities. The lower end parts of those three blowoff passages 25b, 25a, 25b are open to a lower surface of the lower plate 25. The lower end opening of the central blowoff passage 25a constitutes a blowoff port for a raw material gas (first gas), and the lower end openings of the left and right blowoff passages 25b constitute blowoff ports for an excitable gas (second gas).

The lower plate 25 is not provided at an electrode receiving recess 25c with the recess 25d of the first embodiment, and an electric field impressing electrode 51 is abutted with the upper part of the receiving recess 25c. Accordingly, the communication passage 20b of the first embodiment is not formed.

The raw material gas guided into the central flow passage 50a is blown off directly through the blowoff passage 25a, and thereafter, allowed to flow separately in the two left and right directions between the lower plate 25 and a base material W. On the other hand, the excitable gas guided into the left and right flow passages 50b is plasmatized (excited and activated) by the electric field between the electrodes 51, 52 having different polarities, and thereafter, blown off through the left and right blowoff passages 25b. The raw material gas flowing on the base material W contacts the excitable gas thus blown off. As a result, reaction is taken place. By this, a film A is formed on the base material W. Thereafter, the excitable gas and the raw material gas flow toward an intake port 10a in their vertically overlapped generally laminar flow states and then, they are discharged.

Figure 13:
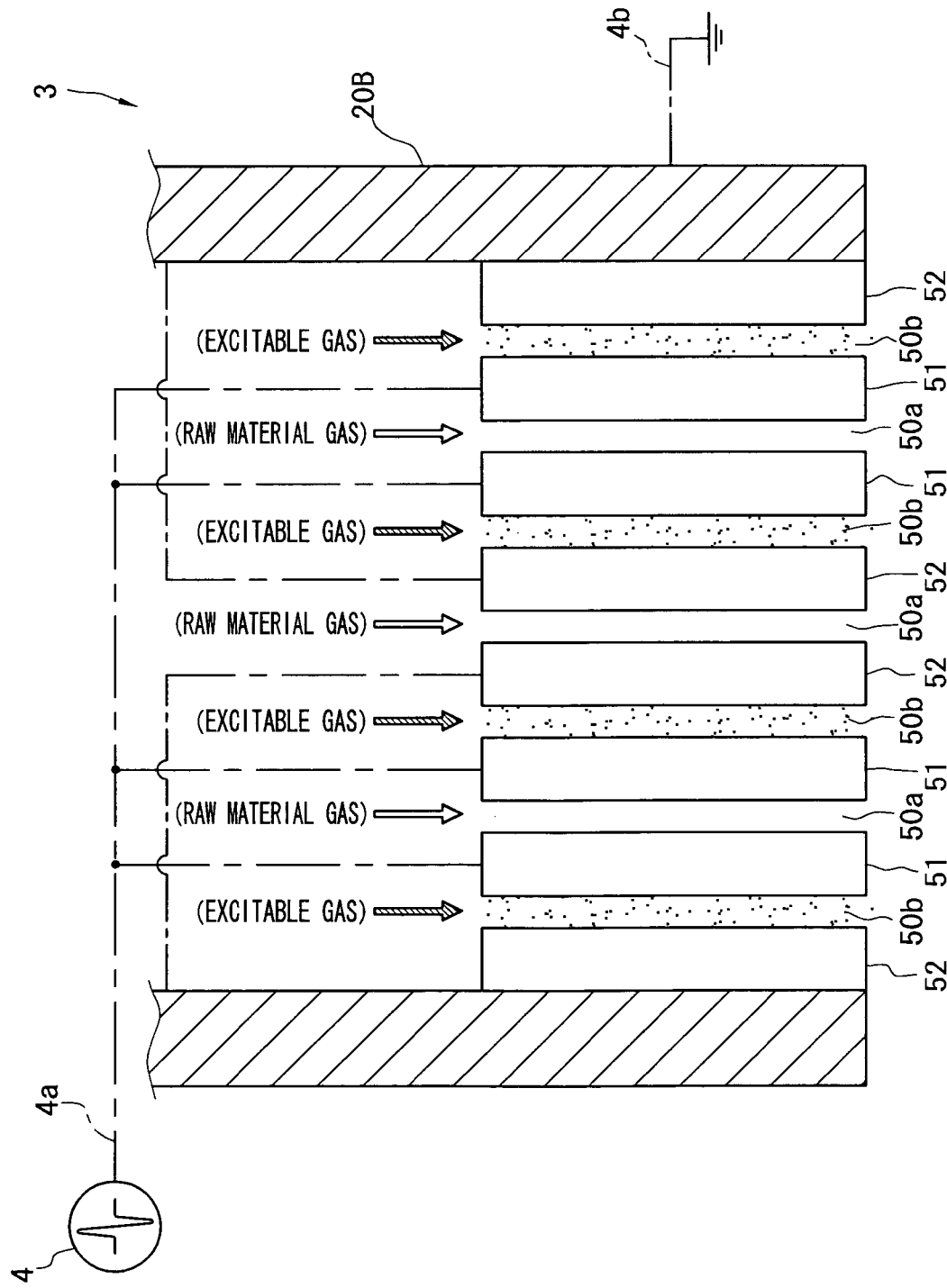
FIG. 13 is a front sectional view of a processing head in a plasma film forming apparatus according to a third embodiment of the present invention.

FIG. 13 shows a third embodiment of the present invention.

In the third embodiment, an electrode group consisting of eight (a plurality of) planar electrodes 51, 52 is disposed within a metal conductor-made nozzle body 20B of a processing head 3. Those electrodes are in mutually parallel relation and arranged at equal intervals in the order of the ground electrode 52, the electric field impressing electrode 51, the ground electrode 52, the ground electrode 52, the electric field impressing electrode 51, the electric field impressing electrode 51 and the ground electrode 52 from left. Owing to this arrangement, the second flow passages (plasma discharge space) 50b between the electrodes having different polarities and the first flow passages 50a between the electrodes having the same polarities are alternately arranged. Each first flow passage 50a allows the raw material gas (first gas) from a raw material gas source (not shown) to pass therethrough, and each second flow passage 50b allows the excitable gas (second gas) from an excitable gas source (not shown) to pass therethrough.

The ground electrodes 52 located at the opposite end parts in the arranging direction of the electrode group are abutted at their rear surfaces along a nozzle body 20B and electrically conducted with this nozzle body 20B. Although not shown specifically, the central side two ground electrodes 52 are abutted at opposite end parts in the longitudinal direction (orthogonal direction to the paper surface of FIG. 13) with the nozzle body 20B and electrically conducted with this nozzle body 20B. The nozzle body 20B is grounded through the ground line 4b. Owing to this arrangement, the entire processing head 3 can be grounded and at the same time, the ground electrode 52 can be grounded.

In the third embodiment, the ground electrodes 52 located at the opposite outer sides may be integrally formed with the nozzle body 20B. That is, the nozzle body 20B may serve also as the ground electrodes 52 located at the opposite outer sides.

In the third embodiment, the number of the electrodes in the electrode group is not limited to eight but it may be three, five to seven, or nine or more. Those electrodes are arranged such that different polarities space (second flow passage) for allowing the second gas to pass therethrough and the same polarities space (first flow passage) for allowing the first gas to pass therethrough are alternately formed. That is, those electrodes are arranged in the order of the second electrode, the first electrode, the first electrode, the second electrode, the second electrode, the first electrode, the first electrode, the second electrode, the second electrode, the first electrode, the first electrode, the second electrode and so on. The second electrode as the ground electrode is preferably arranged at the outermost side. In case the number of the electrodes is even in total, the number of the first electrodes is equal to the number of the second electrodes. In case the number of the electrodes is odd in total, the number of the second electrodes becomes larger than the number of the first electrodes by one. It is accepted that the electrodes having the same polarities (preferably, ground electrodes) are arranged at the outermost side and at an inner location next to the outermost side, and the first gas is passed through the opposing space at the outermost side. It is also accepted that a plurality of first and second electrodes, which are so long as almost equal to the entire length of a base material having a large area, are arranged over the entire width of the base material in the above-mentioned order so that the entire base material can be formed with a film at a time.

Moreover, the first and second flow passages may be alternately arranged one by one. It is also accepted that a plurality of at least one of the first and second flow passages are arranged adjacent to each other, and groups of such adjacent flow passages and the other flow passages are alternately arranged in parallel.

Figure 14:
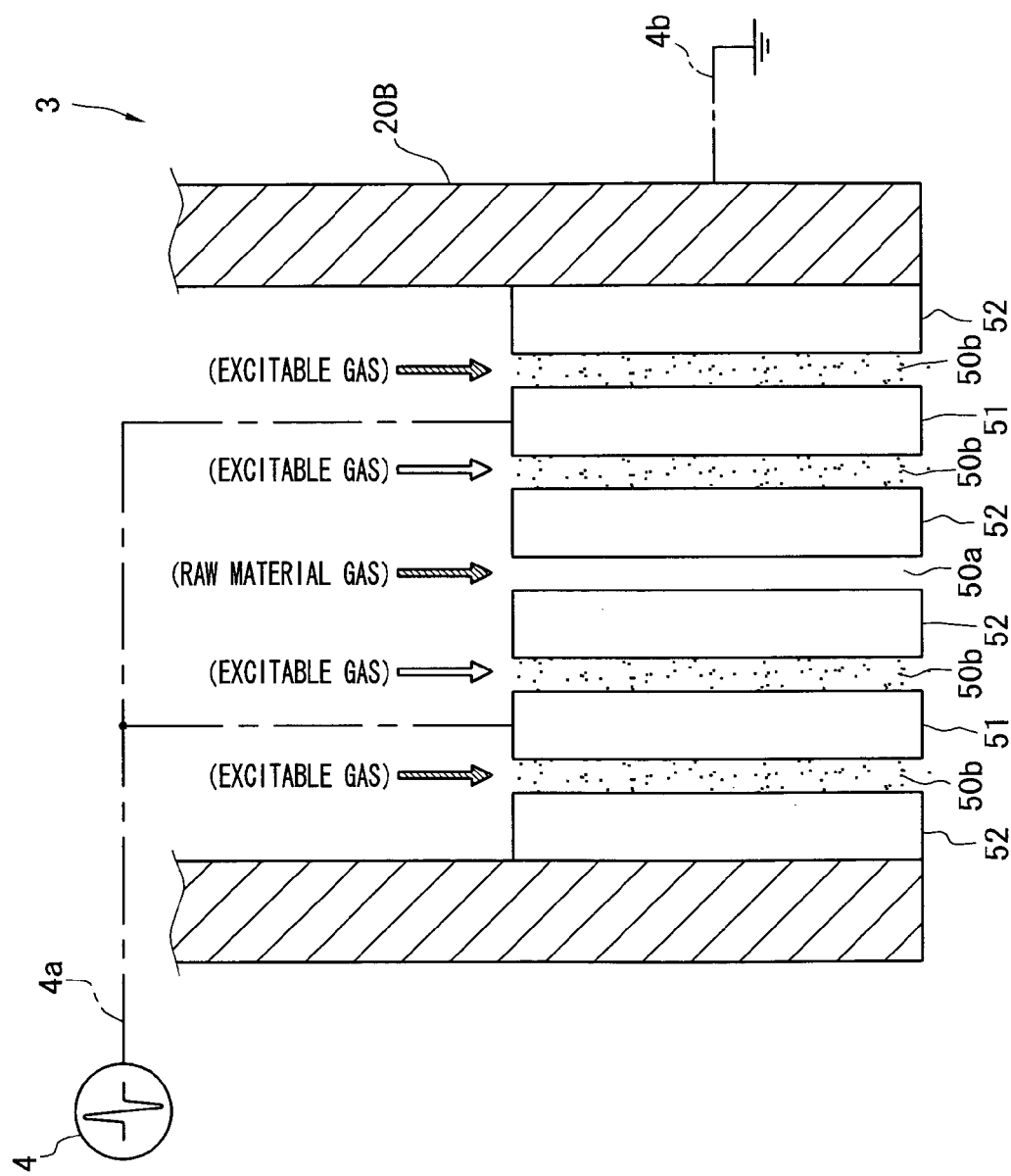
FIG. 14 is a sectional view showing a modified embodiment of the third embodiment.

FIG. 14 shows a modified embodiment of such an alternate arrangement construction. The processing head 3 of this modified embodiment, a group of electrodes are arranged in the order of the second electrode 52, the first electrode 51, the second electrode 52, the second electrode 52, the first electrode 51 and the second electrode 52. Owing to this arrangement, one of such first flow passages 50a is arranged at the center and two of such second flow passages 50b are arranged on the opposite left and right sides thereof. That is, two (a plurality of) second flow passages 50b and one first flow passage 50a are alternately arranged in parallel. In FIG. 14, the ground line of the second electrode 52 is not shown.

According to the modified embodiment of FIG. 14, a large reaction area for reaction of the raw material gas and the plasmatized excitable gas can be obtained, the raw material gas can sufficiently be reacted to form into a film and the reaction efficiency (yield) can be enhanced. Moreover, by mildly blowing off the plasmatized excitable gas from the respective second flow passages 50ab, a generally laminar flow state can surely be obtained.

FIGS. 15 through 20 show a fourth embodiment of the present invention.

In the fourth embodiment, as in the first embodiment, second flow passages are arranged on the left and right sides with a central first flow passage sandwiched therebetween. Those three flow passages are converged and continuous with a single common blowoff passage 25a. The fourth embodiment is different from the first embodiment in respect of the arrangement position of the ground electrode and the location of the plasma discharge part of the second flow passage.

Figure 15:
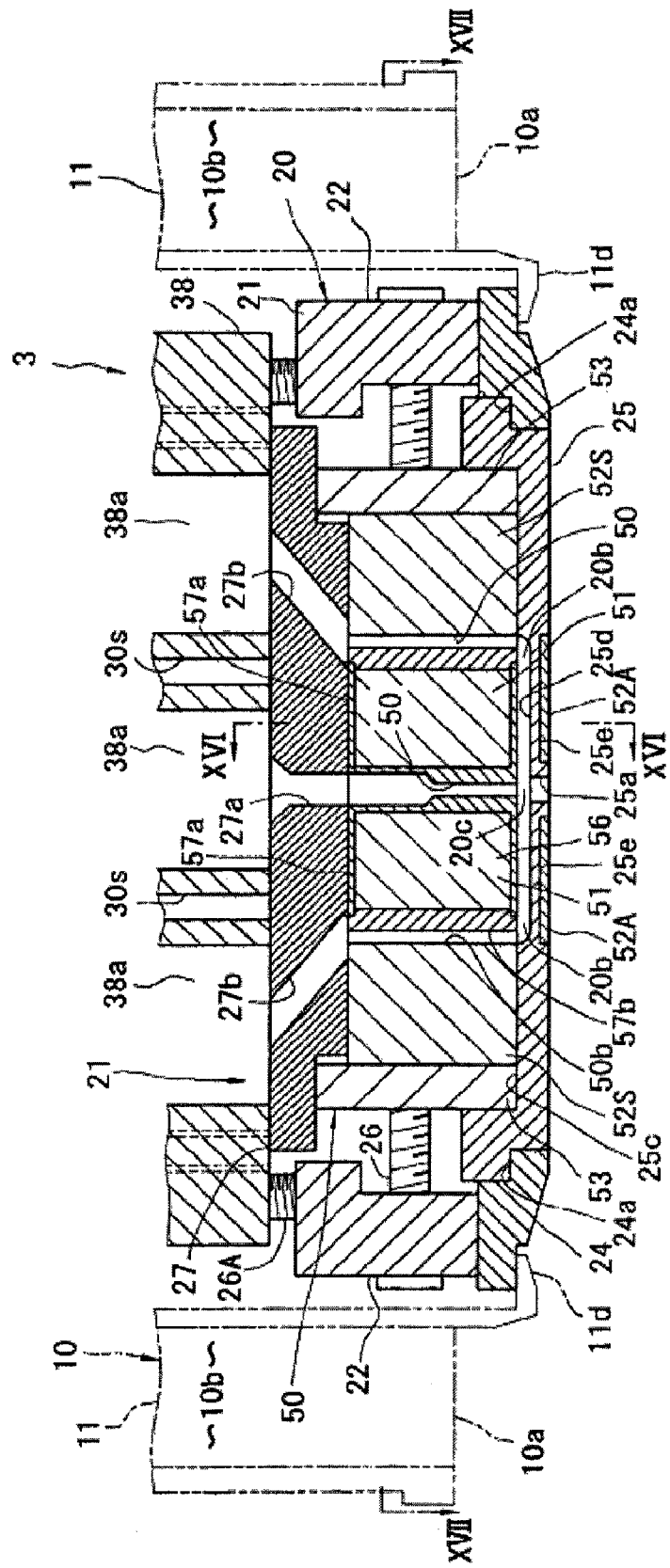
FIG. 15 is a front sectional view of a nozzle part of a processing head in a plasma film forming apparatus according to a fourth embodiment of the present invention.
Figure 17:
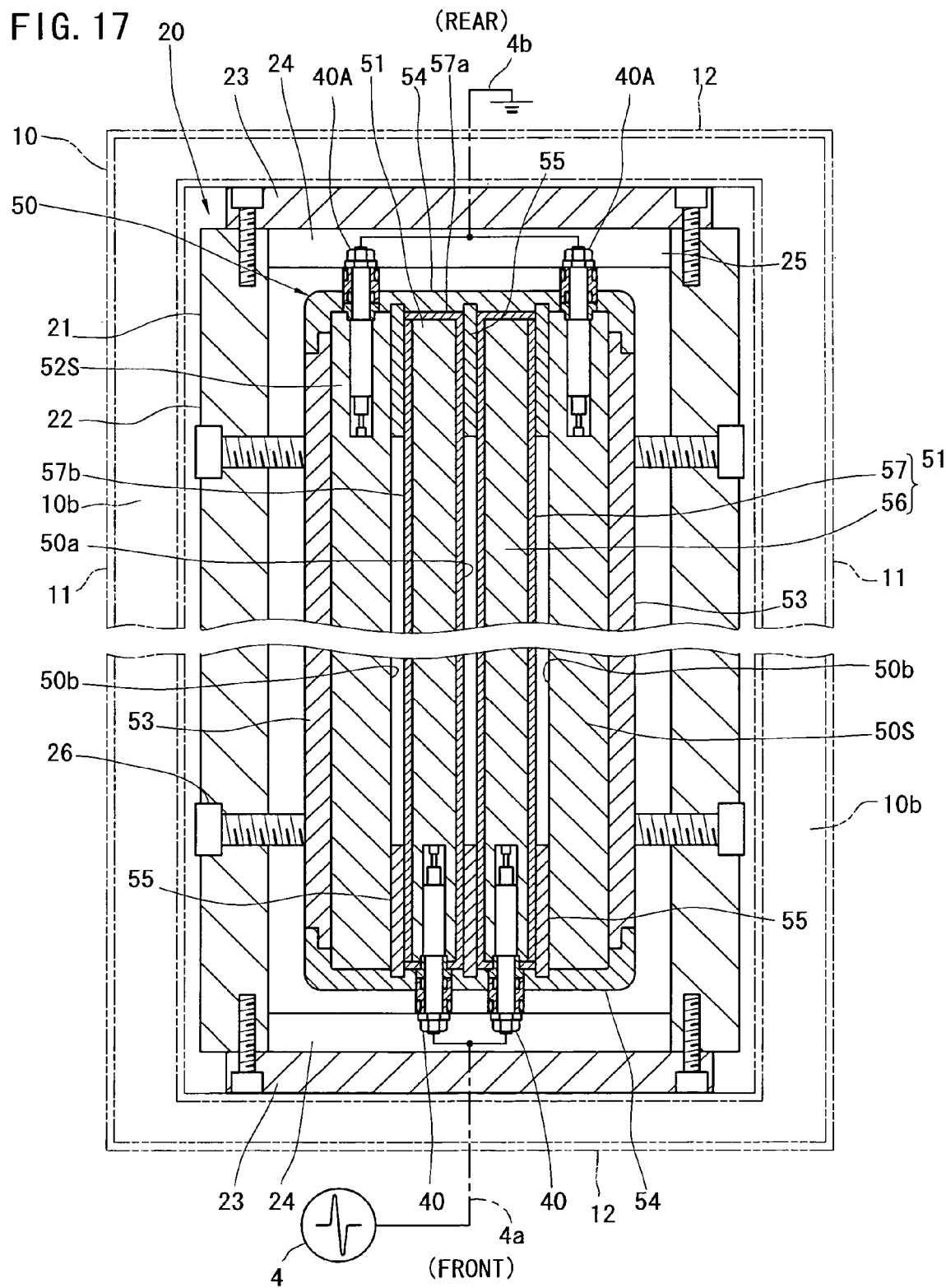
FIG. 17 is a plan sectional view of the nozzle part taken on line XVII-XVII of FIG. 15.

More specifically, as shown in FIGS. 15 and 17, in the processing head 3 of the fourth embodiment, dummy electrode spacers 52S instead of the ground electrodes 52 of the first embodiment are disposed at the locations for receiving the ground electrodes 52 of the first embodiment (FIGS. 3 and 6). The dummy electrode spacers 52S each have a substantially same configuration as the ground electrodes 52 of the first embodiment, but they are composed of an insulative member (dielectric member) such as ceramic instead of conductive metal. Accordingly, the flow passage 50b between the dummy electrode spacer 52S and the electric field impressing electrode 51 does not serve as a plasma discharge space. The excitable gas is allowed to pass through the flow passage 50b without being plasmatized.

Figure 18:
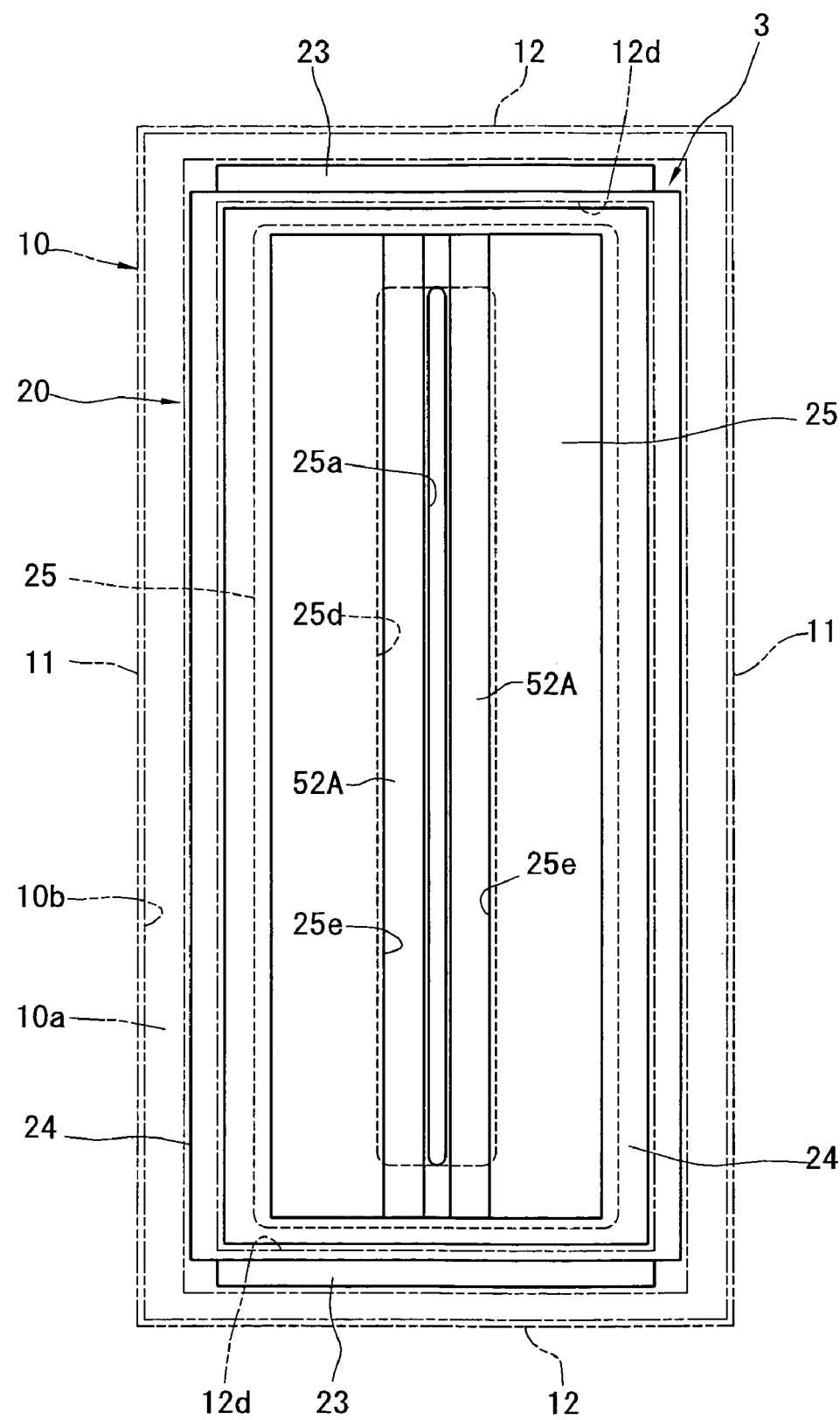
FIG. 18 is a bottom part of a processing head of the fourth embodiment.

A lower plate 25 of the fourth embodiment has not only the function as a base material opposing member or blowoff port constituting member of the processing head 3 but also the function as a retaining member for the ground electrode. That is, as shown in FIGS. 15 and 18, a pair of shallow receiving recesses 25e are formed in a lower surface of the lower plate 25 with a common blowoff passage 25a sandwiched therebetween. The recesses 25e extend in the back and forth direction (i.e., a longitudinal direction). A ground electrode (i.e., second electrode body) 52A composed of an elongate thin metal conductive plate is fitted to each receiving recess 25e. Owing to this arrangement, the ground electrodes 52A are arranged in opposing relation (i.e., in an arranging direction orthogonal to the longitudinal direction) at the side (lower side, a first plasma generating surface) which is to be faced with the base material W of the electric field impressing electrode 51. Accordingly, the communication passages (i.e., gas passages along a passage direction orthogonal to the longitudinal direction and to the arranging direction) 20b between the two electric field impressing electrodes 51 and the lower plate 25 serve as the plasma discharge spaces, respectively.

Figure 20:
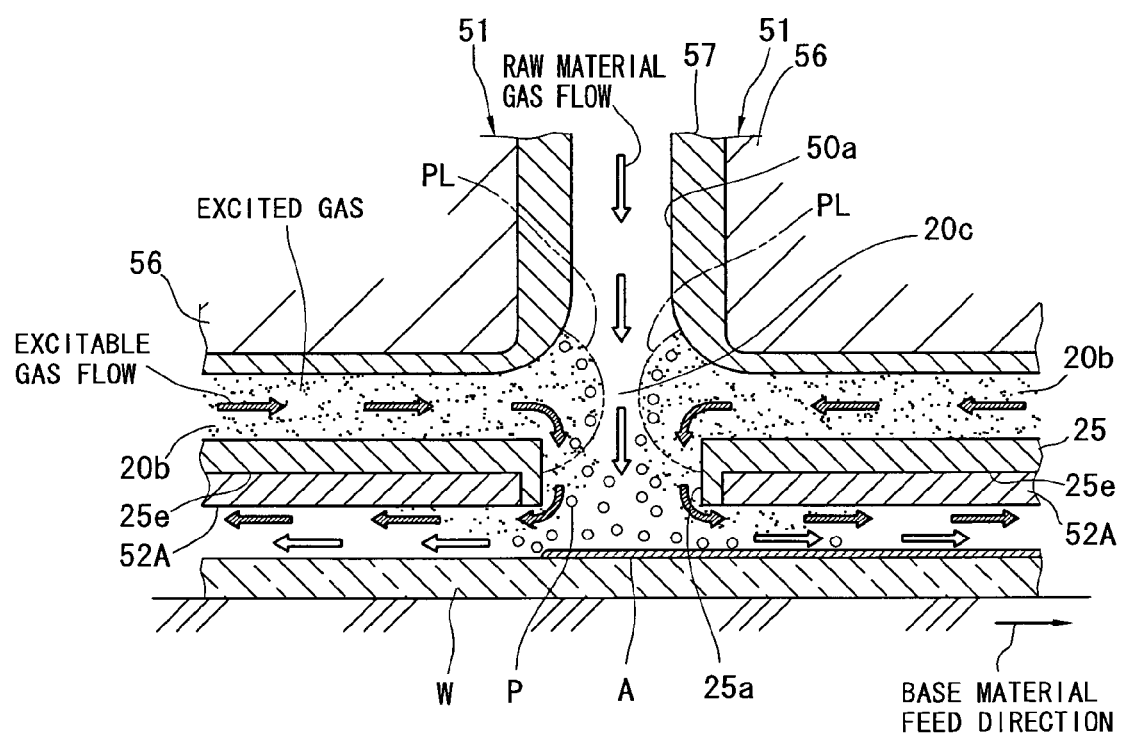
FIG. 20 is an enlarged view of a gas blowoff part of the fourth embodiment.

As shown in FIG. 20, plasma PL is disposed not only at the inside of the communication passage 20b but also overflowed to the crossing part 20c.

In the lower plate 25 composed of a dielectric member such as alumina, the part covering the upper surface of the metal-made ground electrode 52A and the part (i.e., blowoff passage 25a forming part) along the end face on the blowoff passage 25a side of the ground electrode 52A have a role acting as a solid dielectric layer of the ground electrode.

As shown in FIG. 20, the right side end face facing the common blowoff passage 25a of the left side ground electrode (metal main body) 52A is flush with the same side end face (right side end face) of the metal main body 56 of the left side electric field impressing electrode 51. The left side end face facing the common blowoff passage 25a of the right side ground electrode (metal main body) 52A is flush with the same side end face (left side end face) of the metal main body 56 of the right side electric field impressing electrode 51. The end face on the common blowoff passage 25a side of the respective ground electrodes 52A may be expanded from the same side end face of the electric field impressing electrode main body 56.

As shown in FIG. 15, the end face on the opposite side to the common blowoff passage 25a side of each ground electrode 52A is projected from a rear surface of the electric field impressing main body 56.

Figure 16:
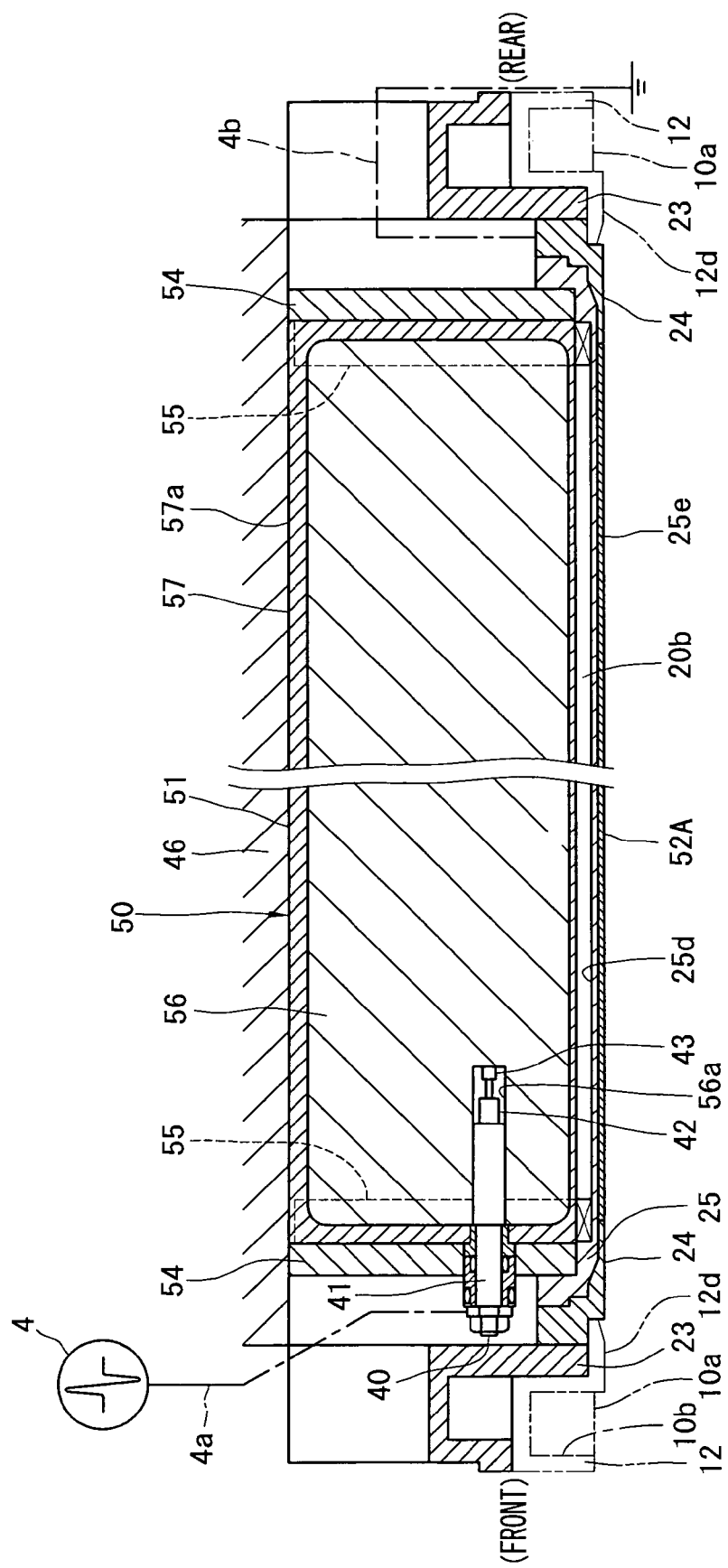
FIG. 16 is a side sectional view of the nozzle part taken on line XVI-XVI of FIG. 15.

As shown in FIG. 16, the opposite end edges in the longitudinal direction of the ground electrode 52A are in contact with the lower frame 24 composed of a metal conductor. A ground line 4b is allowed to extend from the rear end part (opposite side to the arrangement side of the power feed pin 40) of the lower frame 24 and grounded.

The ground electrode 52A may be constituted by forming a slit, which serves as the blowoff passage 25a, in a single elongate metal conductive plate.

The fourth embodiment is also different from the first embodiment in respect of the solid dielectric layer construction of the electrode 51.

Figure 19:
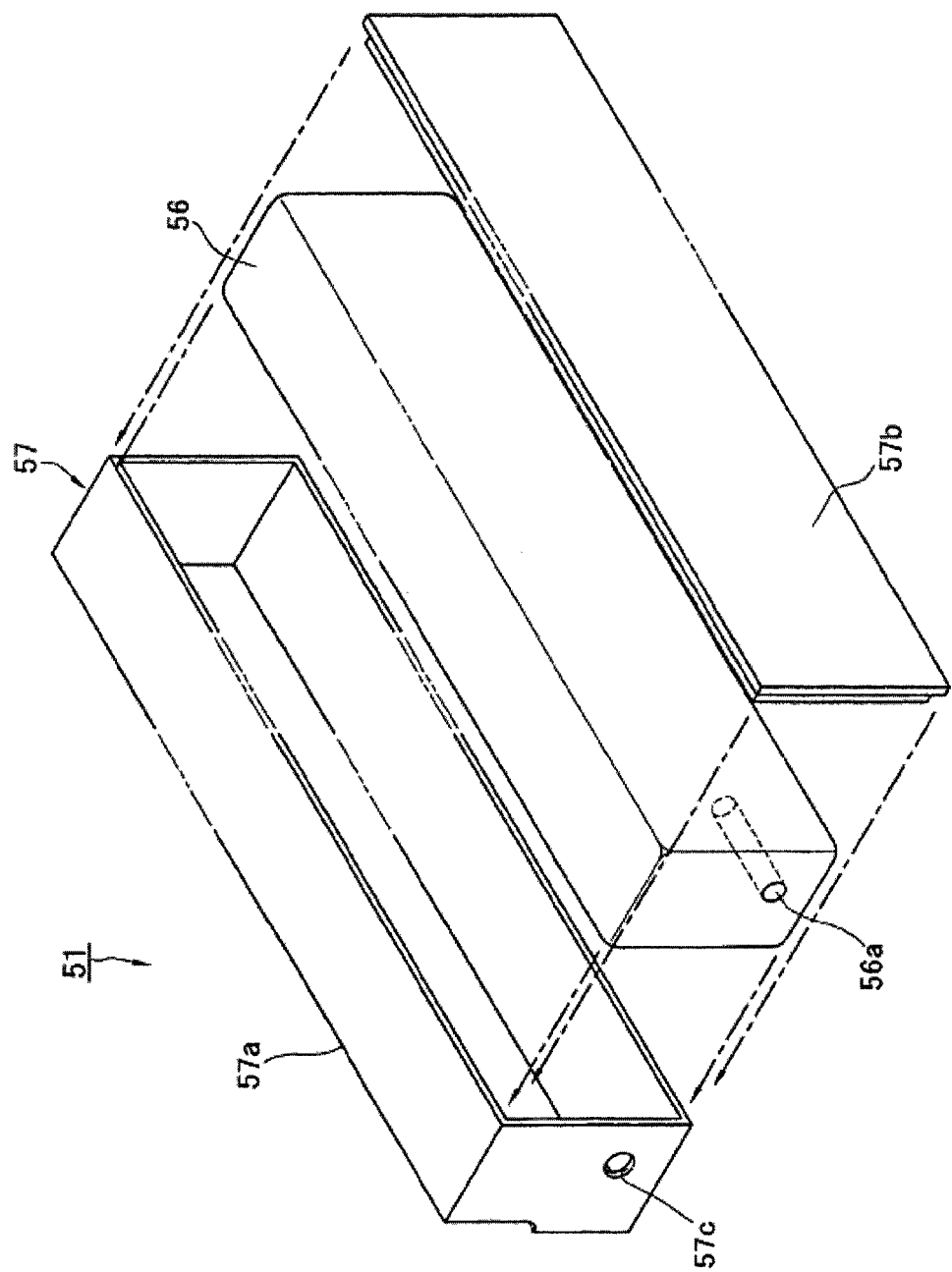
FIG. 19 is an exploded perspective view of an electric field impressing electrode of the fourth embodiment.

That is, as shown in FIG. 19, the solid dielectric layer of the electric field impressing electrode 51 in the fourth embodiment is composed of a case 57 which is separately formed from the electrode main body (i.e., first electrode body) 56 instead of a thermally sprayed film 59 (FIG. 3) which is integrally thermally sprayed on the electrode main body 56. The case 57 includes a case main body (i.e., a dielectric first case body) 57a composed of ceramic (dielectric member) such as alumina and glass, and a lid 57b composed of the same material as the case main body 57a. The case 57 extends long in the back and forth direction (i.e., the longitudinal direction).

The case body 57a includes an internal space of the same configuration as the electrode body 56. The case main body 57a is open with a U-shaped cross section to a rear surface (surface on the opposite side to the opposing side of the other electrode 51) thereof. The electrode body 56 is removably received in the internal space of the case body 57a. As shown in FIG. 15, the dielectric case body 57a is provided with a protrusive end part 571 on a side of the opening thereof (i.e., the first opening defined by upper and lower protruded end parts). The protrusive end part 571 is protruded relative to the electrode body 56. The end surface of the protrusive end part 571 of the case body 57a is blocked with the lid 57b. Owing to this arrangement, the entire surface (including the first plasma generating surface) of the electrode body 56 is covered with the solid dielectric layer composed of the case 57.

The lid 57b is in removable relation with the case main body 57a.

The case main body 57a is formed, for example, at a front side end plate thereof with a hole 57c for allowing a power feed pin 40 to be inserted therein.

As shown in FIG. 15, the right plate of the left (first) case body 57a in which the left (first) electrode body 56 is received is thin at the upper side, thick at the lower side and formed at the intermediate part with a step. The left plate of the right (second) dielectric case body 57a in which the right (second) electrode body 56 is received is thin at the upper side, thick at the lower side and formed at the intermediate part with a step. Owing to this arrangement, the gas passage 50a between the first and second case bodies 57a, 57a is wide in width at the upper side and narrow in width at the lower side.

According to the fourth embodiment, the excitable gas coming from an excitable gas source 2 is not plasmatized in the left and right flow passages 50b, 50b but it is plasmatized (excited and activated) in communication passages 20b, 20b which are located next to the passages 50b, 50b. Since the excitable gas does not contain any film forming component, a film is not adhered to the lower surface of the electrode 51 or to the upper surface (communication passage 20b forming surface) of the lower plate 25.

As shown in FIG. 20, the excitable gas plasmatized in the left and right communication passages 20b flows to a crossing part 20c. Also, the raw material gas coming from the raw material gas source 1 enters the crossing part 20c via the central flow passage 50a. Owing to this arrangement, the film raw material is reacted with the plasmatized excitable gas to generate a reaction product p which forms a film. In addition, the raw material gas also passes through the plasma PL which is overflowed to the crossing part 20c (the raw material gas flows very near the plasma discharge space). By this, the raw material gas can be plasmatized directly and more reaction products p can be obtained. As a result, film forming efficiency onto the base material W can be enhanced.

Since a ground electrode 52A (grounded conductive member) is interposed between the electric field impressing electrode 51 and the base material W, arch can be prevented from falling onto the base material W and thus, the base material W can be prevented from being damaged.

Moreover, since the end face on the side facing the common blowoff passage 25a of the ground electrode 52A is flush with the same side end face of the electric field impressing electrode main body 56, electric field can be prevented from leaking downward from the side end face of the common blowoff passage 25a of the ground electrode 52A and arc can more surely be prevented from falling onto the base material W. Thus, the processing head 3 can be brought close to the base material W and thus, the distance (working distance) between the processing head 3 and the base material W can be reduced sufficiently and thus, the working distance can be made shorter than the short deactivating distance (for example, 2 mm) of radical under normal pressure. Thus, the base material W can surely be brought into place before the reaction product p is deactivated. As a result, a film can be formed at a high-speed and reliably.

Since the electric field impressing electrode main body 56 is entirely enclosed in a case 57 as a solid dielectric layer, abnormal electric discharge can more surely be prevented from occurring.

In case a film is adhered to the case 57 of the electric field impressing electrode 51, the electrode 61 is removed from the nozzle body 21 for decomposition. At the time of decomposition, the power feed pin 40 can easily be withdrawn. Removing the lid 57b from the case main body 57a, the electrode main body 56 can easily be taken out. Since a film is adhered only to the case 57, for example, only the case 57 is replaced and the electrode main body 56 is put into a new case. By doing so, it is no more required to prepare a plurality of electrode main bodies 56. The work for putting the main body 56 into a new case is also easy.

On the other hand, with respect to the film-adhered case 57, attempt is made to remove the film from the case 57 by dipping the case 57 in a strong acid, or by any other suitable means. This makes it possible to re-use the case 57, thus resulting in elimination of the waste of materials. Since the case 57 is separately formed for each electrode 51, the work of maintenance can be conducted separately.

By composing the dummy electrode spacer 52S from a metal conductor instead of a dielectric member and grounding the same, the spacer 52S can be used as a ground electrode part together with the planar electrode 52A. By doing so, the entire second flow passages 50b, 20b can serve as a plasma discharge space. In this case, the ground electrode 52S may be of the same dielectric case receiving construction as the electric field impressing electrode 51.

In the individual blowoff construction of the second embodiment (FIG. 11), each of the four electrodes 51, 52 may be of dielectric case receiving construction.

Figure 21:
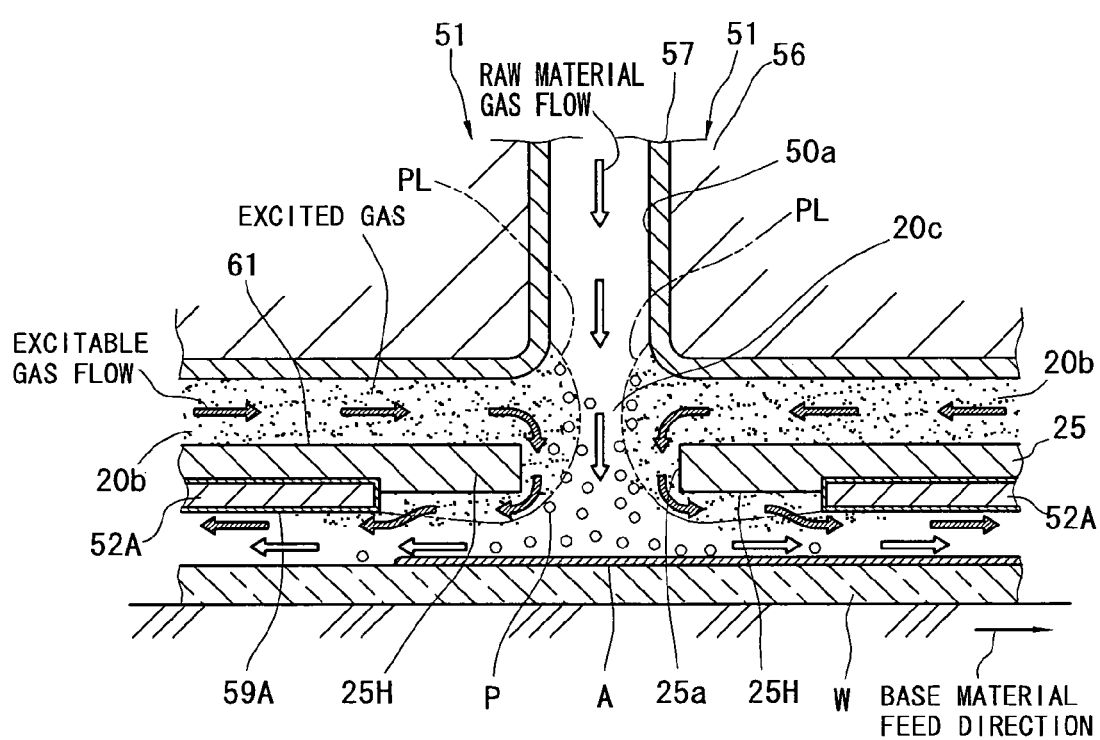
FIG. 21 is an enlarged view of a gas blowoff part showing a modified embodiment of a ground electrode structure of the fourth embodiment.

FIG. 21 shows a modified embodiment of the ground electrode construction in the fourth embodiment.

In this modified embodiment, the end face on the side facing the common blowoff passage 25a of each ground electrode (metal main body) 52A is set back from the same side end face of the metal main body 56 of the electric field impressing electrode 51. The common blowoff passage 52a forming surface of the lower plate 25 is generally flush with the same side end face of the electric field impressing main body 56. However, the present invention is not limited to this. Instead, the common blowoff passage 25a forming surface may be indented near to the end face of the ground electrode 52A. That is, the width of the common blowoff passage 25a may be increased approximately to the distance between the opposing end faces of the left and right ground electrodes 52A.

According to this modified embodiment, a lateral electric field is formed by displacement between the electric field impressing electrode main body 56 and the ground electrode main body 52A. This lateral electric field causes the plasma PL to move around the lower side of the expanding part 25H from the electrode 52A of the lower plate 25. Owing to this arrangement, further reaction of the raw material gas can be taken place at a location nearer to the base material W, and thus, a film can be formed at a higher speed and reliably.

The entire surface of the ground electrode main body 52A is coated with a thin dielectric member 59A separately by suitable means. Owing to this arrangement, abnormal electric discharge can more surely be prevented from occurring.

Figure 22:
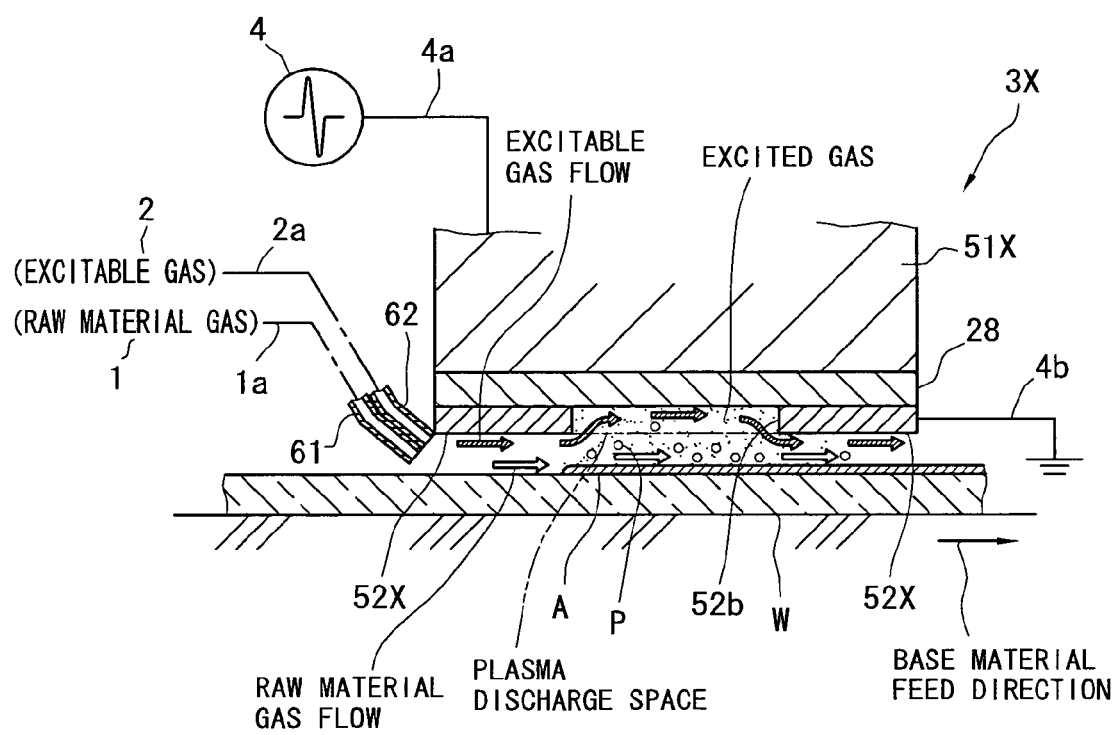
FIG. 22 is a schematic construction view of a plasma film forming apparatus according to a fifth embodiment of the present invention.

FIG. 22 shows a fifth embodiment of the present invention.

A processing head 3X of the fifth embodiment includes an electric field impressing electrode 51X composed of a metal conductor, and a ground electrode (grounded conductive member) 52X covering a lower part (side to be faced with the base material W) of the electrode 51X. A solid dielectric member 28 composed of ceramic or the like is loaded between the upper and lower electrodes 51X, 52X. The solid dielectric member 28 is a solid dielectric layer which is common to the two electrodes 51X, 52X. By this solid dielectric member 28, the two electrodes 51X, 52X are electrically isolated. A cutout part 52b is formed at a central part of the ground electrode 52X. A lower surface of the solid dielectric member 28 is exposed from this cutout part 52b.

Tip parts of two blowout nozzles 61, 62 are arranged at the side of the ground electrode 52X. A basal end part of the raw material gas blowoff nozzle 61 (first flow passage forming means) is continuous with a raw material gas source 1 through a raw material gas tube 1a, and a basal end part of the excitable gas blowoff nozzle 62 (second flow passage forming means) is continuous with an excitable gas source 2 through an excitable gas source 2 through an excitable gas tube 2a. The blowoff shafts at the tips of those blowoff nozzles 61, 62 are diagonally disposed toward a space between the ground electrode 52X and the base material W. Moreover, the excitable gas blowoff nozzle 62 is disposed at an upper side (nearer to the ground electrode 52X) of the raw material gas blowoff nozzle 61.

According to the fifth embodiment, the excitable gas is blown off into a space between the ground electrode 52X and the base material W from the upper side nozzle 62, and at the same time, the raw material gas is blown off into the same space from the lower side nozzle 61. At that time, a generally laminar flow is formed in which the excitable gas is one-sided to the upper side and the raw material gas is one-sided to the lower side. The upper side excitable gas flows into the cutout part 52b.

On the other hand, a lateral electric field is taken place in the cutout part 52b by pulse voltage impression of the pulse power source 4. By this, the inside of the cutout part 52b serves as a plasma discharge space, and the excitable gas flown into the cutout part 52b is plasmatized (excited and activated). The raw material gas contacts this plasmatized excitable gas. Or the raw material gas flows very near the plasma discharge space 52b. By this, the raw material gas can be reacted right near the base material W, and a film A can be formed at a high speed and reliably. Since the excitable gas flow comes nearer to the ground electrode 52X side than the raw material gas does even after the excitable gas passes through the plasma discharge space 52b, adhesion of a film to the lower surface of the ground electrode 52X, i.e., the lower surface of the processing head 3X can be prevented or restrained.

Since the ground electrode 52X (grounded conductive member) is interposed between the electric field impressing electrode 51X and the base material W, arc can be prevented from falling onto the base material W, and thus, the base material W can be prevented from being damaged.

Figure 23:
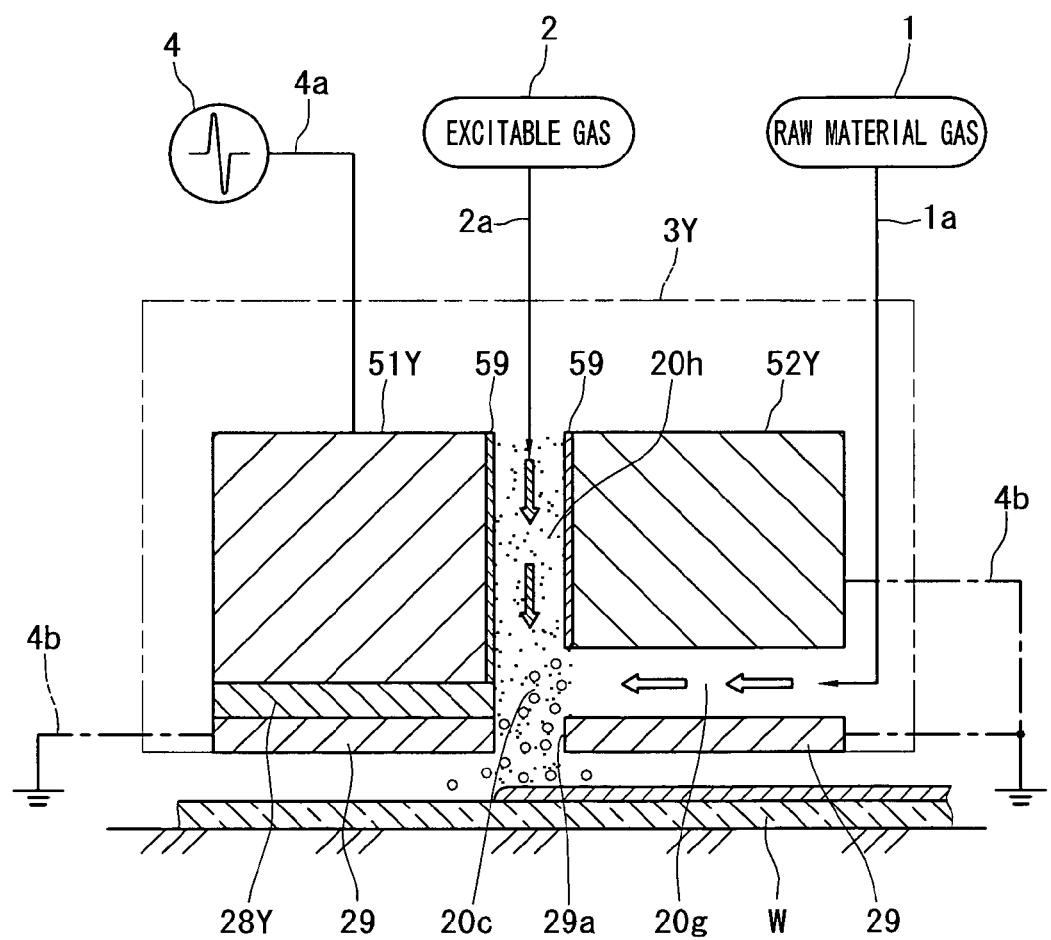
FIG. 23 is a schematic structure view of a plasma film forming apparatus according to a sixth embodiment of the present invention.

FIG. 23 shows a sixth embodiment of the present invention.

In a processing head 3Y of the sixth embodiment, a paired electric field impressing electrodes 51Y and ground electrodes 52Y are distantly arranged leftward and rightward in opposing relation. A second flow passage 20h serving as a plasma discharge space is vertically formed between those electrodes 51Y, 52Y. A tube 2a extending from the excitable gas tube 2 is connected to the upper end part (upstream end) of the second flow passage 20h.

A conductive member 29 composed of a metal plate is disposed at the lower end part of the processing head 3Y. The conductive member 29 is grounded through a ground line 4b. The conductive member 29 covers a lower side (side to be faced with the base material W) of the electric field impressing electrode 51Y. An insulative member 28Y for electrically isolating the electric field impressing electrode 51Y and the conductive member 29 is loaded between the electrode 51Y and the member 29.

A gap 20g serving as a first flow passage is horizontally formed between the ground electrode 52Y and the conductive member 29. A tube 1a extending from the raw material gas source 1 is connected to a right end part (upstream end) of the first flow passage 20g. A left end part (downstream end) of the first flow passage 20g is crossed with a lower end part (downstream end) of the second flow passage 20h. The conductive member 29 is formed with a blowoff passage 29a extending from the crossing part 20c between the first and second flow passages 20g, 20h right thereunder. The blowoff passage 29a serves as a common blowoff passage for the raw material gas and the excitable gas.

Also in the sixth embodiment, adhesion of a film to the plasma discharge space forming surfaces of the electrode 51Y, 52Y, etc. can be prevented from occurring, and arc can be prevented from falling onto the base material W from the electric field impressing electrode 51Y.

Figure 24:
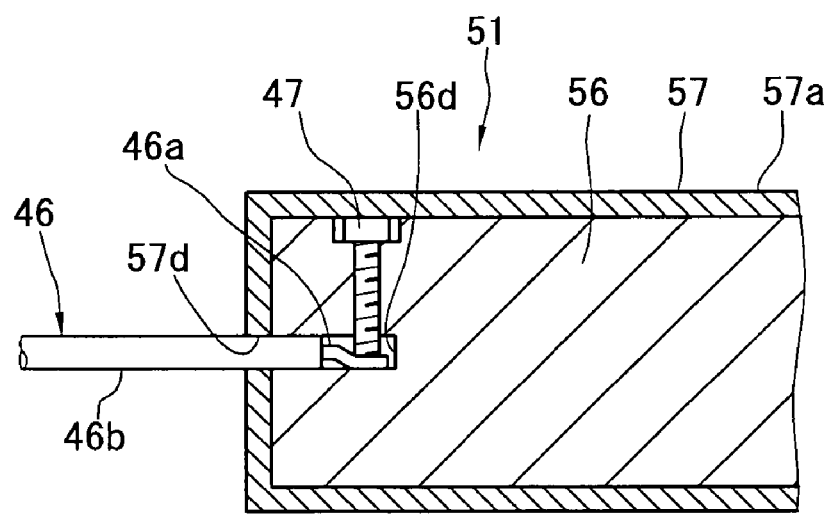
FIG. 24 is a sectional view showing a modified embodiment of a connection structure of an electric field impressing electrode and an electricity feed line.

FIG. 24 shows a modified embodiment of an electrode power feeding/grounding construction. A covered conductor 46 serving as a power feed line 4a or ground line 4b is constituted by covering a conductive wire 46a with an insulative tube 46b. The coated conductor 46 is inserted in a hole 56d of an electrode main body 56 through a hole 57d of a dielectric case 57.

In the wire 46a of the covered conductor 46, only the terminal end part located at the innermost side of the hole 56d is exposed from the insulative tube 46b, and the part located on this side in the hole 56d is covered with an insulative tube 46b. Of course, the wire 46a is covered at a part thereof located in the hole 57d of the dielectric case 57 and at a part thereof located outside the case 57 with the insulative tube 46b.

A screw (bolt) 47 is screwed into the electrode main body 56 in such a manner as to be generally orthogonal to the hole 57d. By this screw 47, the exposed tip part of the wire 46a is pressed against the inner peripheral surface at the innermost end part of the hole 57d.

According to this construction, abnormal electric discharge from the conductor 46 can surely be prevented from occurring. Moreover, the terminal of the conductor 46 can surely be fixed to the electrode main body 56, so that the former can surely be electrically conducted with the latter. Moreover, at the time of maintenance such as replacement of the dielectric case 57, the conductor 46 can easily be removed from the electrode 51 by loosening the screw 47.

Figure 25:
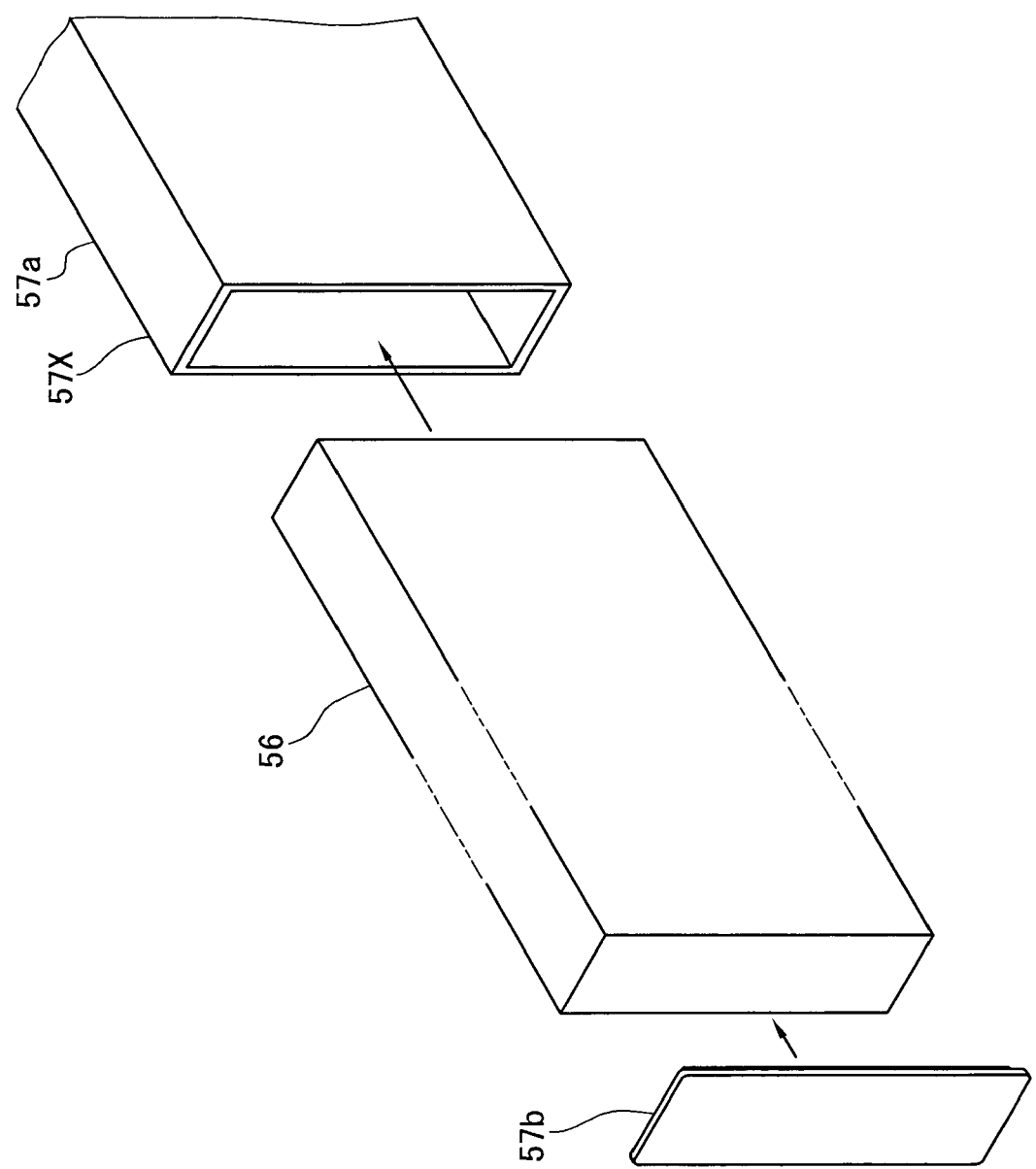
FIG. 25 is an exploded perspective view showing a modified embodiment of an induction case of an electrode.

FIG. 25 shows a modified embodiment of the dielectric case serving as a solid dielectric layer of an electrode.

In the dielectric case 57X of the modified embodiment, an opening of the case main body 57a is formed on one end face in the longitudinal direction, instead of the rear surface of the embodiment of FIG. 19. A metal main body 56 of the electrode is inserted through this end face opening. A lid 57b of the case 57X covers up the end face opening.

Figure 26:
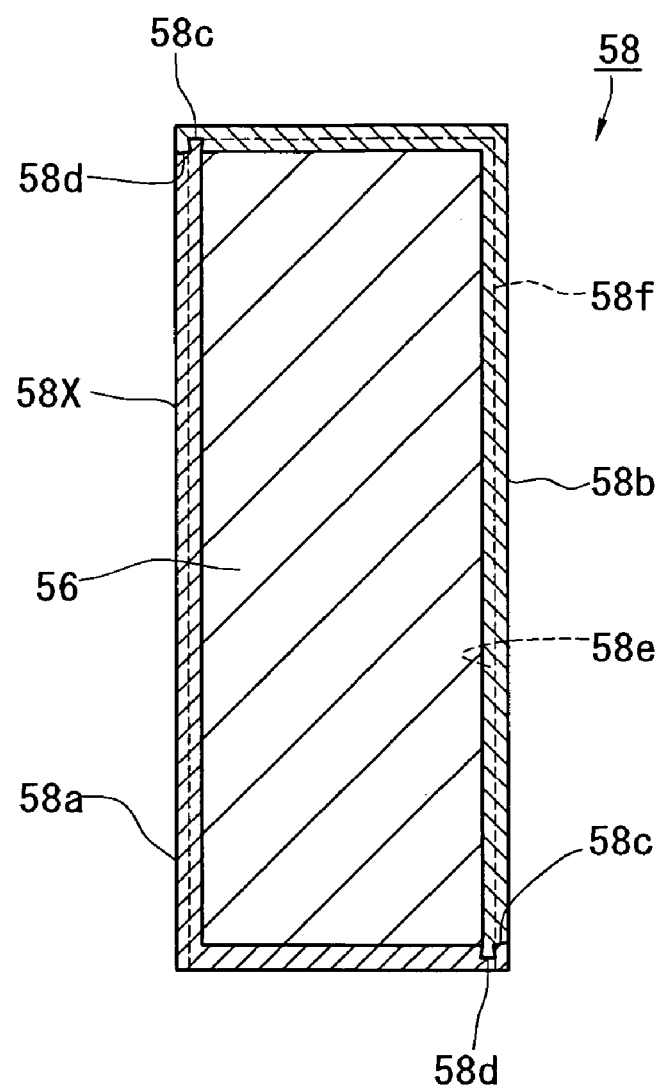
FIG. 26 is a front sectional view showing another modified embodiment of an induction case.
Figure 27:
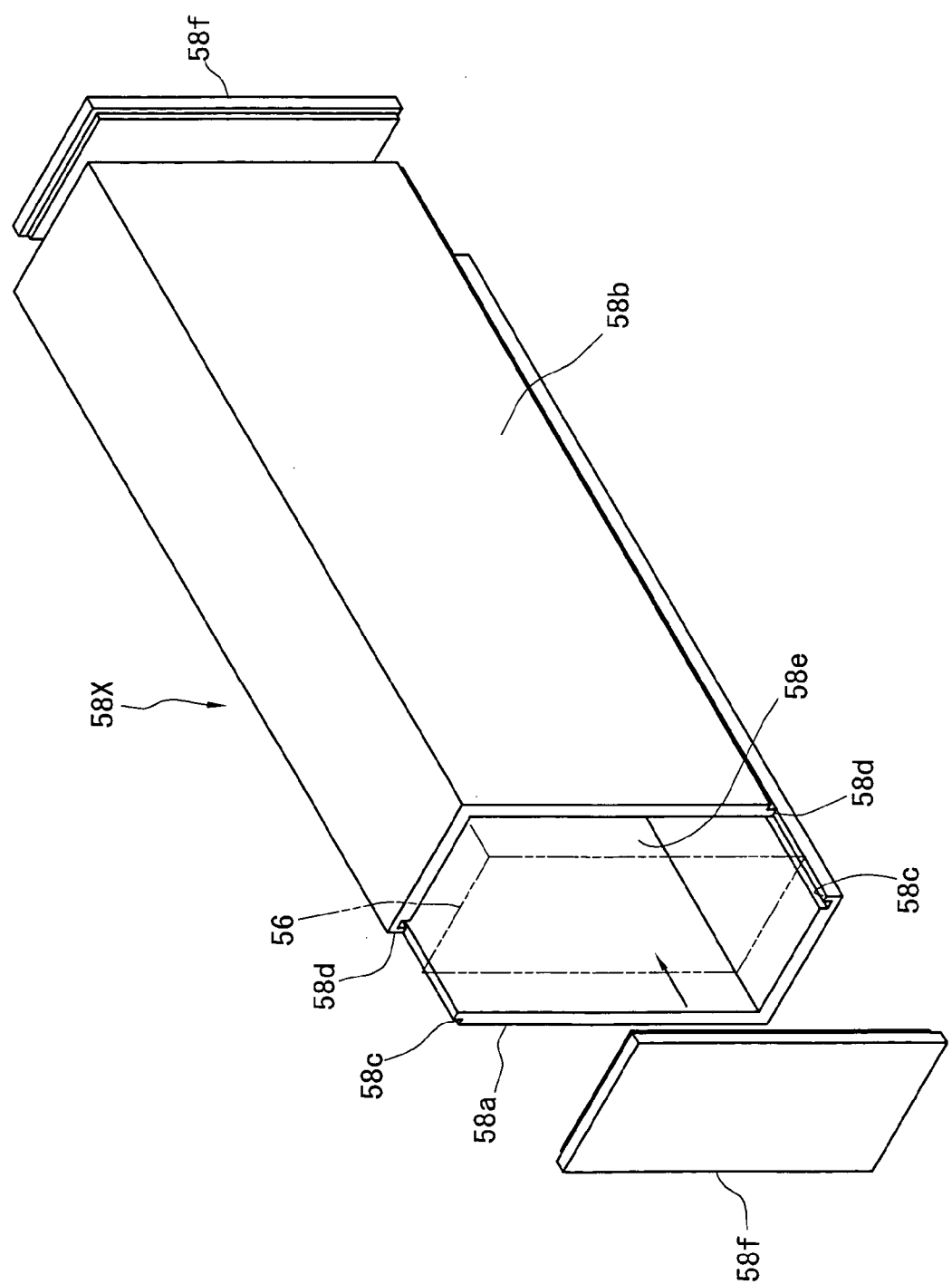
FIG. 27 is an exploded perspective view of the induction case of FIG. 26.

FIGS. 26 and 27 show another modified embodiment of a dielectric case. A main body 58X of this dielectric case 58 is constituted by combining a pair of pieces 58a, 58b each having an L-shaped configuration in section. Those pieces 58a, 58b are formed at end edges thereof with pawls 58c, 58d, respectively. By fitting the pawls 58c, 58d with respect to each other, a long square-shaped case main body 58X is formed. This case main body 58X is formed at opposite end parts thereof in the longitudinal direction with openings 58e, respectively. A lid 58f is removably disposed at each of those openings 58e.

Figure 28:
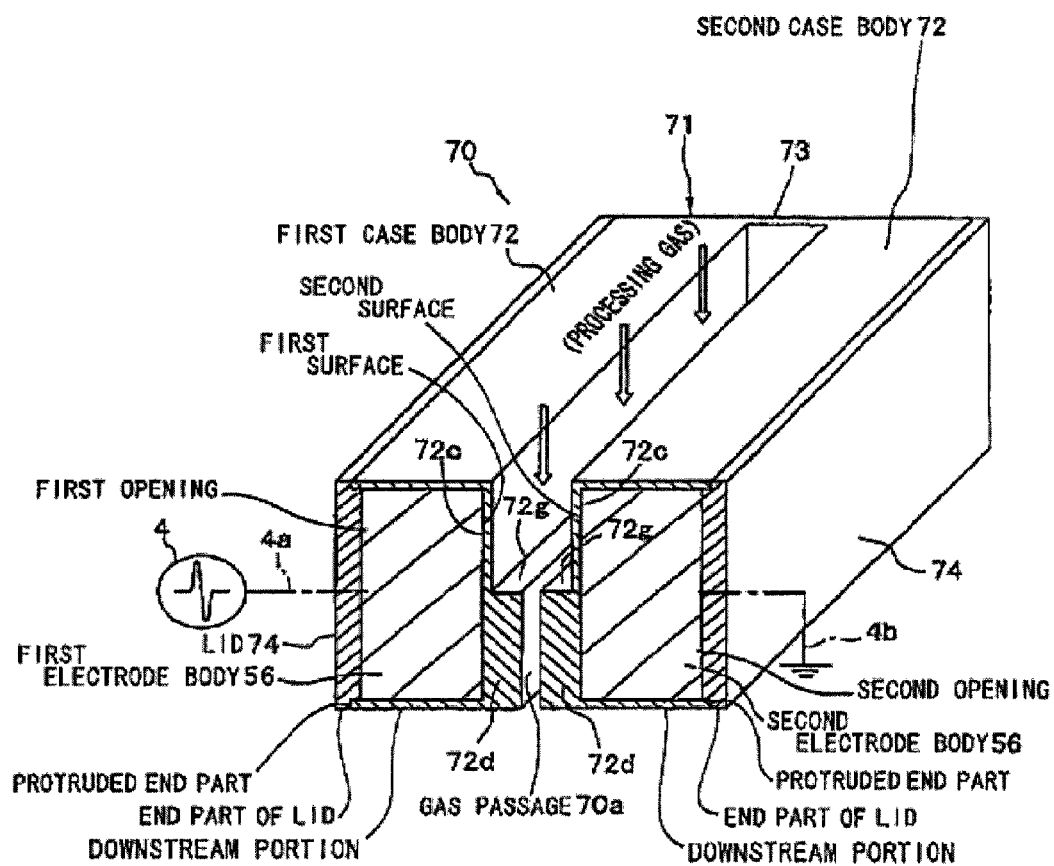
FIG. 28 is a perspective view showing a modified embodiment of an electrode structure with an induction case.

FIG. 28 shows a further modified embodiment of an dielectric case. In this modified embodiment, two (a plurality of) electrode dielectric cases are integrally connected with each other. In other word, two (a plurality of) electrode metal main bodies 56 are received in a single common dielectric case 70.

The common dielectric case 70 comprises a single case main body 71 composed of a dielectric member, and two lids 74 composed of a dielectric member. The case main body 71 includes two case main body parts 72 (i.e., dielectric first case body 72 and dielectric second case body 72) horizontally extending long in mutually parallel relation, and a connection part 73 for interconnecting the opposite end parts (only the innermost side of the paper surface is shown in FIG. 28) of those main body parts 72. The rear surfaces on the opposite side to the opposing sides of those main body parts 72 are open with U-shaped cross section. After the electrode metal main bodies 56 (i.e., first electrode body 56 and second electrode body 56) are inserted in the main body parts 72 through those rear surface openings (i.e., the first opening defined by upper and lower protruded end parts of first case body 72, and the second opening defined by upper and lower protruded end parts of second case body 72), the rear surface openings are covered up by the lids 74, respectively.

In this embodiment, one of the two electrodes is an electric field impressing electrode connected to a power source 4, and the other is a grounded ground electrode. However, the present invention is not limited to this. Instead, they may be electrodes having the same polarities.

A flow passage 70a (in this embodiment, a second flow passage serving as a plasma discharge space) is formed between two main body parts 72 of the common dielectric case 70. The flow passage 70a extends long in the same direction as the main body part 72. After being uniformized in the longitudinal direction, the processing gas (excitation gas in this embodiment) is guided into the upper end opening (upstream end) of the flow passage 70a. The lower end opening of the flow passage 70a serves as a blowoff port.

The dielectric case 70 constitutes a second flow passage forming means. The first flow passage forming means is not shown (the same is true also in FIGS. 29 through 33).

The upper side parts 72c of the opposing side plates (i.e., solid dielectric layer on the opposing side of two electrodes) in two main body parts 72 are relatively thin, and the lower side parts 72d are relatively thick. A step 72g is formed at an intermediate height. Owing to this arrangement, the upper side of the flow passage 70a is large in width and the lower side is small in width as in the case with first embodiment (FIG. 3).

The flow passage 70a is made to serve as a plasma discharge space by electric field impression of the pulse power source 4. This plasma becomes relatively strong at the upper side (upstream side) of the step 72g and relatively weak at the lower side (downstream side) due to difference in thickness between the upper and lower plate parts 72c, 72d serving as the solid dielectric layer. As apparent from the foregoing description, the state of plasma can be varied by changing the thickness of the dielectric case.

The upper and lower plate parts 72c, 72d serving as the solid dielectric layer may be reversed in thickness in according with the purpose.

In the embodiment of FIG. 28, since the dielectric cases of the two electrodes are integrally formed, the number of parts can be reduced. Moreover, the labor and time required for assembling the two electrodes can be eliminated, relative positioning of the electrodes can be made easily and correctly, and the shape dimension of the flow passage 70 can be enhanced in precision.

The dielectric case construction itself disclosed in the fourth embodiment and in other various modified embodiments can be applied not only to the electrodes for the use of a plasma film forming apparatus but also to those electrodes for the use of other plasma surface processing apparatus such as cleaning and etching. In case of film formation, the above-mentioned construction can also be applied to a conventional electrodes in which a mixed gas of a raw material gas and an excitable gas (for example, a mixed gas of silane and hydrogen) is guided to the plasma discharge space (the same is true to the modified embodiments that will be described hereinafter). In case, for example, the dielectric case 70 in the embodiment of FIG. 28 is applied to the conventional film forming system, generation of radical species of hydrogen is restrained at the upper side part of the flow passage 70a, and the radical species of silane can be relatively increased. And the radical species of hydrogen can be increased at the lower side part of the flow passage 70a. In this way, the manner for generating the radical species can be changed in accordance with the flow, and thus, the surface processing recipe can be enriched.

Figure 29:
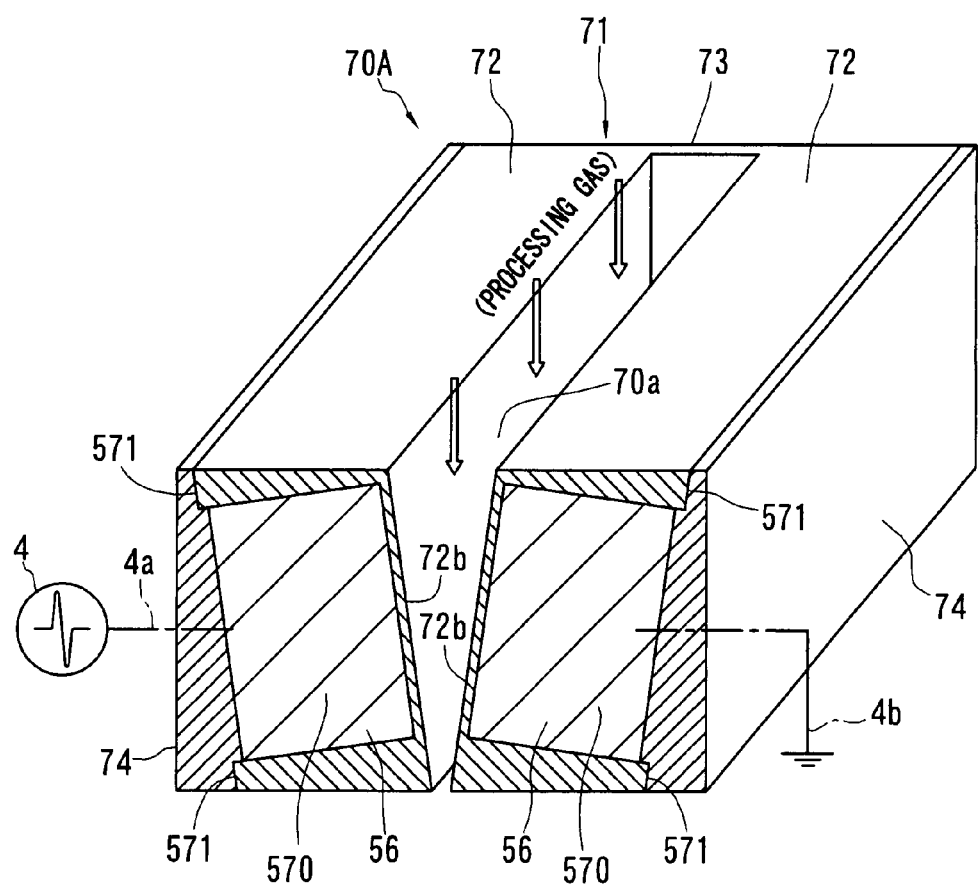
FIG. 29 is a perspective view showing another modified embodiment of an electrode structure of an induction case.

FIG. 29 shows a still further modified embodiment of a dielectric case. In this dielectric case 70A, the opposing plates 72b of two case main body parts 72 (i.e., dielectric first case body 72 and dielectric second case body 72) are slanted so as to be approached to each other toward downward direction. Owing to this arrangement, the sectional area of the flow passage (i.e., the gas passage) 70a is sequentially reduced toward downward direction. The internal space of each case main body 72 is slanted and the opposing surfaces of the two electrode main bodies 56 (i.e., first electrode body 56 and second electrode body 56) are slanted so as to be approached to each other toward downward direction. Owing to this arrangement, the flow rate of the processing gas in the flow passage 70a and the state of plasma can sequentially be changed along the flowing direction (i.e., the gas passage direction), and the surface processing recipe can be enriched. It may be constructed such that the flow passage 70a is gradually dilated along the flowing direction, depending on purposes.

Figure 31:
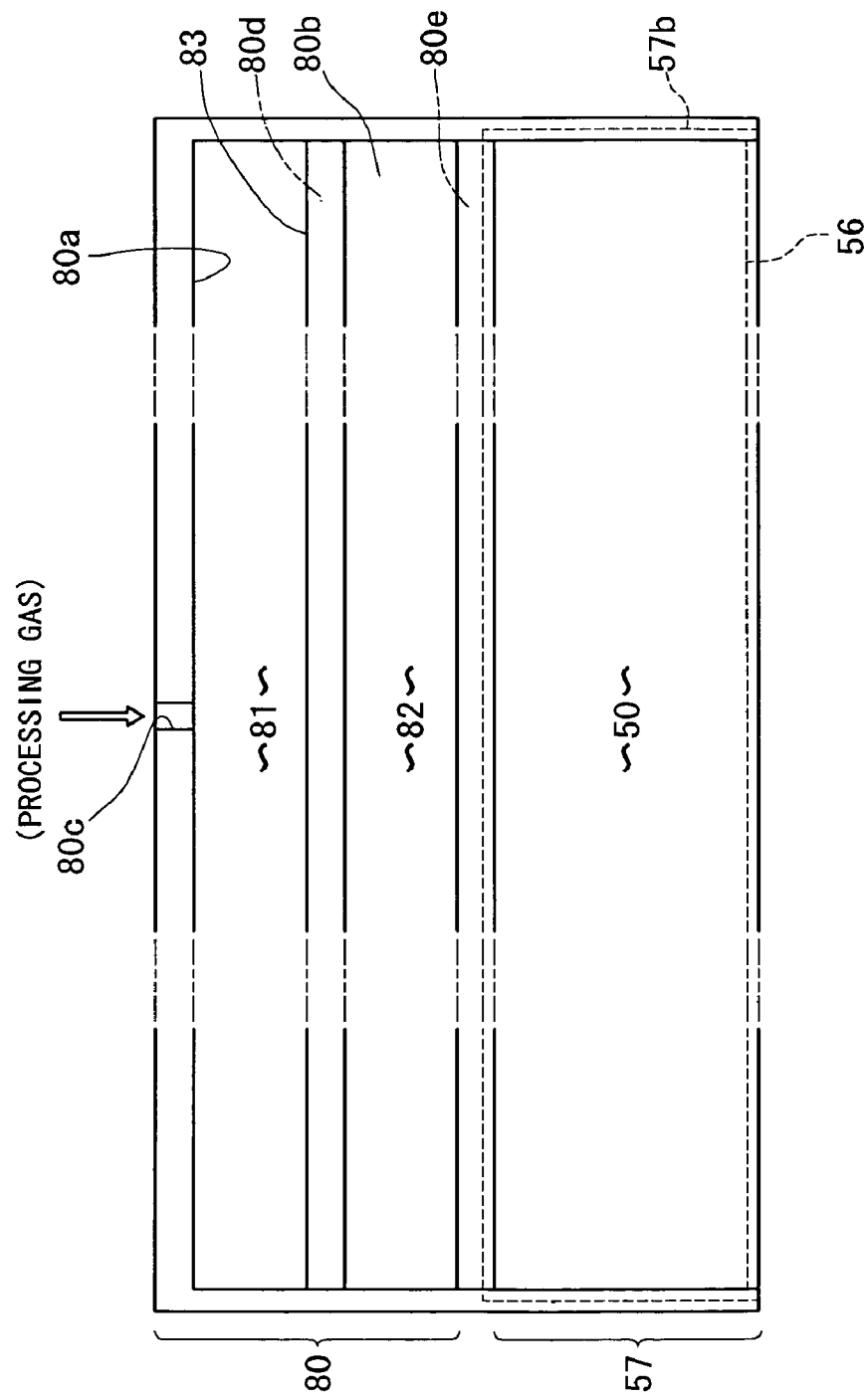
FIG. 31 is a side view of a gas uniformizing part integrated induction case taken on line XXXI-XXXI of FIG. 30.

FIGS. 30 and 31 show a yet further modified embodiment of a dielectric case. The dielectric cases 57 for the left and right electrodes include a case main body 57a for receiving therein the electrode main body 56, and a lid 57b for blocking the rear surface opening as in the case with the fourth embodiment. The dielectric case 57 extends long in the back and forth direction so as to match with the long electrode main body 56 (FIG. 31).

Each dielectric case main body 57a is integrally provided at an upper side thereof with a gas uniformizing part 80. A lower plate of the gas uniformizing part 80 and an upper plate of the case main body 57a are composed of a common plate 84. The gas uniformizing part 80 is formed with two upper and lower half-split expansion chambers 80a, 80b partitioned with a horizontal partition plate 83.

The pair of left and right dielectric cases 57 with a gas uniformizing part have a mutually reversal shape. The opposing edges of the dielectric cases 57 with a gas uniformizing part are abutted with each other. Owing to this arrangement, the upper side half-split expansion chambers 80a are combined with each other to form the first expansion chamber 81, and the lower side half-split expansion chambers 80b are combined with each other to form the second expansion chamber 82. Those expansion chambers 81, 82 extend generally over the entire length of the gas uniformizing part-attached dielectric case 57 and thus, generally over the entire length of the electrode and also enlarged in the width direction. Thus, the expansion chambers 81, 82 each have a sufficiently large capacity. Although the upper and lower expansion chambers 81, 82 are same in capacity, they may be different.

The opposing edges of the upper plates of the pair of gas uniformizing parts 80 are abutted with each other, and provided at central parts thereof in the longitudinal direction with processing gas (excitable gas in this embodiment) receiving ports 80c.

A narrow gap-like pressure loss forming passage 80d is formed between the pair of partition plates 83. The pressure loss forming passage 80d extend generally over the entire length of the gas uniformizing part-attached dielectric case 57. The upper and lower expansion chambers 81, 82 are communicated with each other through the pressure loss forming passage 80d.

A narrow gas-like introduction passage 80e is formed between the opposing edges of a pair of plates 84. The introduction passage 80e extends generally over the entire length of the gas uniformizing part-attached dielectric case 57. The second expansion chamber 82 is communicated with the flow passage 50b between a pair of case main bodies 57a through the introduction passage 80e. The "gas uniformizing passage" is constituted by the expansion chambers 81, 82 and the passages 80d, 80e.

After introduced into the first expansion chamber 81 from the upper end receiving port 80c and expanded, the processing gas is throttled at the pressure loss forming passage 80d to generate a pressure loss and then introduced into the second expansion chamber 82 and expanded again. Moreover, the processing gas is throttled again to generate a pressure loss. In this way, by applying expansion and throttling alternately, the processing gas can be introduced into the interelectrode flow passage 50a after it is sufficiently uniformized in the longitudinal direction. By this, a uniform processing can be conducted.

According to the gas uniformizing part integral type dielectric case construction, the number of parts can be reduced.

The gas uniformizing part expansion chamber is not limited to two stages of the first and second chambers 81, 82 but three or more stages may be provided. The pressure loss forming passage 80d which connects the expansion chambers to each other may be formed in a plurality of spot-like holes, instead of the above-mentioned lit-like holes, arranged in the longitudinal direction.

Figure 32:
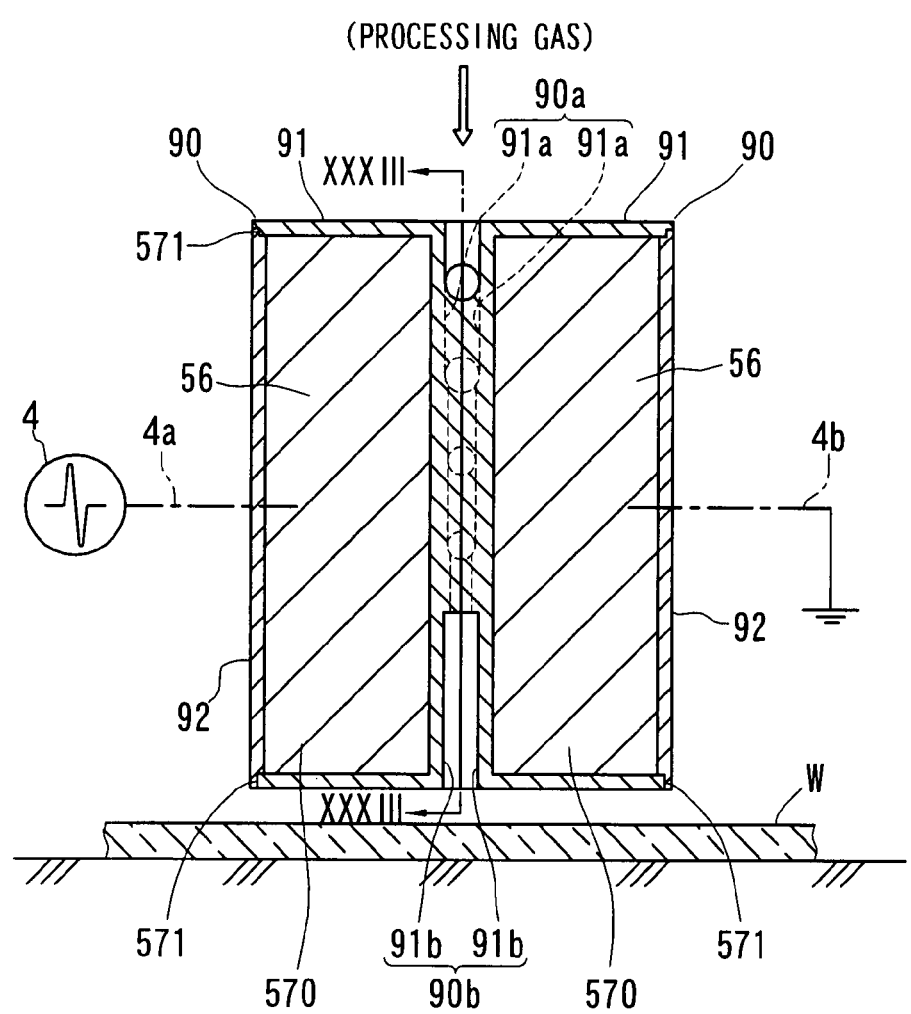
FIG. 32 is a front sectional view of an electrode structure having an induction case with a tree-type passage.
Figure 33:
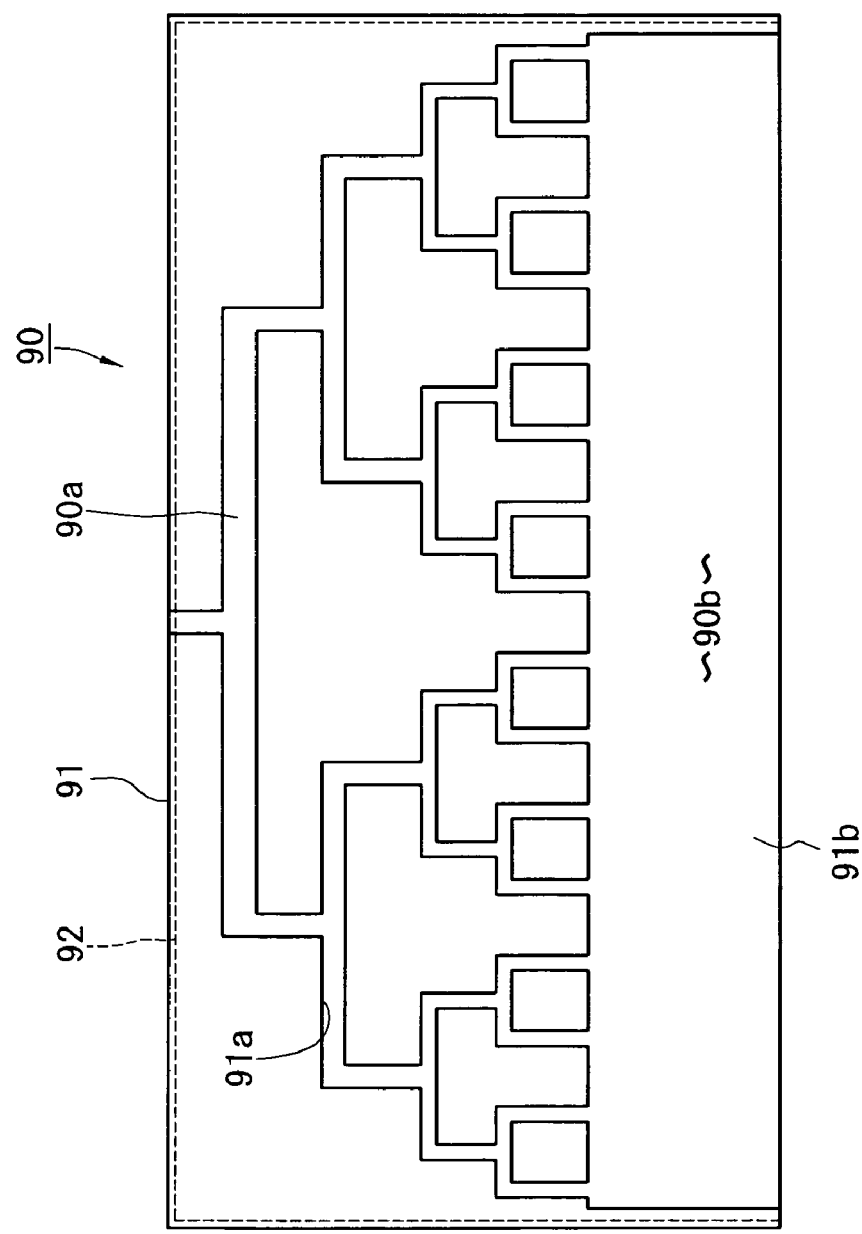
FIG. 33 is a side view of the induction case with a tree-type passage taken on line XXXIII-XXXIII of FIG. 32.

FIGS. 32 and 33 show a yet further modified embodiment of a dielectric case.

A dielectric case 90 for each electrode includes a case main body 91 for receiving therein an electrode main body 56 and a lid 92 for blocking the rear surface opening as in the case with the fourth embodiment. As shown in FIG. 33, the dielectric case 90 extends long in the back and forth direction so as to match with the long electrode main body 56.

The upper side part of the opposing surface with respect to the other electrode in each of the left and right case main bodies 91 is formed with a shallow tree-like groove 91a, and the lower side part is formed with a shallow recess 91b. The tree-like groove 91a is branched over plural stages so as to be spread in the longitudinal direction toward downward direction from the central part of the upper end edge of the case main body 91. The recess 91b is continuous with the plural branch grooves at the terminal of the tree-like groove 91a. The recess 91 extends generally over the entire length of the case main body 91 and is continuous with a lower end part of the case main body 91.

The left and right dielectric cases 90 are abutted with each other in a palms-put-together manner. Owing to this arrangement, the left and right tree-like grooves 91a are jointed with each other to form a tree-like gas dispersing passage (gas uniformizing passage) 90a, and the recesses 91b are jointed to form a gas blowoff passage 90b. The passage 90b extends generally over the entire length of the case 90 and thus the electrode main body 56. The passage 90b is continuous with all the branch passages at the tail end of the tree-like gas dispersing passage 90a and open downward. Almost entire passages 90a, 90b are interposed between a pair of electrode main bodies 56.

The processing gas (excitable gas in this embodiment) introduced into the upper end opening of the tree-like passage 90a is sequentially shunted in the longitudinal direction through the tree-like passage 90a and thereafter, guided into the passage 90b. At the same time, the electric field is impressed between a pair of electrodes by a power source 4. By this, the processing gas is plasmatized not only in the shunting process of the tree-like passage 90a but also in the passing process of the blowoff passage 90b. Then, the processing gas is blown off through the lower end opening of the blowoff passage 90b. The tree-like passage 90a and the blowoff passage 90b constitute the "plasma discharge space of the second flow passage".

Figure 34:
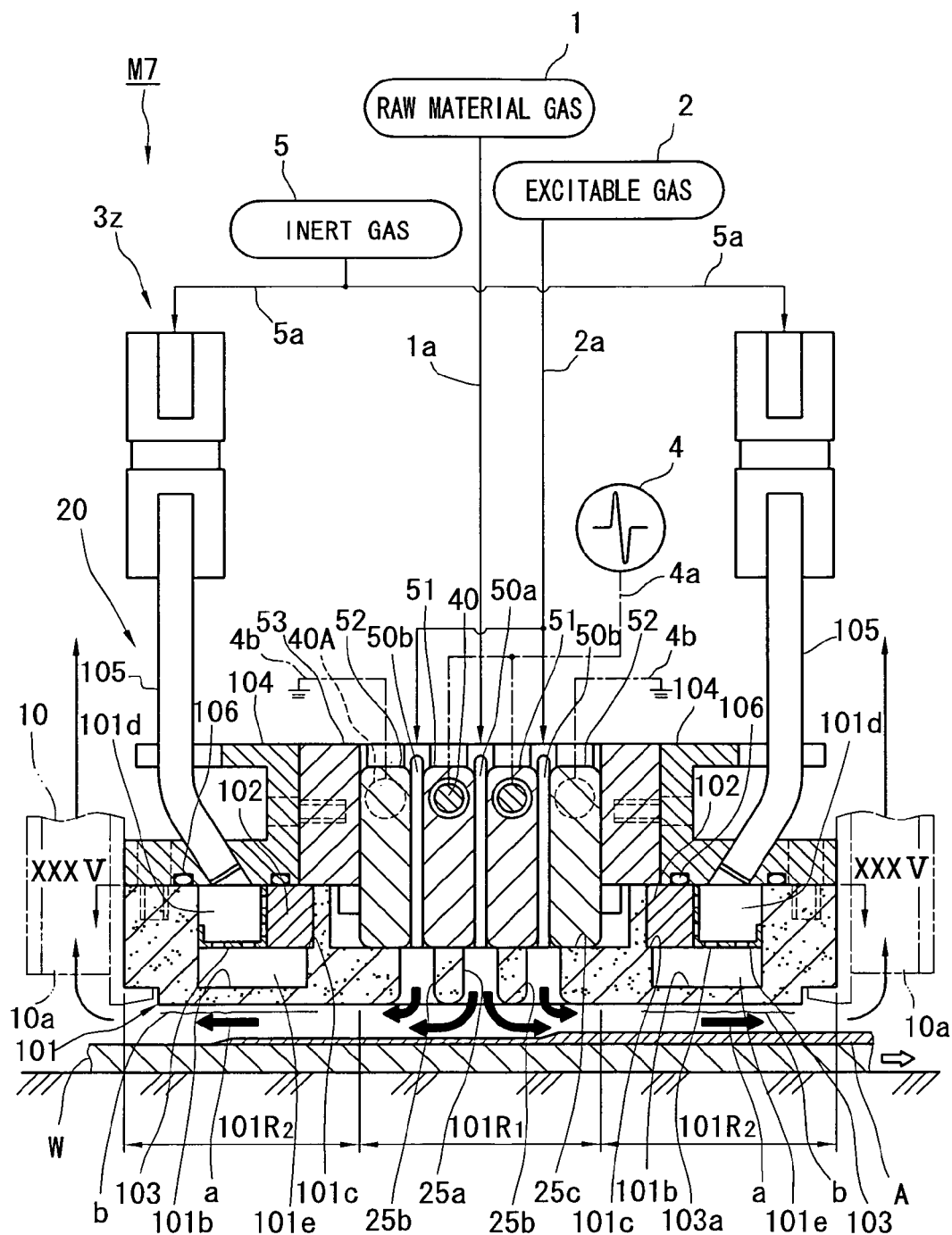
FIG. 34 is a view showing a schematic construction of a normal pressure plasma film forming apparatus according to a seventh embodiment of the present invention and a front section of a processing head of the apparatus.

FIG. 34 shows a normal pressure plasma film forming apparatus M7 according to a seventh embodiment of the present invention.

A processing head 3Z of the normal pressure plasma film forming apparatus M7 is constituted by vertically overlapping a gas uniformizing part (not shown) and a nozzle part 20 as in the case with the first embodiment.

The lower end part of the nozzle part 20 is provided with a lower plate 101 (base material opposing member) which is to be faced with a base material W.

Figure 35:
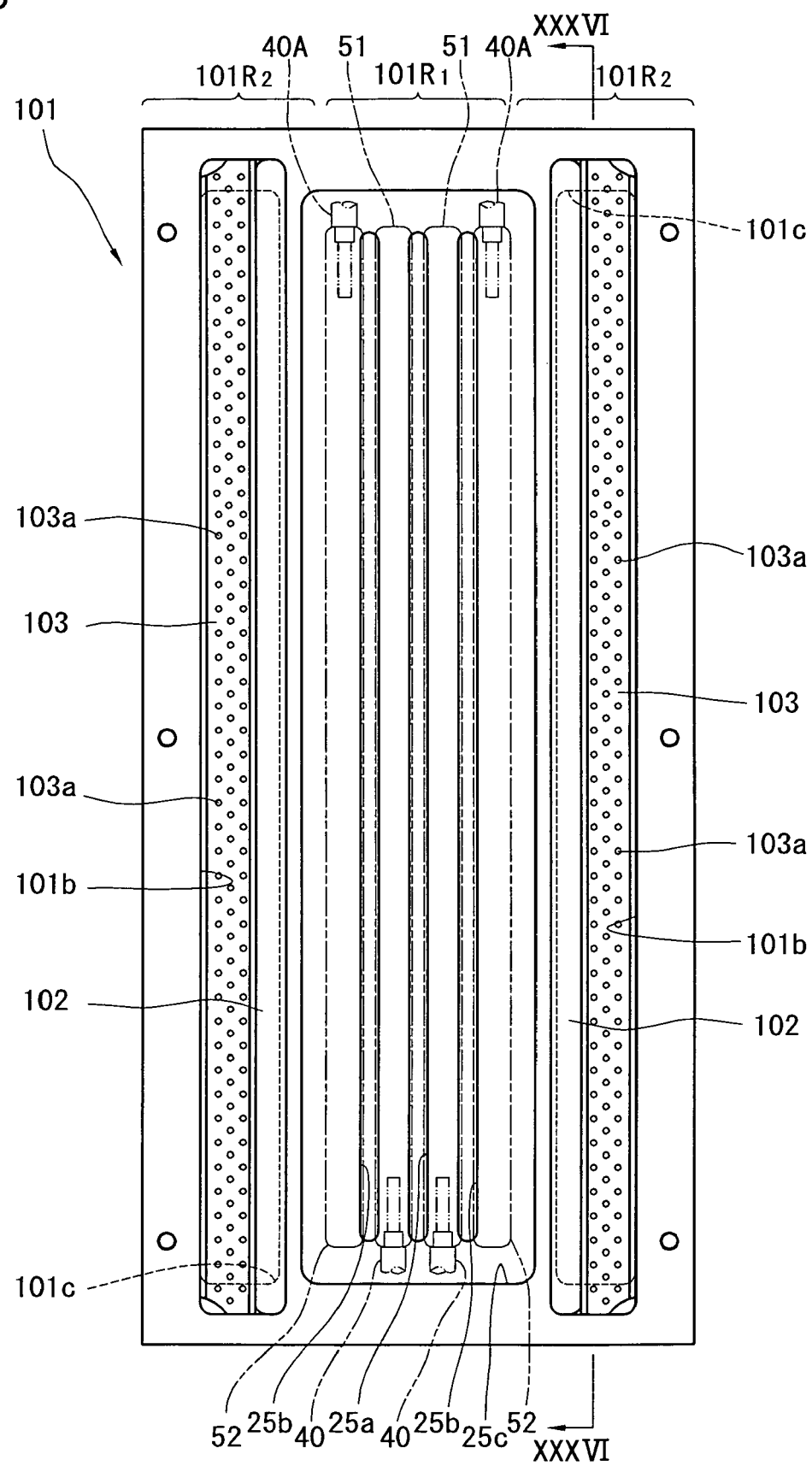
FIG. 35 is a plan view of a lower plate of the processing head taken on line XXXV-XXXV of FIG. 34.

As shown in FIG. 35, the lower plate 101 has a rectangular horizontal plate-like configuration, in plan view, extending in the back and forth direction. The lower plate 101 is composed of an insulative and porous ceramic (gas permeating material). The pore diameter is, for example, about 10 μm, and the porosity is, for example, about 47%.

As shown in FIGS. 34 and 35, the width direction (short direction) of the lower plate 101 is more greatly expanded leftward and rightward than the lateral width of the entire electrode group consisting of four electrodes 51, 52. In the lower plate 101, the central part in the width direction corresponding to the electrode group serves as a blowoff region $101R_1$, and the opposite end parts in the width direction serve as a pair of expanding regions $101R_2$.

Figure 36:
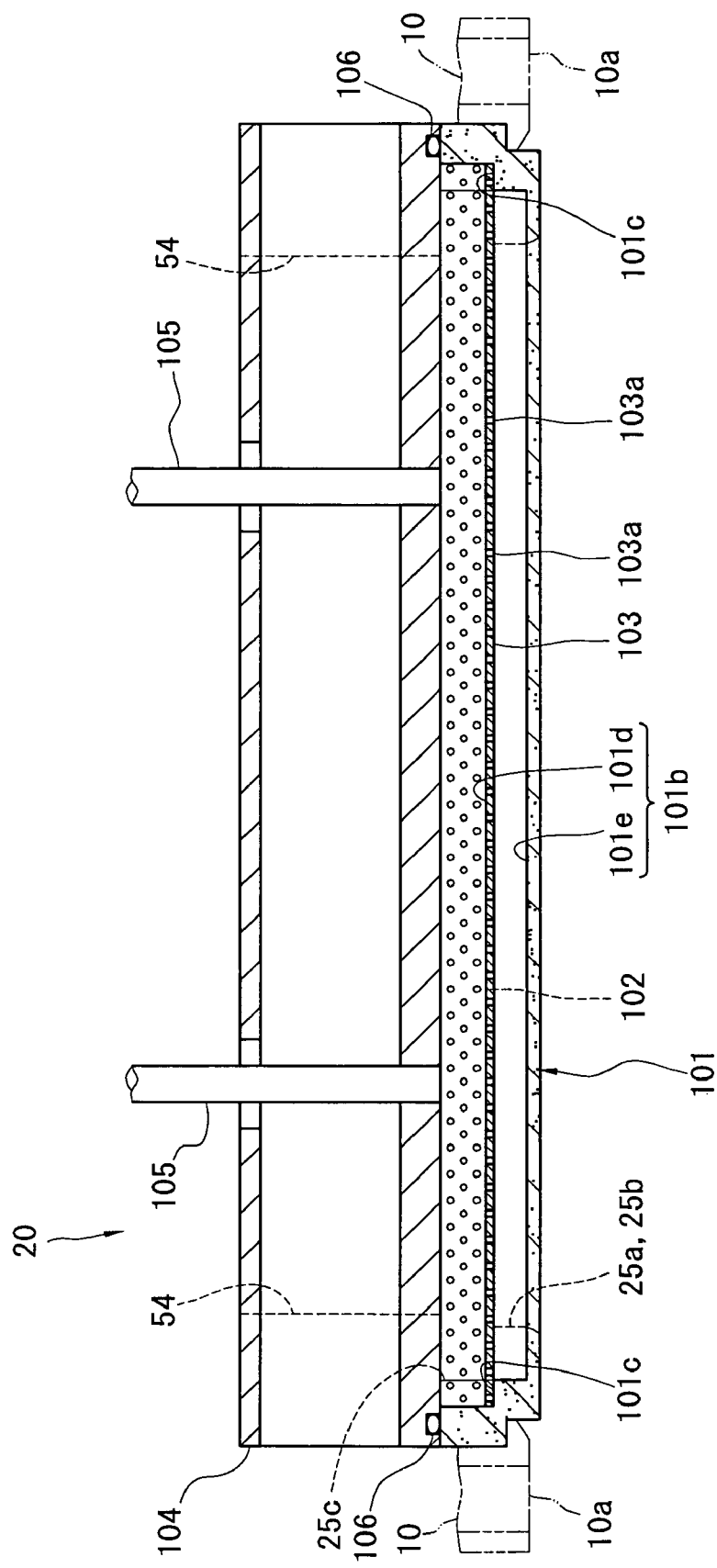
FIG. 36 is a side sectional view of a nozzle part of the processing head taken on line XXXVI-XXXVI of FIG. 35.

As shown in FIGS. 34 through 36, an electrode receiving recess 25c is formed in an upper surface (opposite side to the opposing surface with respect to the base material W) in the blowoff region $101R_1$ of the lower plate 101. Lower end parts of the four electrodes 51, 52 are inserted in this receiving recess 25c. Three-lines of slit-like blowoff passages 25b, 25a, 25b are formed in the lower plate 101 in left and right parallel relation. The passages 25b, 25a, 25b reaches the lower surface of the recess 25c from the bottom of the recess 25c and slenderly extends in the back and forth direction. Those blowoff passages 25b, 25a, 25b are in communication with the corresponding interelectrode flow passages 50b, 50a, 50b, respectively.

Grooves 101b slenderly extending in the back and forth direction are formed in the upper surfaces of the left and right expanding regions $101R_2$ of the lower plate 101. The grooves 101b are deeply recessed proximate to the lower surface of the lower plate 101. Owing to this arrangement, the lower plate 101 is reduced in thickness at the groove 101b portion.

A small step 101c is formed at the intermediate part in the depth direction of the groove 101b. A rod 102 (gas permeation prohibiting member) and an angle plate 103 (partition) are hooked on this step 101c. The rod 102 is composed of a non-porous ceramic (gas permeation prohibiting member) and has a square configuration in section. The rod 102 extends in the back and forth direction along the groove 101b. This rod 102 is pressed against the inner side surface on the blow-off region 101R$_1$ side of the groove 101b (groove part 101d as later described) on the upper side from the step 101c.

The angle plate 103 is composed of a punching metal (porous plate) which is densely formed with a plurality of small holes 103a of a diameter of about 1 mm. The angle plate 103 has a sufficiently larger gas permeability than the lower plate 101 which is composed of a porous ceramic. The angle plate 103 has an L-shaped configuration in section and slenderly extends in the back and forth direction along the groove 101b. The groove 101b is partitioned into two upper and lower stage groove parts 101d, 101e by a bottom side part of the angle plate 103. The lower stage groove part 101e is larger in width than the upper stage groove part 101d by an amount equivalent to no presence of the rod 102 and has a large capacity.

In the angle plate 103, it is accepted that the small hole 103a is not formed in the vertical piece part abutted with the rod 102. It is also accepted that this hole-less vertical piece part is directly abutted with the side surface in the blowoff region 101R$_1$ of the groove part 101d and the rod 102 is eliminated.

A pair of side frames 104 having a horizontal U-shaped configuration in section for sandwiching the electrode unit 50 from left and right are disposed at the upper side of the left and right expanding region 101R$_2$ of the lower plate 101. The upper surface opening of the upper stage groove part 101d is blocked with this side frame 104. An O-ring 106 for sealing the upper stage groove part 101d is disposed at the lower surface of the side frame 104.

Moreover, inert gas introduction pipes 105 communicating with the upper stage groove part 101d are disposed at the pair of side frames 104, respectively. This inert gas introduction pipe 105 is continuous with an inert gas source 5 through an inert gas passage 5a. Inert gas such as nitrogen is reserved in the inert gas source 5. Although two inert gas introduction pipes 105 are disposed at the processing head 3 in such a manner as to be away forward and backward, the present invention is not limited to this. Three or more inert gas introduction pipes 105 may be disposed at the processing head 3 in such a manner as to be away forward and backward, or only one inert gas introduction pipe 105 may be disposed at the center in the back and forth direction.

The "inert gas introduction means" is constituted by the inert gas source 5, the inert gas passage 5a, the inert gas introduction pipe 105 and the side frame 104 for blocking the groove part 101d.

According to a normal pressure plasma film forming apparatus M7 of a seventh embodiment, as shown in FIG. 34, the processing gas flow a passed through the blowoff region 101R$_1$ is introduced between the expanding region 101R$_2$ and the base material W. By this, a film A can be formed also on the base material W right under the expanding region 101R$_2$. As a result, the film forming ratio of the raw material can be enhanced and loss can be reduced.

Concurrently with the film forming operation, the inert gas coming from the inert gas source 5 in introduced to the upper stage groove part 101d via the passage 5a and the pipe 105. Thereafter, the inert gas passes through the small holes 103a formed in the bottom side part of the angle plate 103. At that time, pressure loss occurs. Then, the inert gas is fed to the lower stage groove part 101e and expanded. This makes it possible to uniformize the inert gas in the back and forth longitudinal direction.

Moreover, the inert gas permeates into the porous lower plate 101 from the inner peripheral surface (bottom surface and left and right side surfaces) of the lower stage groove part 101e. And the inert gas oozes out, little by little, from the expanding region 101R$_2$ of the lower plate 101. By this, the lower surface of the expanding region 101R$_2$ is covered with a thin layer b of the inert gas. Owing to this inert gas layer, the processing gas flow a can be prevented from directly contacting the expanding region 101R$_2$ of the lower plate 101. As a result, the expanding region 101R$_2$ of the lower plate 101 can be prevented from being adhered with a film. Particularly, since the lower plate 101 becomes very thin at the groove 101e portion, an inert gas layer b can surely be formed thereunder and film adhesion can surely be prevented from occurring.

On the other hand, since the oozing amount of the inert gas is very small, the processing gas flow a is hardly disturbed. By this, the film formation onto the base material W right under the expanding region 101R$_2$ can surely be conducted. In addition, an amount of film formation onto the base material W can be increased by an amount equivalent to no film adhesion to the lower plate 101. As a result, the raw material loss can more surely be reduced, and film forming efficiency can further be enhanced.

Incidentally, the inert gas in the upper stage groove part 101d is prevented from permeating into the blowoff region 101R$_1$ side by the rod 102 which has absolutely no gas permeability. This makes it possible that the inert gas layer b hardly prevails on the blowoff region 101R$_1$. Accordingly, the processing gas flow a having many active species in the blowoff region 101R$_1$ is not disturbed nor diluted by the inert gas. By this, the film A formed on the base material W right under the blowoff region 101R$_1$ can surely be improved in quality. On the other hand, in the blowoff region 101R$_1$, since film adhesion onto a nozzle end piece 101 hardly occurs, no inconvenience is encountered even if the inert gas layer b is not formed.

It is accepted that the expanding region 101R$_2$ of the lower plate 101 is composed of a gas permeable material such as a porous ceramic, while the blowoff region 101R$_1$ is composed of a gas permeation prohibiting material such as a non-porous ceramic.

The component member of the blowoff region 101R$_1$ and the component member of the expanding region 101R$_2$ may be composed of different members. The component member of the expanding region 101R$_2$ may be constituted by a horizontal frame (support means) for the processing head.

The gas oozing construction of this embodiment may be applied to the common blowoff passage construction of the first and fourth embodiments.

Figure 37:
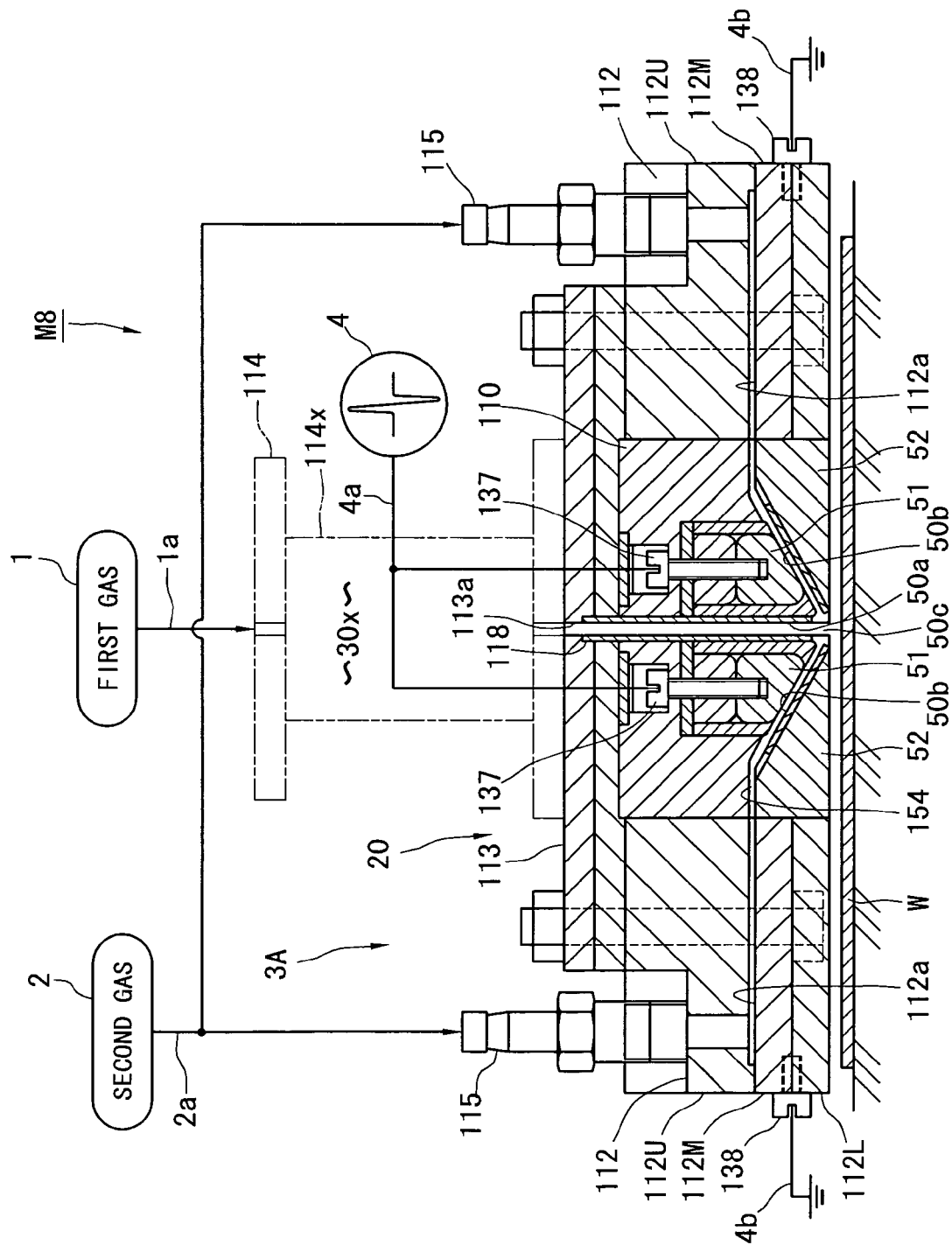
FIG. 37 is a view a schematic construction of a normal pressure plasma film forming apparatus according to an eighth embodiment of the present invention and a front section of a processing head of the apparatus.

FIG. 37 shows a normal pressure plasma film forming apparatus according to an eighth embodiment of the present invention.

The nozzle part 20 of the processing head 3A of the apparatus M8 includes a holder 110 extending in the back and forth direction (orthogonal direction to the paper surface of FIG. 37), a side frame 112 disposed as the side part thereof, and an upper plate 113 covering their upper surfaces.

The upper plate 113 is constituted of two ceramic plates superimposed one upon the another. The upper plate 113 is provided thereon with a first gas rectifier part 114. A tube 1a from a first gas source (raw material gas source) 1 is connected to the first gas rectifier part 114. Although not shown, a uniformizing passage 30x constituted by vertically connecting a plurality of small holes scatteringly arranged and a chamber, etc. extending in the back and forth direction, is disposed within a stainless steel-made main body 114X of the first gas rectifier part 114. A lower end part of the uniformizing passage 30x is continuous with a slit-like introducing passage 113a which is formed at a central part in the left and right direction of the upper plate 113 and elongated in the back and forth direction. After uniformized in the back and forth direction at the uniformizing passage 30x, the first gas (raw material gas) coming from the first gas source 1 is introduced into the introducing passage 113a.

The side frame 112 of the processing head 3A is constituted by vertically overlapping a thick ceramic plate 112U and two metal plates 112M, 112L which are formed of stainless steel, aluminum or the like. A plurality of second gas receiving ports (only one is shown) 115 are disposed on opposite sides in the left and right direction of the ceramic plate 112U and separately arranged in the back and forth direction. The tube 2a from a second gas source (excitable gas source) 2 is branched and connected to corresponding receiving ports 115. A thin gap 112a is formed between the ceramic plate 112U and the metal plate 112M disposed under the ceramic plate 112U. Left and right end parts of this gap 112a are continuous with the receiving port 115.

Figure 38:
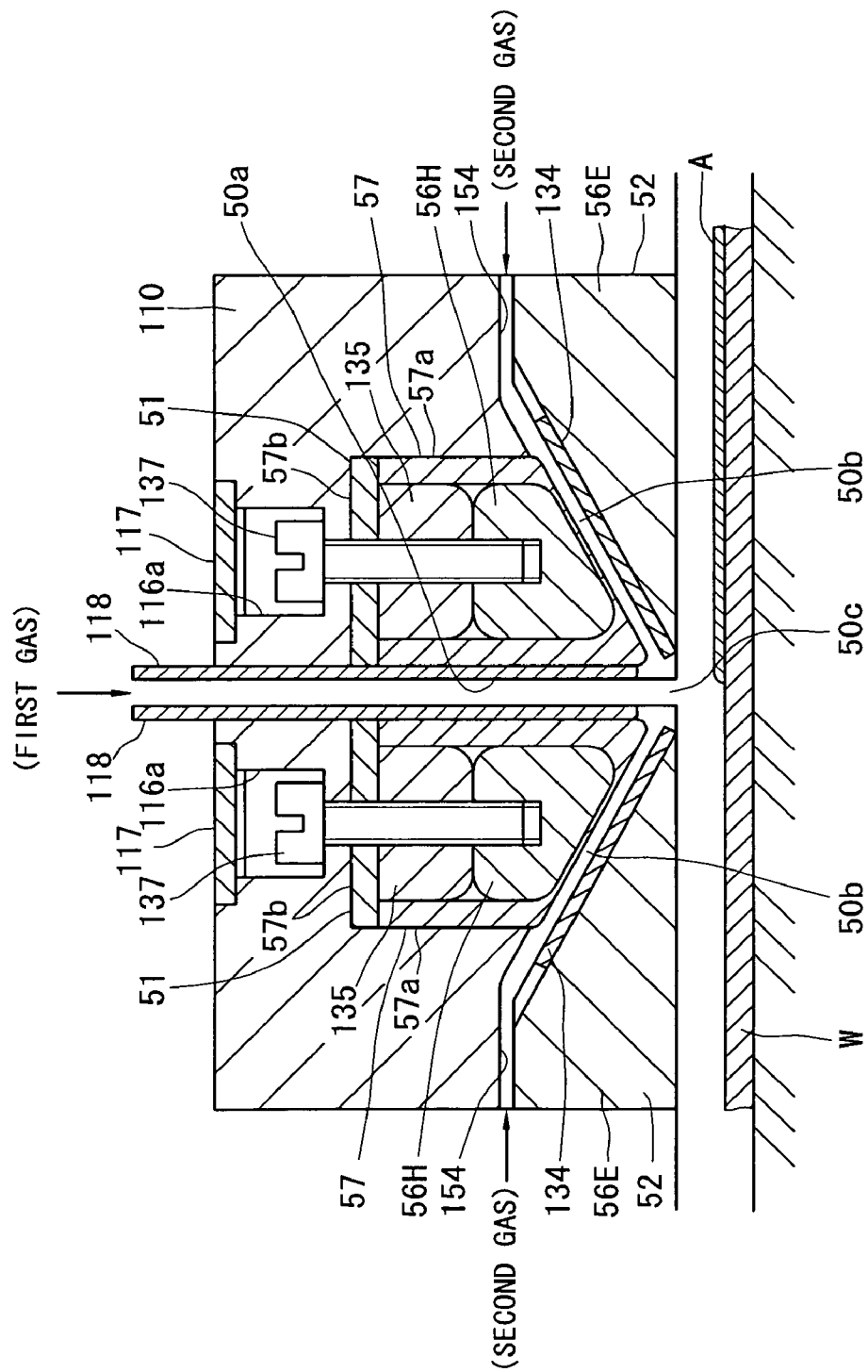
FIG. 38 is an enlarged sectional view of a nozzle of the processing head of FIG. 37.

An electrode holder 110 of the processing head 3A is composed of an insulative member such as ceramic. As shown in FIG. 38 on an enlarged scale, two left and right electric field impressing electrodes 51 are supported by this holder 110.

Each electric field impressing electrode 51 includes a main body 56H composed of a conductive metal such as stainless steel and aluminum, and a ceramic-make dielectric case 57 for receiving therein the metal main body 56H. The electrode 51 extends in the back and forth direction (direction orthogonal to the paper surface of Figures). The cross section of the electric field impressing electrode main body 56H exhibits a generally trapezoidal configuration in which a bottom surface of the main body 56H is slanted downward toward the center (the other electric field impressing electrode 51 side) in the left and right direction. All corners of the electric field impressing electrode main body 56H are rounded in order to prevent an arc discharge from occurring.

The dielectric case 57 includes a box-like case main body which is open at an upper surface thereof and elongated in the back and forth direction, and a lid 57b for blocking the upper surface opening of this case main body 57a. A bottom plate of the case main body 57a is very thin compared with the side plate and the lid 57b. The bottom plate of this case main body 57a is slanted downward toward the center (the other electric field impressing electrode 51 side) in the left and right direction. A slanted bottom surface of the metal main body 56H having the trapezoidal configuration in section is abutted with an inner bottom of the slanted bottom plate.

A ceramic-made spacer 135 is loaded above the metal main body 51H within the case main body 57a.

Each electric field impressing electrode 51 is provided with a power feed pin 137. The power feed pin 137 vertically pierces through the lid 57b and the spacer 135 and is embedded in the metal main body 56H. An upper end part of the power feed pin 137 is received in a recess 116a which is formed in an upper surface of the holder 110. As shown in FIG. 37, a power feed line 4a from a power source 4 is connected to an upper end part of each power feed pin 137. The recess 116a is provided at an upper end opening thereof with a ceramic-make cap 117.

A first flow passage 50a for the first gas is disposed between two electric field impressing electrodes 51, which is symmetrical in the left and right direction, of the holder 110. The first flow passage 50a vertically extends over the entire length of the electrode 51 in the back and forth direction (direction orthogonal to the paper surface of Figures). An upper end part (upstream end) of the first flow passage 50a pierces through the holder 110 and is continuous with the entire length in the back and forth direction of the introducing passage 113a of the upper plate 113. Eventually, it is continuous with the first gas source 1 through the uniformizing passage 30x of the rectifier part 114 and the tube 1a.

Ceramic-made plates 118 are abutted with the surfaces on the first flow passage side of each electric field impressing electrode 51 and the holder 110, respectively. The upper end part of the plate 118 reaches the inner surface of the introducing passage 13a. The pair of plates 118 constitute the "first flow passage forming means".

The processing head 3A is provided with ground electrodes 52 which are disposed on the lower side of the electric field impressing electrodes 51 such that each ground electrode 52 forms a pair with the corresponding electric field impressing electrode 51. The left and right ground electrodes 52 are symmetrical with each other with the central first flow passage 50a sandwiched therebetween. Each ground electrode 52 includes a main body 56E composed of a conductive metal such as stainless steel and aluminum, and a thin and planar plate 34 formed of alumina or the like and serving as a solid dielectric layer of this metal main body 56E. The ground electrodes 52 extend in the back and forth direction (direction orthogonal to the paper surface of Figures).

The ground electrode main body 56E includes a horizontal bottom surface (base material opposing surface), and a slant surface slanting toward the center in the left and right direction such that the slant surface forms an acute angle with respect to this bottom surface. The ground electrode main body 56E has a trapezoidal configuration in section. The bottom surfaces of the main bodies 56E of the left and right ground electrodes 52 are flush with each other.

As shown in FIG. 37, each ground electrode main body 56E is connected to left and right outer side metal plates 112A, 112L. The metal plates 112M, 112L are each provided at outer end faces thereof with a ground pin 138. A ground line 4b extends from this ground pin 138 so as to be grounded. Owing to this arrangement, the ground electrode 52 is grounded.

The inclination angle of the slant surface of the ground electrode main body 56E having a trapezoidal configuration in section is equal to the inclination angle of the slant bottom part of the upper side electric field impressing electrode 51 which forms a pair together with the ground electrode main body 56E. The solid dielectric plate 134 is abutted with the top of the slant surface of the ground electrode main body 56E. Of course, the solid dielectric plate 134 is slanted at an equal angle to that of the main body 56E along the slant surface of the main body 56E.

The "second flow passage forming means" is constituted by the electrodes 51, 52. That is, one each of second flow passages 50b serving as a plasma discharge space is formed between the vertically paired electrodes 51, 52 on the left side of the first flow passage 50a, and between the vertically pairs electrodes 51, 52 on the right side of the first flow passage 50a. Specifically, the space between the slanted bottom surface (first surface) of the case main body 57a of the electric field impressing electrode 51 and the slanted outer surface (second surface) of the solid dielectric plate 134 of the ground electrode 52 on the lower side of thereof serves as the second flow passage 50b. Each second flow passage 50b extends over the entire length of the electrodes 51, 52 in the back and forth direction (direction orthogonal to the paper surface of Figures).

The upper end part (upstream end) of each second flow passage 50b is connected to the entire length in the back and forth direction of a gap 112a between the side frames 112 through a horizontal gap 154 between the upper surface of the ground electrode 52 and the holder 110. Eventually, it is continuous with the second gas source 2 through the receiving port 115 and the tube 2a.

The left side second flow passage 50b is slanted rightward downward in such a manner as to approach the first flow passage 50a in correspondence with the slant surfaces of the left side electrodes 51, 52. The right side second flow passage 50b is slanted leftward downward in such a manner as to approach the first flow passage 50a in correspondence with the slant surfaces of the right side electrodes 51, 52. The inclination angles of the left and right second flow passages 50b are symmetrical with each other with the vertical first flow passage 50a sandwiched therebetween.

The lower end parts (downstream ends) of the left and right second flow passages 50b are crossed at one place with the lower end part (downstream ends) of the first flow passage 50a at acute angles. Moreover, the crossing part among those three passages 50b, 50a, 50b directly serves as a blowoff port 50c. This blowoff port 50c is open to a bottom surface of the processing head 3A which is constituted by the left and right ground electrodes 52.

According to the normal pressure plasma film forming apparatus M8 of the eighth embodiment, the first gas coming from the first gas source 1 is introduced into the central first flow passage 50a via the tube 1a, the uniformizing passage 30x, and the introducing passage 113a sequentially in this order. Concurrently with this, the second gas coming from the second gas source 2 is introduced into the left and right second flow passages 50b via the tube 2a, the receiving port 115, and the gaps 112a, 154 sequentially in this order, and plasmatized (excited and activated) by being impressed with electric field, so that active species are generated.

When reached the blowoff port 50c at the downstream end of the second flow passage 50b, the second gas thus plasmatized is converged with the first gas coming from the first flow passage 50a. By this convergence, the raw material of film contacts the active species of the second gas and reaction is taken place therebetween. Simultaneous with the convergence, i.e., simultaneous with the reaction taken place between the raw material and the active species, those processing gases are blown off downward through the blowoff port 50c. Accordingly, film is hardly adhered to the blowoff port 50c. By blowing the processing gas against the base material W, a film such as poly-silicon (p-Si) is formed.

As described above, the contact between the ram material of film of the first gas and the active species of the plasmatized second gas occurs at the same time the first and second gases reach the blowoff port 50c and are blown off. Therefore, it is no more required to wait for scattering after blowoff. Thus, the active species are hardly deactivated and still good enough for taking place reaction. Particularly, even if the processing is made under normal pressure where the life of the active species is short, a sufficient reaction can be obtained. As a result, a favorable film A can be obtained and the film forming efficiency can be enhanced. Moreover, it is no more required to heat the base material W up to a high temperature in order to enhance reaction, and a film can sufficiently be formed even at a normal temperature.

Since the second flow passage 50b is crossed at an acute angle with respect to the vertical first flow passage 50a, the first and second gases can surely be sprayed against the base material W while mixing the first and second gases so that they form a single flow. Thus, the film forming efficiency can be enhance.

Moreover, the left and right second flow passages 50b are symmetrically arranged with the central first flow passage 50a sandwiched therebetween, it becomes possible that the second gas is uniformly converged to the left and right opposite sides of the first gas to form a single gas flow, so that the converged gas can be sprayed to the right front surface of the base material W. Thus, the film forming efficiency can further be enhanced.

The present invention is not limited to the above-mentioned embodiments, but many changes and modifications can be made without departing from the spirit of the invention.

As a power source (electric field impressing means), a high frequency power source may be used in which a high frequency electric field is impressed between the first and second electrodes.

The present invention can be applied not only to a normal pressure plasma film formation conducted under generally normal pressure circumstance, but also to a low pressure plasma film formation conducted under reduced pressure.

It goes without saying that the present invention can be applied to various kinds of film formation such as a-Si, p-Si, SiN and $SiO_2$. In case of film formation using a-Si and p-Si, $SiH_4$ is used for the first gas and $H_2$ is used for the second gas. In case of film formation using SiN, $SiH_4$ is used for the first gas and $N_2$ is used for the second gas. In case of film formation using $SiO_2$, TEOS or TMOS is used for the first gas and $O_2$ is used for the second gas.

The electrodes 51, 52 of the first, second and seventh embodiments, etc. may be of the same dielectric case receiving construction as in the case with the fourth embodiment (FIG. 19) and its modified embodiment (FIG. 25, etc.)

It is also accepted that as the solid dielectric layer of the electrode 51 of the fourth and eighth embodiments, etc., instead of the dielectric case 57, a film is formed on the surface of the electrode main body 56 by suitable means such as thermally spraying a dielectric member such as ceramic thereon, or bonding a resin-made sheet such as tetrafluoroethylene thereto.

In the dielectric case receiving construction, the lid of the dielectric case may be rotatably connected to the case main body. The power feed/ground pin and the covered conductor may be pierced into the electrode main body instead of the case main body through the lid.

The electric field impressing electrode may have a sleeve-like or annular configuration and its internal space may serve as the first flow passage. The ground electrode may have a sleeve-like or annular configuration capable of coaxially receiving therein this sleeve-like electric field impressing electrode, and an annular space between those electrodes may serve as the second flow passage.

The base material may be arranged above the processing head. In that case, the base material opposing member may preferably be placed on the upper end part of the processing head. The intake port 10a of the housing 10 is directed upward. The processing head 20 may be fixed to the outer housing 10 by an easy attaching/detaching mechanism such as a bolt or a hook.

The present invention is not limited that the first flow passage is constituted by an electric field impressing electrode disposed between two electric field impressing electrodes, but the first flow passage may be constituted by a specific first flow passage forming member such as a nozzle body and a tube.

In the eighth embodiment, it is accepted that the second flow passage is vertically arranged with respect to the base material opposing surface and the first flow passage is diagonally arranged. It is also accepted that only one second flow passage is disposed at the center and two first flow passages are arranged on its opposite sides. The first and second flow passages and electrodes may not only be linearly extended in the back and forth direction but they be also be, for example, annularly arranged in section. One of the electric field impressing electrode and the ground electrode may annularly surround the other electrode. In that case, the first flow passage may be formed within the inner side electrode, and the annular space between the inner and outer electrodes may serve as the second flow passage. It is also accepted that one of the first and second flow passages is concentrically arranged in such a manner as to approach the other passage downward with the other passage placed therebetween.

INDUSTRIAL APPLICABILITY

The present invention can be utilized, for example, as a plasma CVD with respect to a semiconductor base material.

The invention claimed is:

1. A plasma surface processing apparatus for processing a surface of an object to be processed with a processing gas plasmatized under an electric field applied from an electric power source, said apparatus having an electrode structure having a gas passage through which said processing gas is passed from an upstream side to a downstream side of a passage direction and for generating said electric field in said gas passage, said electrode structure comprising:

an elongate metallic first electrode body that is longer in a longitudinal direction orthogonal to said passage direction and shorter in the passage direction, the first electrode body having an elongate outer first surface which is a flat surface crossing with an arranging direction orthogonal to both the passage direction and the longitudinal direction and which is longer in said longitudinal direction and shorter in the passage direction;

an elongate metallic second electrode body that is longer in said longitudinal direction and shorter in the passage direction, said second electrode body being arranged in parallel with said first electrode body in the arranging direction, said second electrode body having an elongate outer second surface which is a flat surface crossing with the arranging direction and facing said first surface in said arranging direction and which is longer in the longitudinal direction and shorter in the passage direction, one of said first and second electrode bodies being connected with said electric power source, the other of said first and second electrode bodies being electrically grounded, said electric field being generated between said first and second surfaces; and an elongate dielectric first case body that is longer in said longitudinal direction and shorter in the passage direction, said first case body being arranged in parallel with said first and second electrode bodies, said first case body being formed a cross section orthogonal to said longitudinal direction into a U-shape so that said first case body has a first internal space and a first opening, a side of the first internal space nearer to the second electrode body in the arranging direction and both the upstream and the downstream sides of the first internal space in the passage direction being surrounded by the first case body and a remaining side of the first internal space farther from the second electrode body in the arranging direction being opened to an outside and provided as the first opening, a plane of the first opening is parallel to the longitudinal direction, said first electrode body being received in said first internal space so that said first surface is contacted with an inner peripheral surface of said first case body, said second electrode body being disposed outside the first internal space of said dielectric first case body in said arranging direction, said first opening facing away from said second electrode body, said gas passage being formed between said dielectric first case body and said second electrode body, said gas passage being longer in the longitudinal direction and shorter in the passage direction, a first end of the gas passage on the upstream side of the passage direction being connected with a source of the processing gas, a second end of the gas passage on the downstream side of the passage direction being connected with a blow-off aperture, and an end part on a side of said first opening of a portion of said first case body on the downstream side of the first internal space being protruded in said one remaining side farther from the second electrode body in the arranging direction relative to said first electrode body.

2. An electrode structure according to claim 1, further comprising:

an elongate lid made of a solid dielectric material for closing said first opening, said lid having a longer length dimension in the longitudinal direction and a shorter width dimension in the passage direction, an end part on the downstream side of said lid covering an end surface of said protruded end part in a location more forward in said one remaining side farther from the second electrode body in the arranging direction from said first electrode body.

3. An electrode structure according to claim 1, wherein said electrode structure further comprises:

an elongate dielectric second case body that is longer in said longitudinal direction and shorter in the passage direction, said second case body being arranged in parallel with said first case body in said arranging direction, said second case body being formed a cross section orthogonal to said longitudinal direction into a U-shape so that said second case body has a second internal space and a second opening, both the upstream and the downstream sides of the second internal space in the passage direction and a side of the second internal space nearer to the first electrode body in the arranging direction being surrounded by the second case body, and an opposite side of the second internal space farther from the first electrode body in the arranging direction being opened and provided as the second opening, said gas passage being defined between said first and second case bodies, said second electrode body being received in said second internal space so that said second surface is contacted with an inner peripheral surface of said second case body, and an end part on a side of said second opening of a portion of said second case body on the downstream side of the second internal space being protruded in said opposite side farther from the first electrode body in said arranging direction relative to said second electrode body.

4. An electrode structure according to claim 3, wherein said first dielectric case body and said second dielectric case body are separately formed.

5. An electrode structure according to claim 4, wherein said first dielectric case body has an opposing surface abutted with said second dielectric case body, and said opposing surface is provided with a recess to serve as said gas passage.

6. An electrode structure according to claim 3, wherein said first dielectric case body and said second dielectric case body are integrally connected to one another.

7. An electrode structure according to claim 3, wherein flow passage sectional area of said gas passage varies along said passage direction.

8. An electrode structure according to claim 3, wherein said first dielectric case body has a plate defining said gas passage, and a thickness of said plate varies along said passage direction.

9. An electrode structure according to claim 3, wherein a distance between said first electrode body and said second electrode body varies along said passage direction.

10. An electrode structure according to claim 3, wherein said first dielectric case body is provided with a gas uniformizing passage for dispersing said processing gas uniformly in said longitudinal direction and for introducing said processing gas into said gas passage.

* * * * *